US011955410B2

(12) United States Patent
Hatori et al.

(10) Patent No.: US 11,955,410 B2
(45) Date of Patent: Apr. 9, 2024

(54) ELECTRONIC COMPONENT APPARATUS HAVING A FIRST LEAD FRAME AND A SECOND LEAD FRAME AND AN ELECTRONIC COMPONENT PROVIDED BETWEEN THE FIRST LEAD FRAME AND THE SECOND LEAD FRAME

(71) Applicant: SHINKO ELECTRIC INDUSTRIES CO., LTD., Nagano (JP)

(72) Inventors: Yukinori Hatori, Nagano (JP); Yasushi Araki, Nagano (JP); Akinobu Inoue, Nagano (JP); Tsukasa Nakanishi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 17/874,898

(22) Filed: Jul. 27, 2022

(65) Prior Publication Data
US 2022/0367326 A1 Nov. 17, 2022

Related U.S. Application Data

(63) Continuation of application No. 16/912,969, filed on Jun. 26, 2020, now Pat. No. 11,444,006.

(30) Foreign Application Priority Data

Jun. 27, 2019 (JP) ................. 2019-119539

(51) Int. Cl.
*H01L 23/495* (2006.01)
*H01L 21/48* (2006.01)
(Continued)

(52) U.S. Cl.
CPC .... *H01L 23/49537* (2013.01); *H01L 21/4825* (2013.01); *H01L 21/4828* (2013.01);
(Continued)

(58) Field of Classification Search
CPC ................. H01L 21/56; H01L 23/4952; H01L 23/49586; H01L 23/49537;
(Continued)

(56) References Cited

U.S. PATENT DOCUMENTS 6,423,643 B1 7/2002 Furuhata
8,304,872 B2 11/2012 Seki
(Continued)

FOREIGN PATENT DOCUMENTS

JP 2001-223289 A 8/2001
JP 2001-358280 A 12/2001
(Continued)

OTHER PUBLICATIONS

Japanese Office Action dated Nov. 1, 2022 in the corresponding Japanese application No. 2019-119539; English machine translation included (6 pages).

*Primary Examiner* — Khiem D Nguyen
(74) *Attorney, Agent, or Firm* — Rankin, Hill & Clark LLP

(57) ABSTRACT

An electronic component includes: a first lead frame; a second lead frame that is provided on the first lead frame; a first electronic component that is provided between the first lead frame and the second lead frame; a connection member that is provided between the first lead frame and the second lead frame; and an insulating resin that is filled between the first lead frame and the second lead frame so as to cover the first electronic component and the connection member. A first oxide film is provided on a surface of the first lead frame. A second oxide film is provided on a surface of the second lead frame. The first lead frame and the second lead frame are electrically connected to each other by the connection member.

23 Claims, 30 Drawing Sheets

(51) Int. Cl.
*H01L 21/56* (2006.01)
*H01L 23/00* (2006.01)
*H01L 23/498* (2006.01)
*H01L 25/16* (2023.01)

(52) U.S. Cl.
CPC .......... *H01L 21/4846* (2013.01); *H01L 21/56* (2013.01); *H01L 23/4952* (2013.01); *H01L 23/49586* (2013.01); *H01L 23/49861* (2013.01); *H01L 24/16* (2013.01); *H01L 25/16* (2013.01); *H01L 2224/16227* (2013.01); *H01L 2224/16245* (2013.01)

(58) Field of Classification Search
CPC . H01L 2224/16227; H01L 2224/05647; H01L 2224/13147; H01L 21/4825; H01L 23/3107; H01L 23/3121; H01L 23/49582; H01L 23/49861; H01L 24/16; H01L 24/29; H01L 24/32
USPC .......................................................... 257/666
See application file for complete search history.

(56) References Cited

U.S. PATENT DOCUMENTS

| | | | |
|---|---|---|---|
| 9,613,829 B1* | 4/2017 | Lee | H01L 24/16 |
| 9,698,084 B2 | 7/2017 | Kasahara | |
| 9,842,797 B2 | 12/2017 | Carpenter | |
| 9,978,670 B2* | 5/2018 | Fushie | H01L 23/49586 |
| 10,049,954 B2 | 8/2018 | Bang | |
| 10,229,869 B2 | 3/2019 | Sugimachi | |
| 10,236,231 B2* | 3/2019 | Miyakoshi | H01L 24/37 |
| 10,475,730 B2* | 11/2019 | Huang | H01L 23/49503 |
| 11,088,055 B2* | 8/2021 | Shibuya | H01L 23/3157 |
| 11,444,006 B2* | 9/2022 | Hatori | H01L 21/4828 |
| 2008/0315382 A1 | 12/2008 | Wallace | |
| 2011/0083322 A1 | 4/2011 | Minamio | |
| 2011/0089546 A1* | 4/2011 | Bayan | H01L 21/6835 257/676 |
| 2011/0285009 A1* | 11/2011 | Chi | H01L 23/3107 257/E21.511 |
| 2013/0264695 A1 | 10/2013 | Murayama | |
| 2015/0123252 A1* | 5/2015 | Liao | H01L 23/49582 257/673 |
| 2015/0155226 A1* | 6/2015 | Jiang | H01L 23/4952 257/676 |
| 2019/0157196 A1* | 5/2019 | Sonehara | H01L 23/4952 |

FOREIGN PATENT DOCUMENTS

| | | |
|---|---|---|
| JP | 2013-219213 A | 10/2013 |
| JP | 2015-154055 A | 8/2015 |
| WO | 2016/076162 | 5/2016 |

* cited by examiner

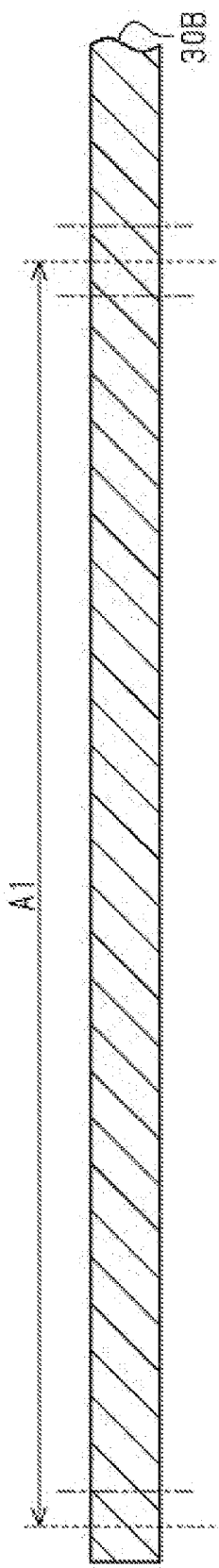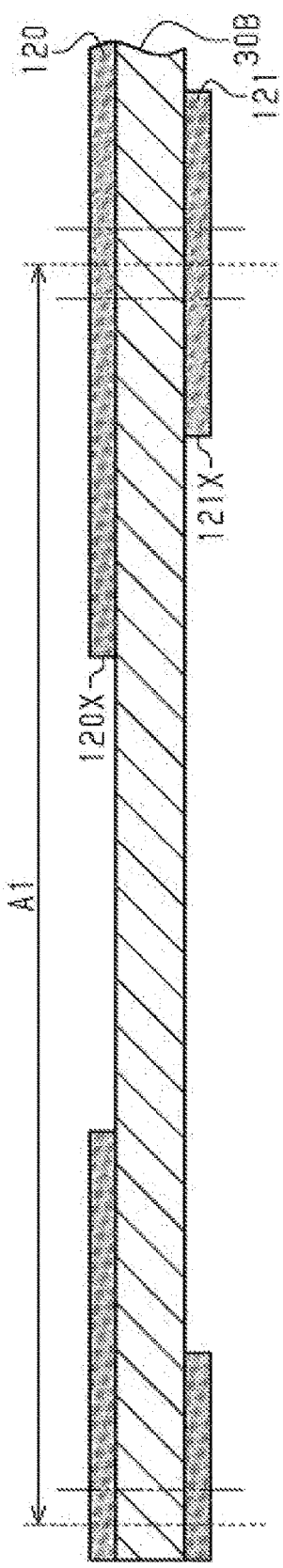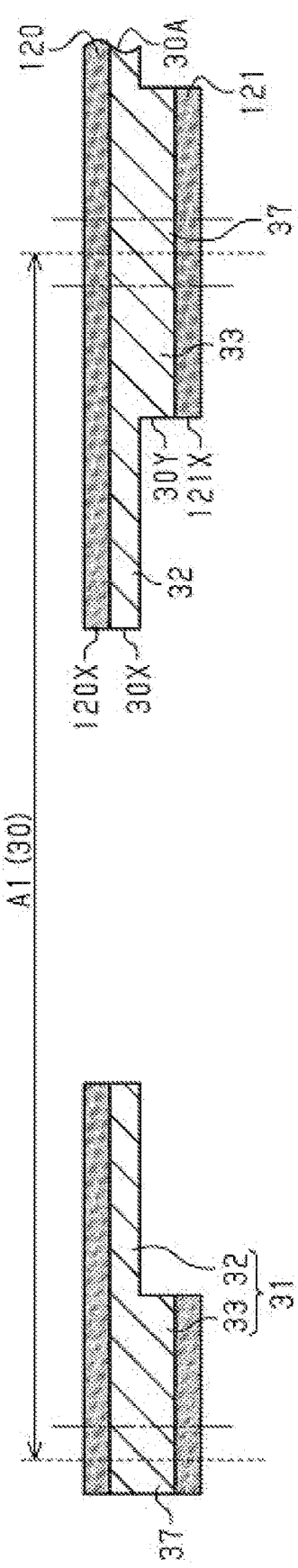

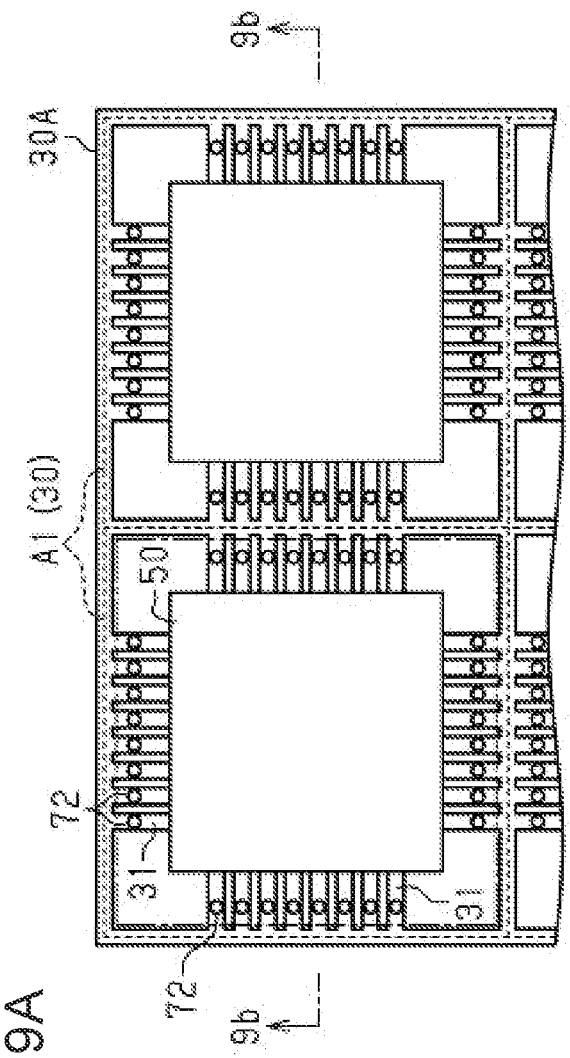
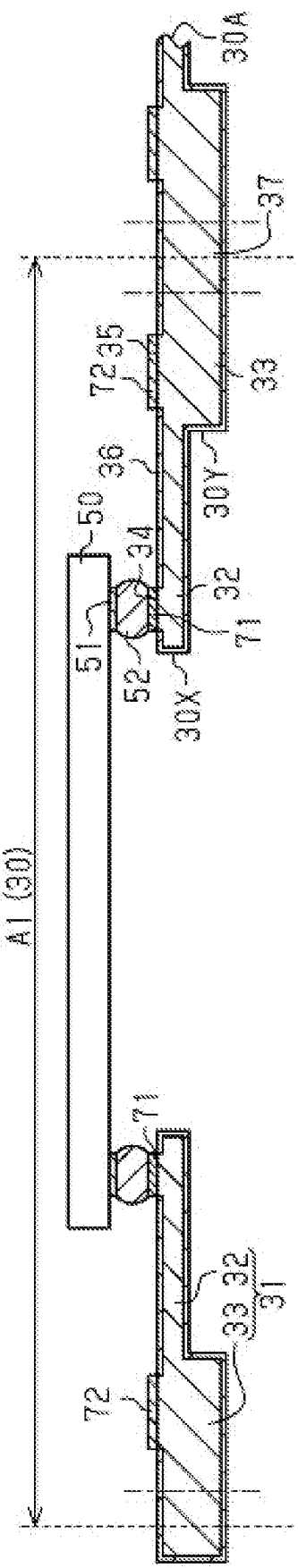
FIG.9A
FIG.9B

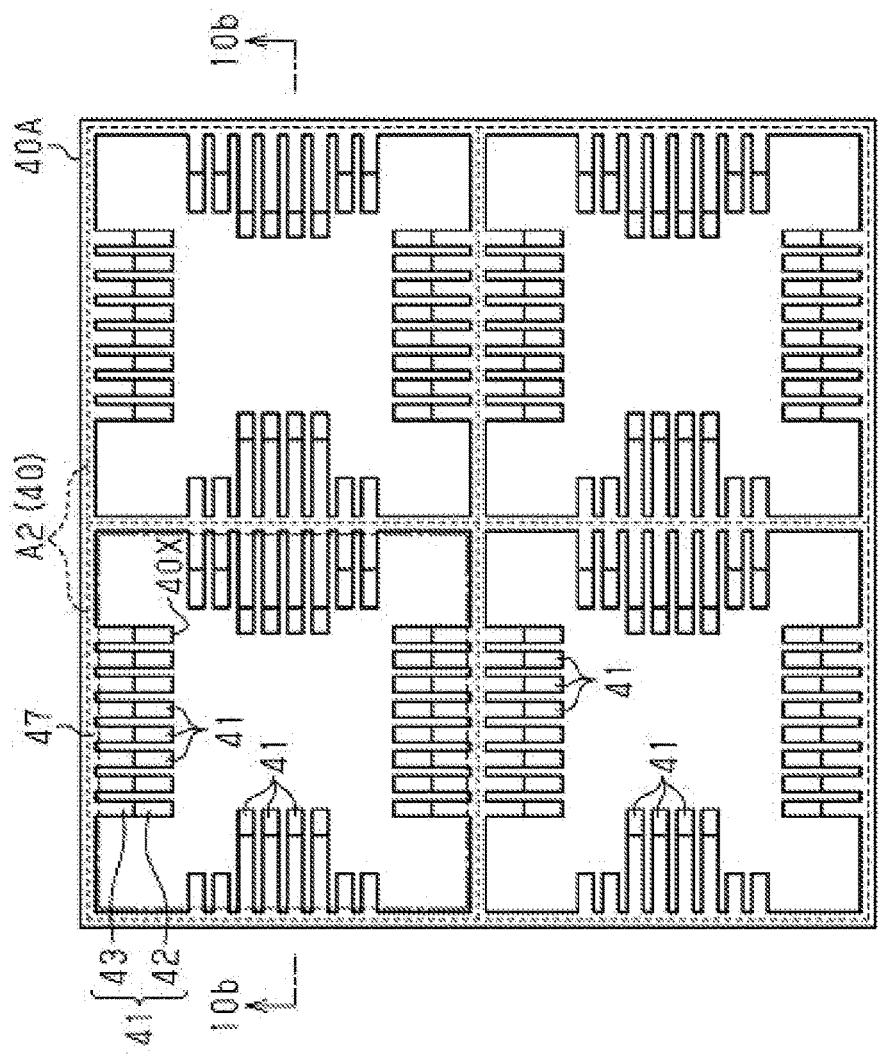
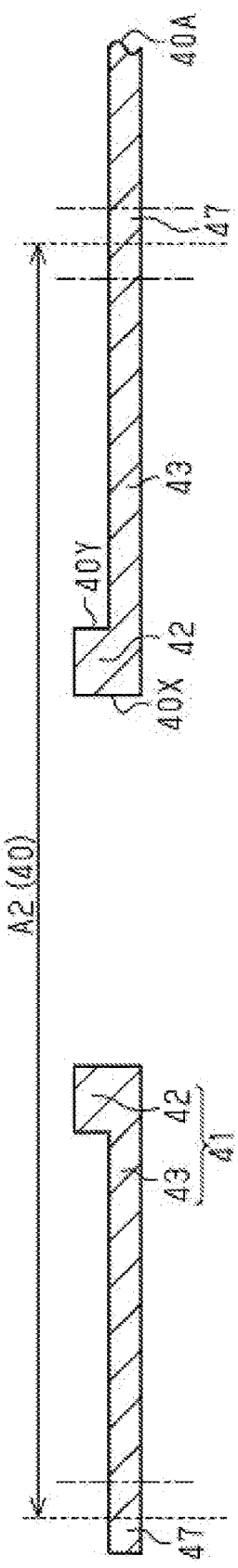
FIG.10A
FIG.10B

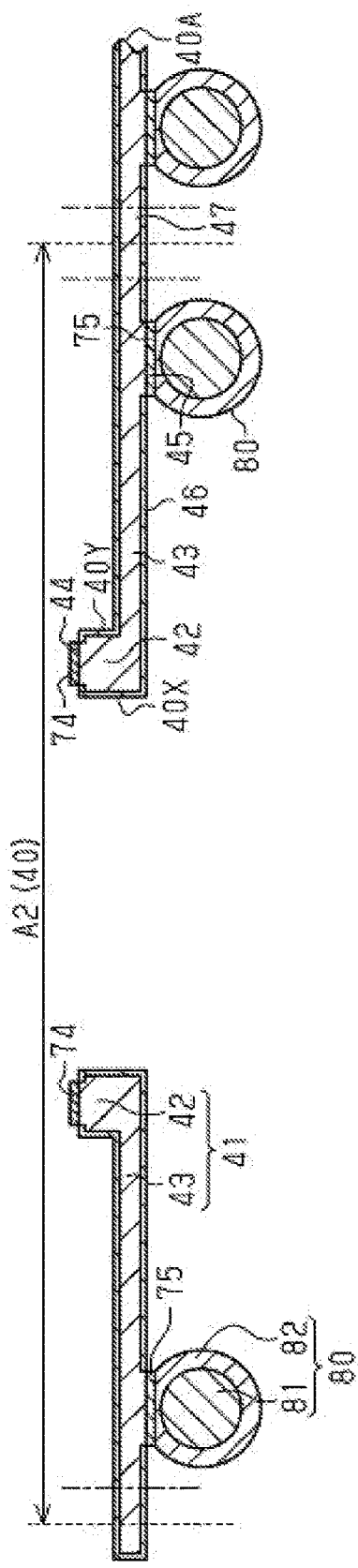
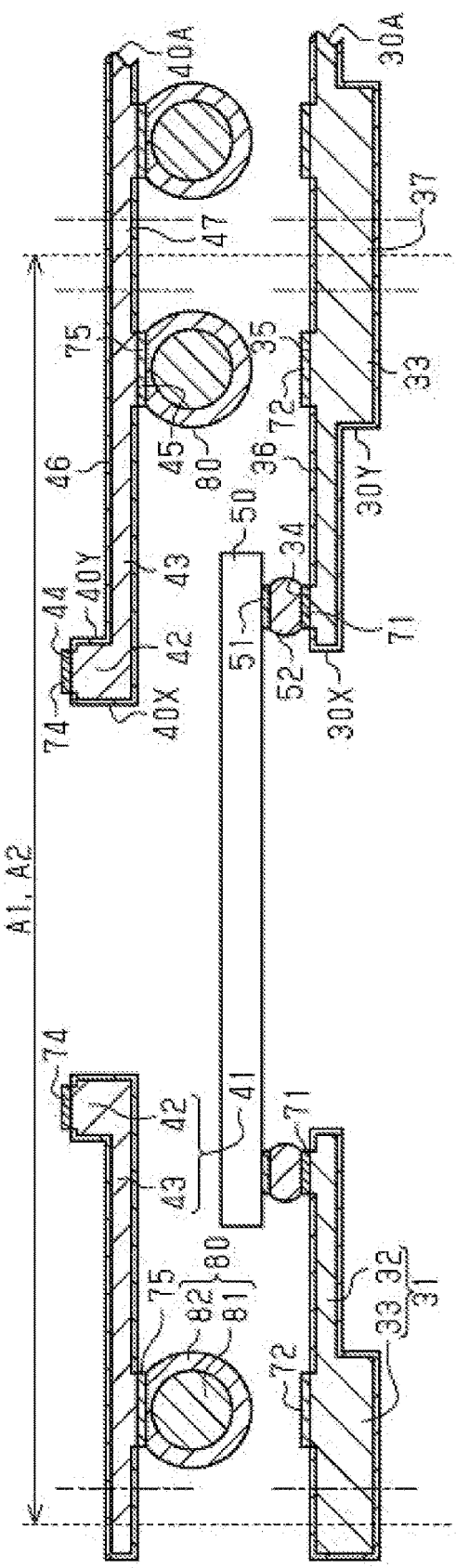
FIG. 12A
FIG. 12B

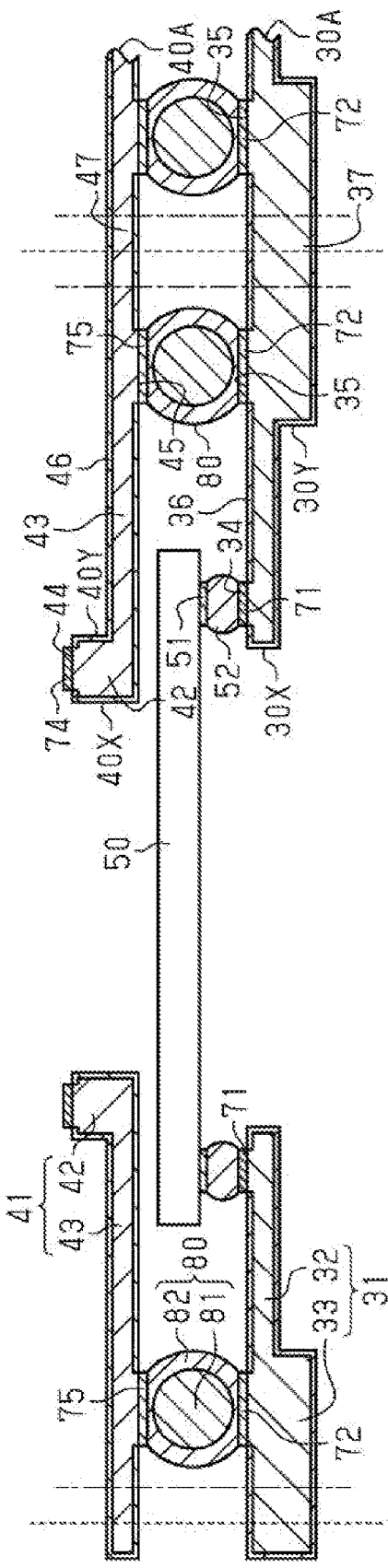
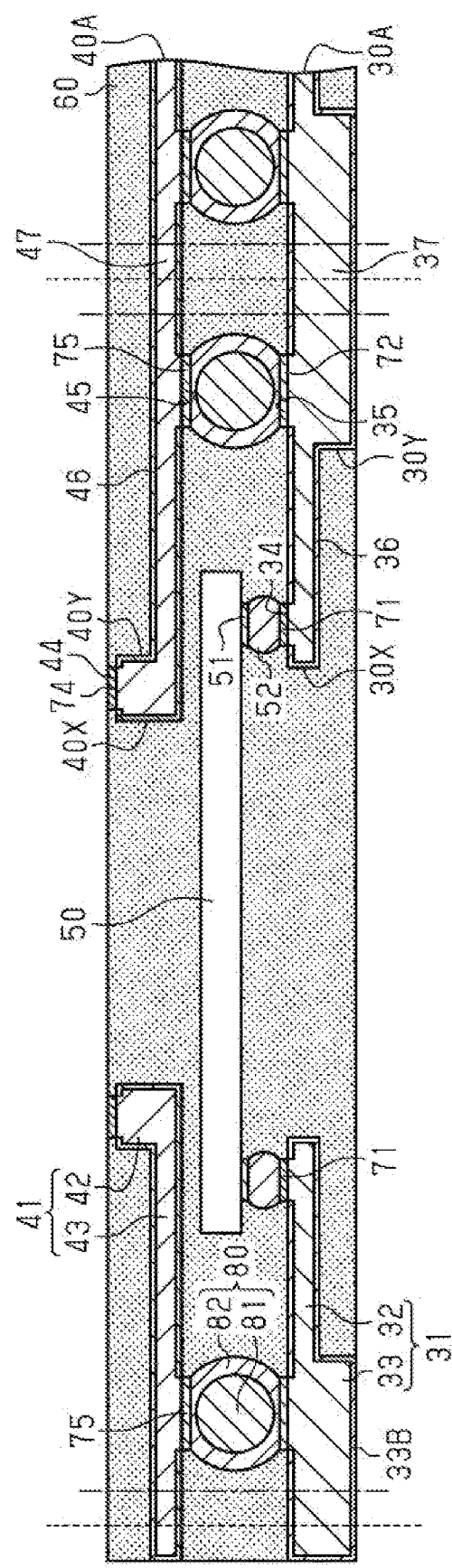
FIG.13A
FIG.13B

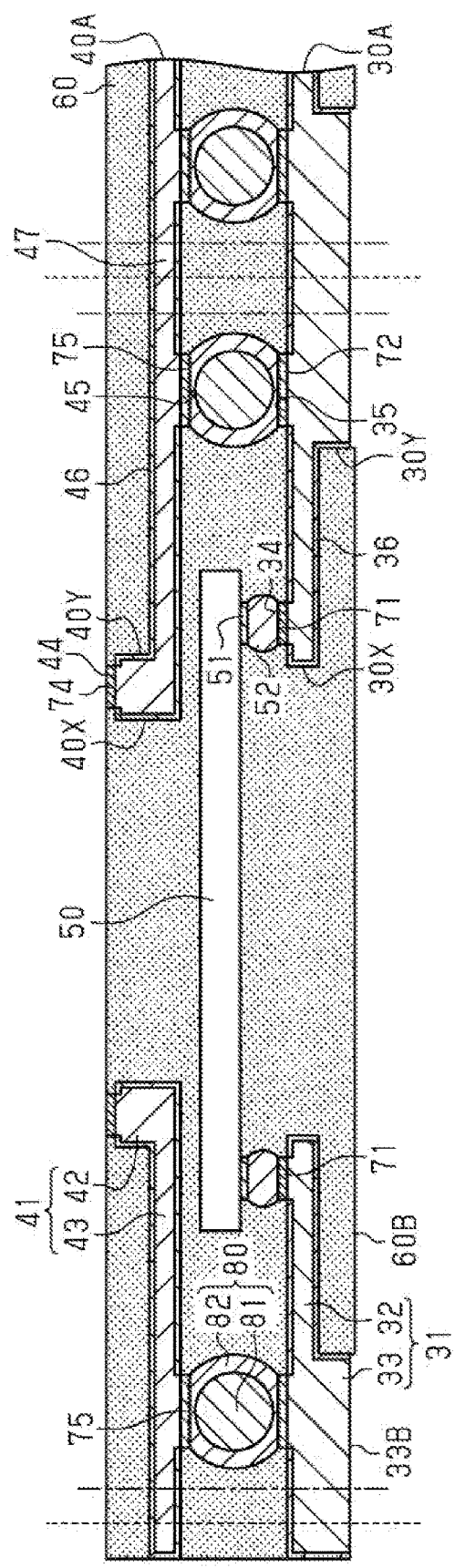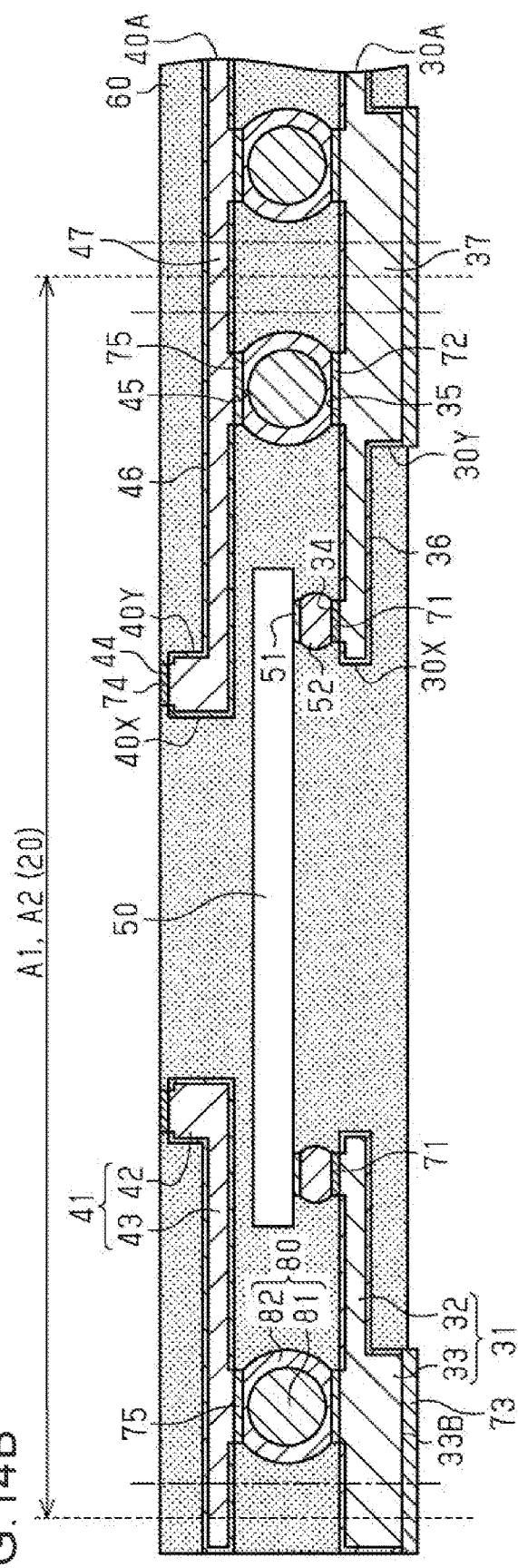

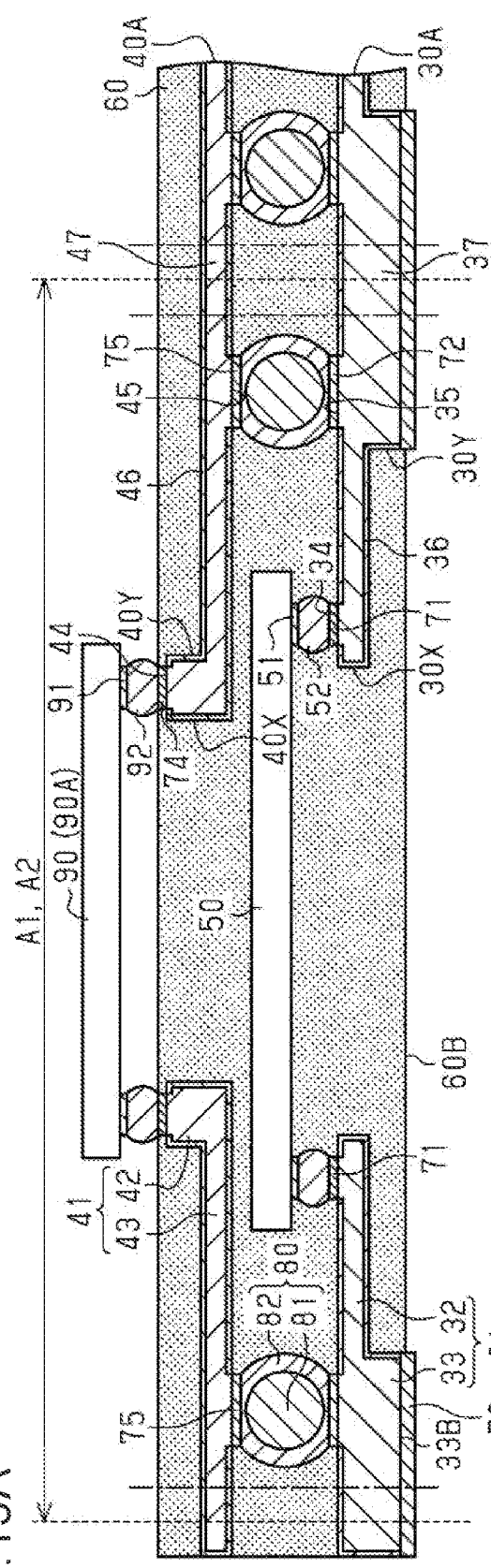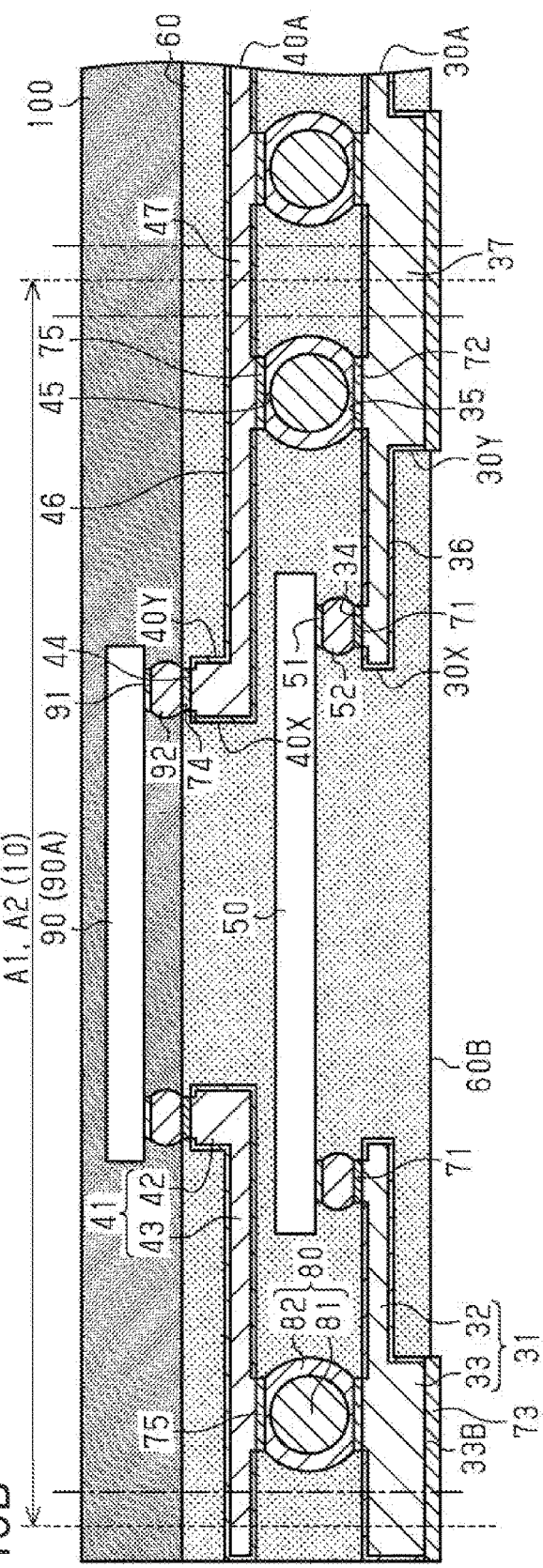

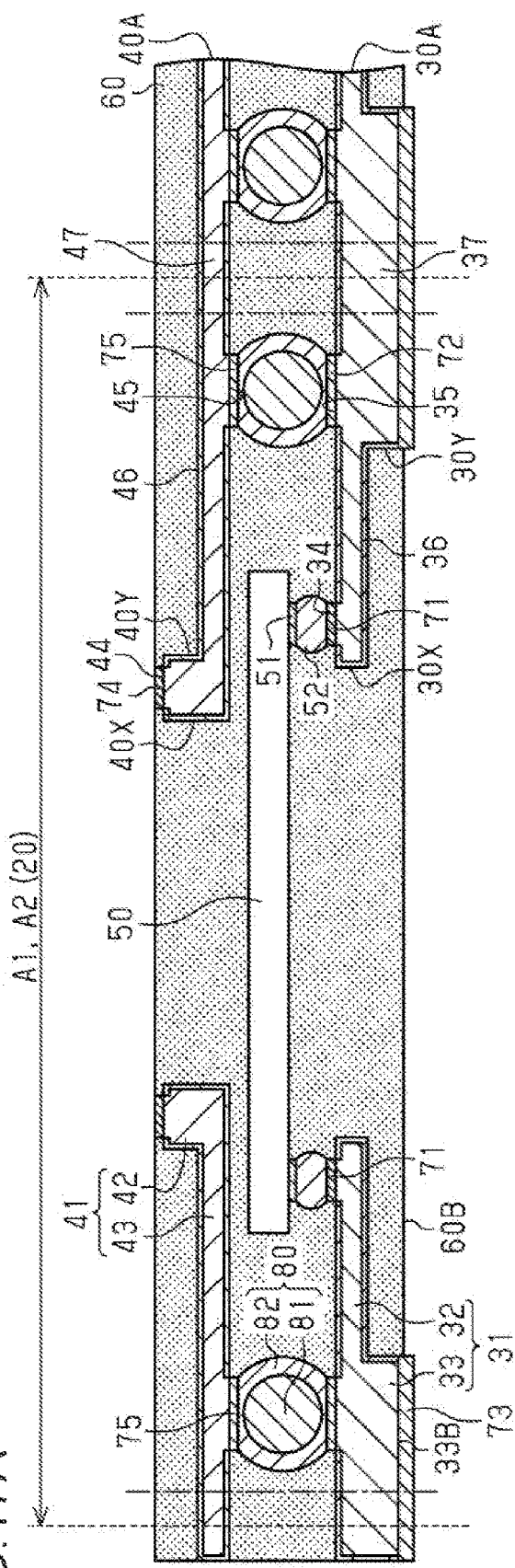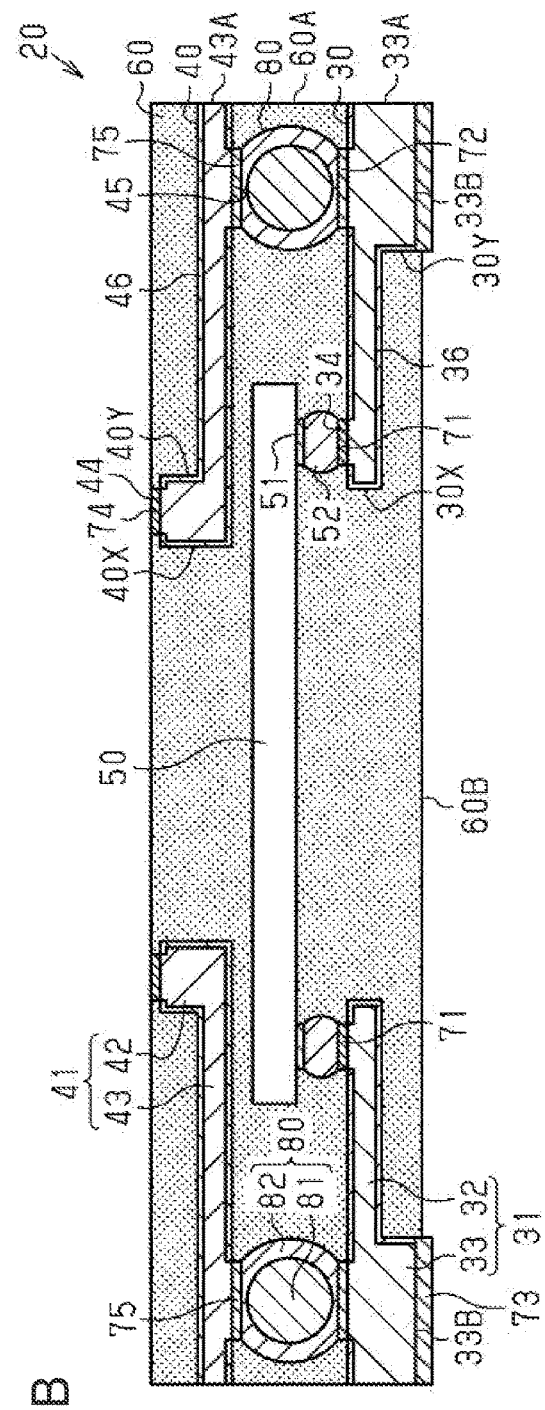

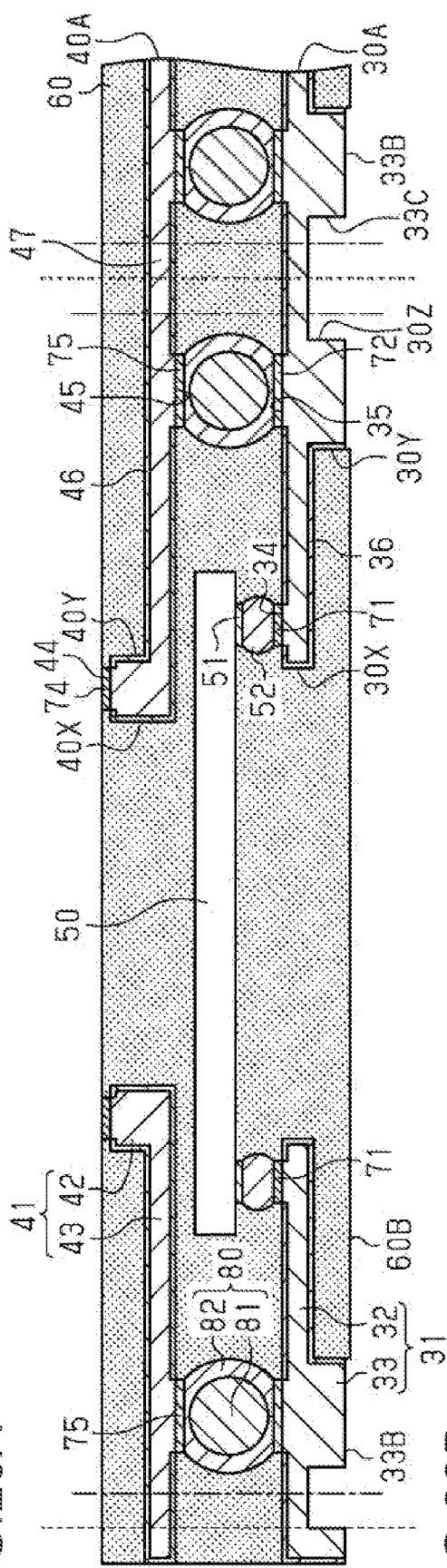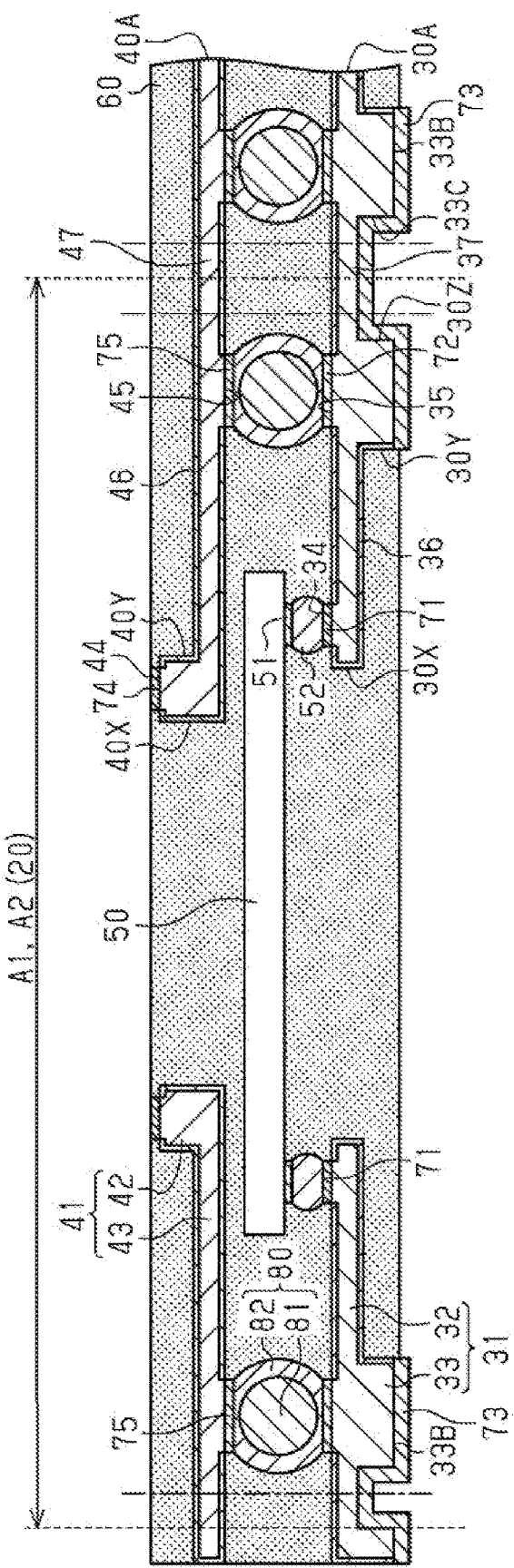

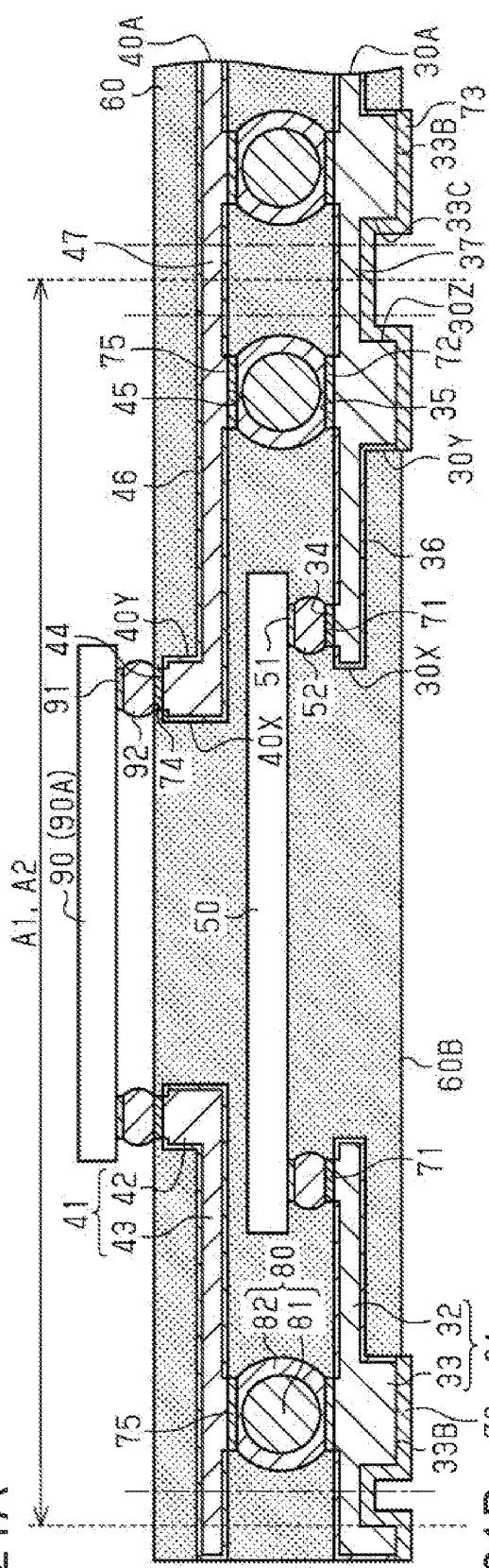
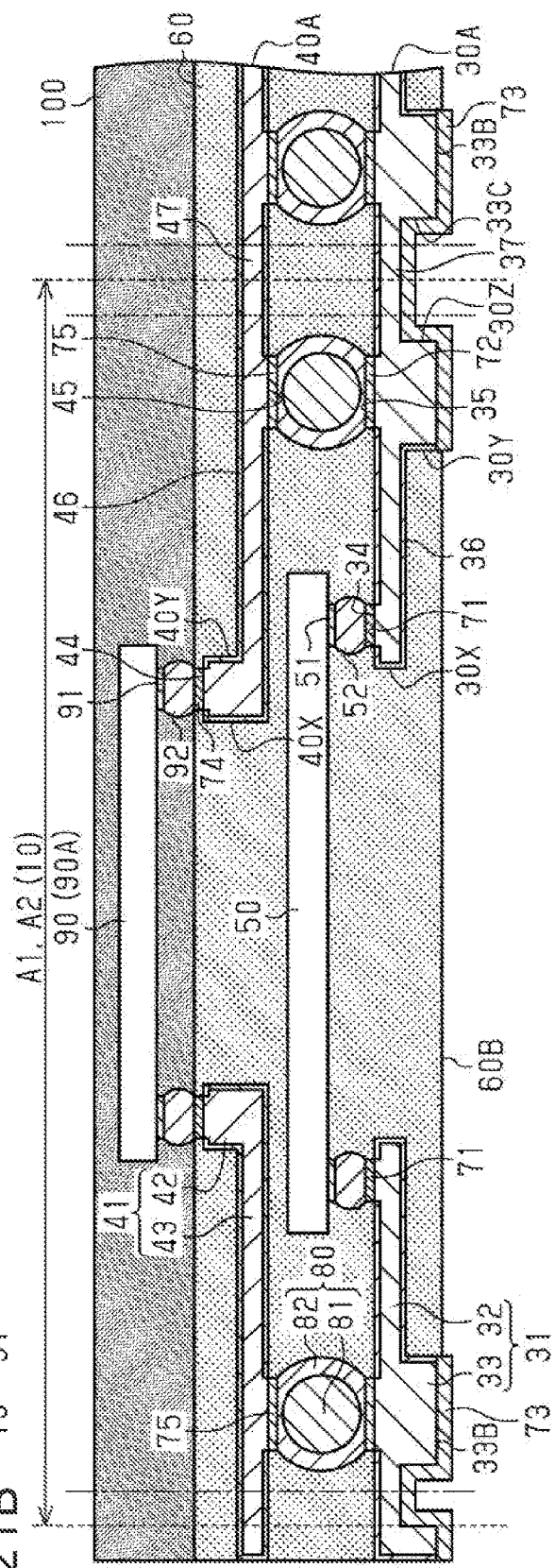

ELECTRONIC COMPONENT APPARATUS HAVING A FIRST LEAD FRAME AND A SECOND LEAD FRAME AND AN ELECTRONIC COMPONENT PROVIDED BETWEEN THE FIRST LEAD FRAME AND THE SECOND LEAD FRAME

This application is a continuation of U.S. application Ser. No. 16/912,969, filed Jun. 26, 2020, issued as U.S. Pat. No. 11,444,006 the entire contents of which are herein incorporated by reference. This application claims priority from Japanese Patent Application No. 2019-119539 filed on Jun. 27, 2019, the entire contents of which are herein incorporated by reference.

BACKGROUND

1. Technical Field

The present disclosure relates to an electronic component apparatus.

2. Background Art

In the background art, electronic component apparatuses in each of which a plurality of electronic components are mounted on a board have been known. An electronic component apparatus in which a lead frame is used as a board and a plurality of electronic components are mounted on the lead frame has been proposed as this type of electronic component apparatus (e.g. see WO2016/076162 and US2011/0285009A1).

In a case where the electronic components having solder bumps are flip-chip mounted on the lead frame in the background-art electronic component apparatus, wetting and spreading of solder cannot be controlled during reflow. Therefore, a problem of bringing adjacent ones of the solder bumps into contact with each other may be likely to arise.

SUMMARY

A certain embodiment provides an electronic component apparatus.

The electronic component comprises:
a first lead frame;
a second lead frame that is provided on the first lead frame;
a first electronic component that is provided between the first lead frame and the second lead frame;
a connection member that is provided between the first lead frame and the second lead frame; and
an insulating resin that is filled between the first lead frame and the second lead frame so as to cover the first electronic component and the connection member;
wherein:
a first oxide film is provided on a surface of the first lead frame;
a second oxide film is provided on a surface of the second lead frame; and
the first lead frame and the second lead frame are electrically connected to each other by the connection member.

BRIEF DESCRIPTION OF DRAWINGS

FIGS. 7A to 7C are schematic sectional views showing the method for manufacturing the electronic component apparatus according to the embodiment;

FIG. 9A is a schematic plan view showing the method for manufacturing the electronic component apparatus according to the embodiment;

FIG. 9B is a schematic sectional view (sectional view taken along a line 9b-9b in FIG. 9A) showing the method for manufacturing the electronic component apparatus according to the embodiment;

FIG. 10A is a schematic plan view showing the method for manufacturing the electronic component apparatus according to the embodiment;

FIG. 10B is a schematic sectional view (sectional view taken along a line 10b-10b in FIG. 10A) showing the method for manufacturing the electronic component apparatus according to the embodiment;

FIGS. 12A and 12B are schematic sectional views showing the method for manufacturing the electronic component apparatus according to the embodiment;

FIGS. 13A and 13B are schematic sectional views showing the method for manufacturing the electronic component apparatus according to the embodiment;

FIGS. 14A and 14B are schematic sectional views showing the method for manufacturing the electronic component apparatus according to the embodiment;

FIGS. 15A and 15B are schematic sectional views showing the method for manufacturing the electronic component apparatus according to the embodiment;

FIGS. 17A and 17B are schematic sectional views showing a method for manufacturing the electronic component apparatus according to a changed example;

FIGS. 20A and 20B are schematic sectional views showing a method for manufacturing an electronic component apparatus according to a changed example;

FIGS. 21A and 21B are schematic sectional views showing the method for manufacturing the electronic component apparatus according to the changed example;

DETAILED DESCRIPTION

Figure 1:
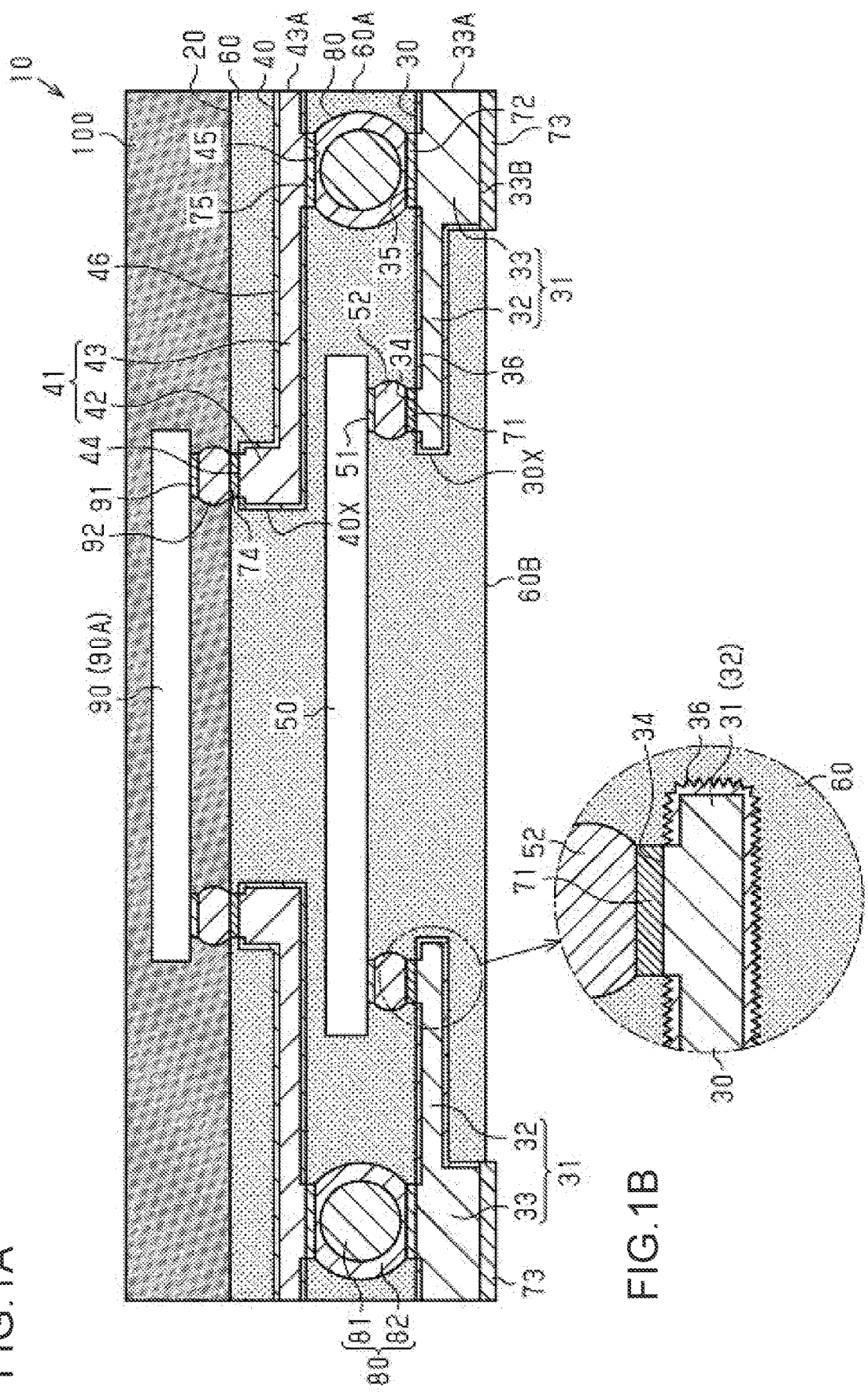
FIG. 1A is a schematic sectional view (sectional view taken along a line 1-1 in FIG. 2 to FIG. 4) which shows an electronic component apparatus according to an embodiment.
FIG. 1B is an enlarged sectional view in which a portion of the electronic component apparatus shown in FIG. 1A is enlarged.

An embodiment will be described below with reference to the accompanying drawings.

Incidentally, some of the accompanying drawings show characteristic portions in an enlarged manner for convenience in order to make the characteristics easy to understand. Therefore, constituent elements do not always have the same dimensional ratios etc. in each of the drawings. In addition, in sectional views, in order to make sectional structures of members easy to understand, some of the members are illustrated by a satin pattern rather than by hatching while others are illustrated without hatching.

First, the structure of an electronic component apparatus 10 will be described in accordance with FIG. 1A to FIG. 5.

As shown in FIG. 1A, the electronic component apparatus 10 has a board 20, one or a plurality of electronic components 90 (a plurality of electronic components 90 in this case), and an encapsulating resin 100. The plurality of electronic components 90 are mounted on the board 20. The encapsulating resin 100 is formed on an upper face of the board 20 so as to encapsulate the plurality of electronic components 90.

The board 20 has a lead frame 30, a lead frame 40, one or a plurality of electronic components 50 (one electronic component 50 in this case) and an insulating resin 60. The lead frame 40 is bonded to an upper face of the lead frame 30. The electronic component 50 is mounted on the upper face of the lead frame 30. The insulating resin 60 is formed between the lead frames 30 and 40 so as to cover the electronic component 50. That is, the board 20 is a board in which the electronic component 50 is embedded.

Figure 2:
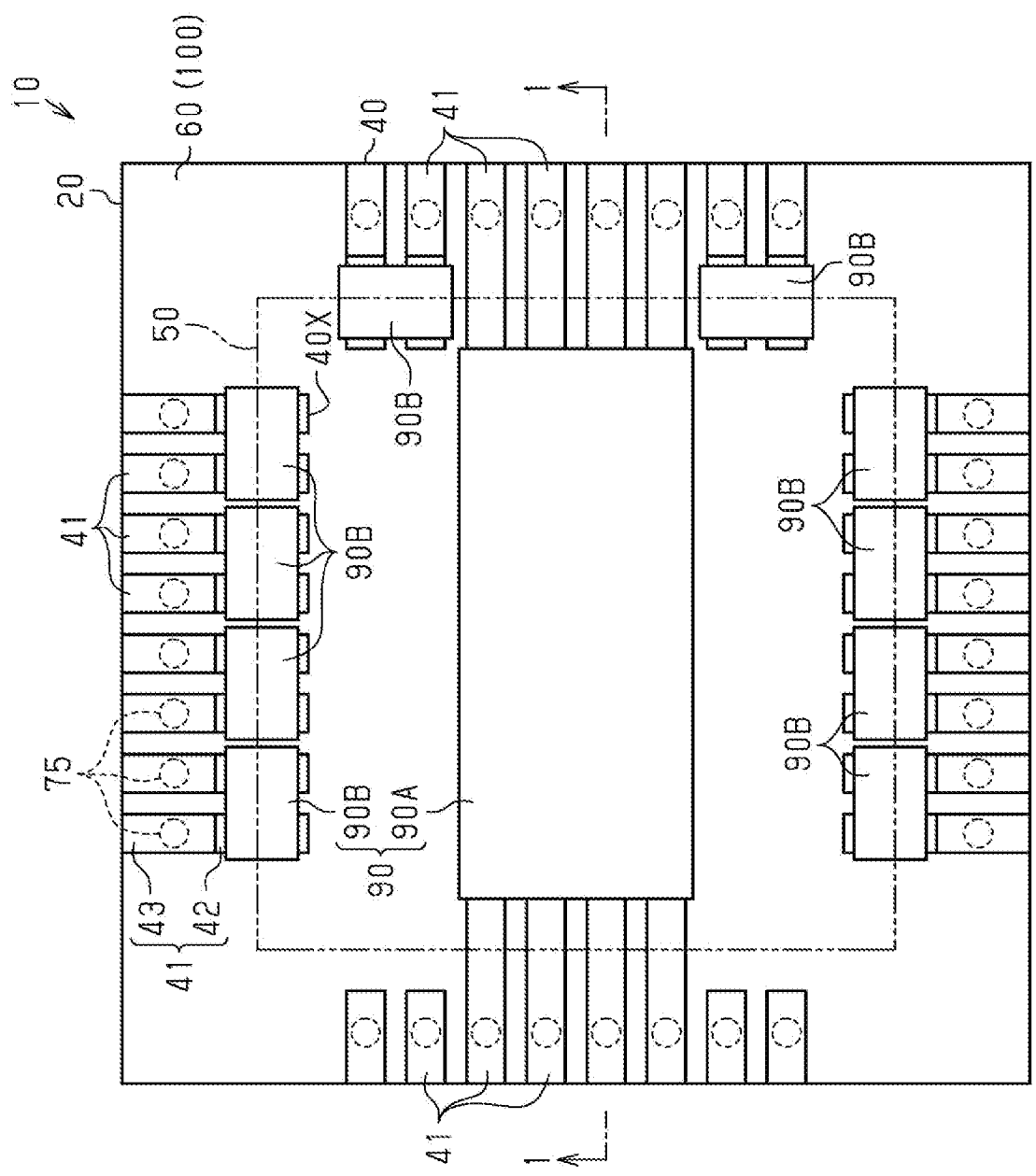
FIG. 2 is a schematic plan view showing the electronic component apparatus according to the embodiment.

As shown in FIG. 2, the board 20 is, for example, formed into a rectangular shape in plan view. For example, the board 20 is formed into a rectangular parallelepiped shape. The size of the board 20 can be, for example, set to measure about 3 mm by 3 mm to 14 mm by 14 mm in plan view. Thickness of the board 20 can be, for example, set in a range of about 0.3 mm to 1.5 mm. Here, in the description of the present invention, the term "plan view" means a view of a subject seen from a normal direction to the upper face of the board 20, and the term "planar shape" means a shape of the subject seen from the normal direction to the upper face of the board 20.

For example, copper (Cu) or a Cu alloy can be used as the material of each of the lead frames 30 and 40 shown in FIG. 1A. For example, an iron-nickel (Fe—Ni) alloy such as 42Alloy can be used as the material of the lead frame 30, 40. Incidentally, the materials of the lead frames 30 and 40 may be materials the same as each other or may be materials different from each other. Thickness of each of the lead frames 30 and 40 can be, for example, set in a range of about 0.1 mm to 0.3 mm. The thicknesses of the lead frames 30 and 40 may be set to be the same as each other or may be set to be different from each other.

(Structure of Lead Frame 30)

Next, the structure of the lead frame 30 will be described in accordance with FIGS. 1A and 1B and FIG. 3.

Figure 3:
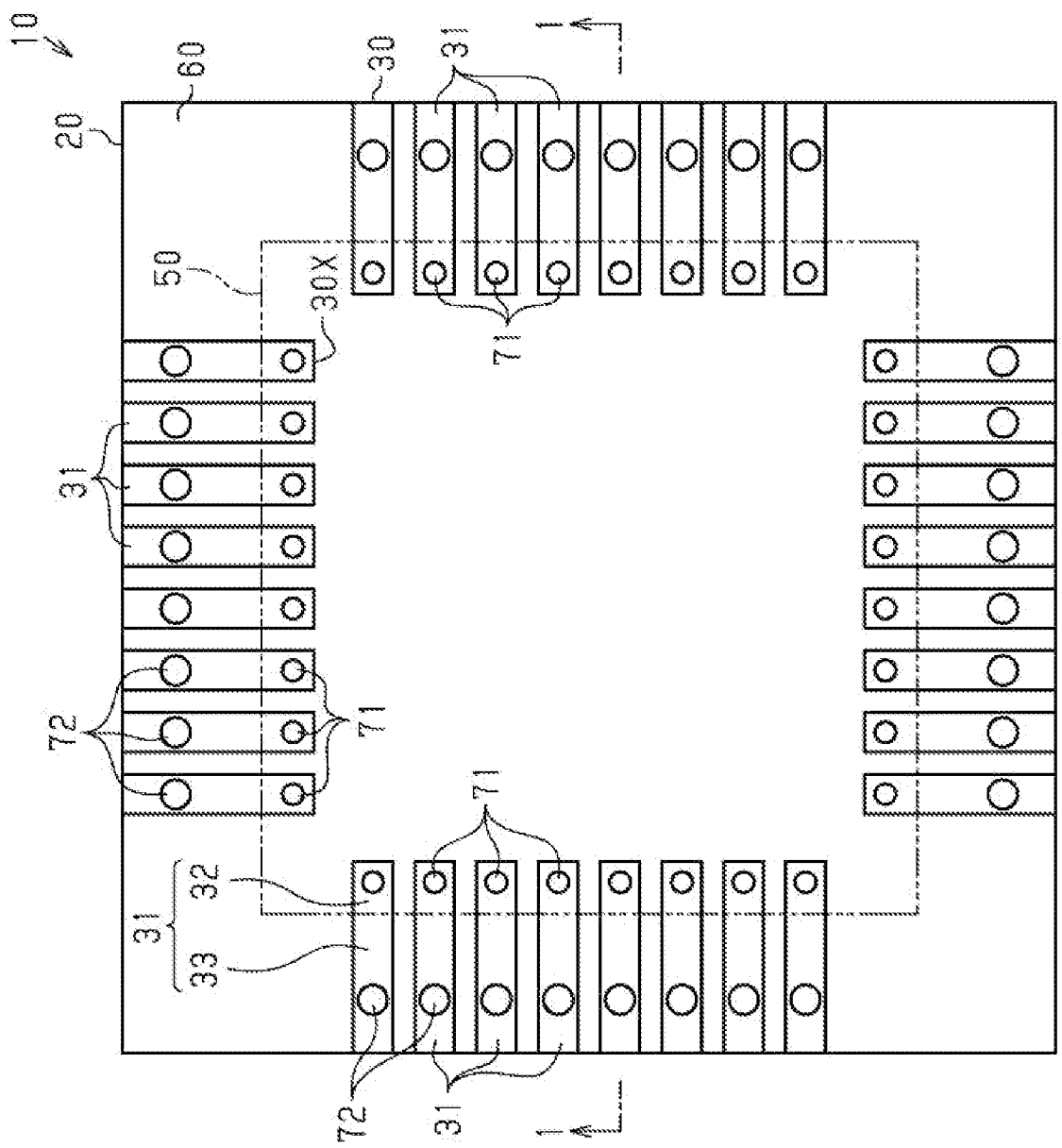
FIG. 3 is a schematic plan view showing the electronic component apparatus according to the embodiment.

As shown in FIG. 3, the lead frame 30 has a plurality of wirings 31. The plurality of wirings 31 are, for example, formed on one and the same plane. An opening portion 30X is formed in the lead frame 30. The opening portion 30X penetrates the lead frame 30 in a thickness direction to define the plurality of wirings 31. Incidentally, FIG. 3 is a plan view in which the lead frame 30 and the insulating resin 60 are seen from above. In FIG. 3, the insulating resin 60 formed on the lead frame 30 is drawn in perspective.

The plurality of wirings 31 are formed separately from one another. The plurality of wirings 31 are, for example, formed in an outer peripheral area of the electronic component apparatus 10 (the board 20). The plurality of wirings 31 are, for example, provided at predetermined intervals along outer peripheral edges of the electronic component apparatus 10. In the present example, eight wirings 31 are provided at predetermined intervals along each of sides forming an outer shape of the board 20.

Each of the wirings 31 has, for example, an inner side connection terminal 32 and an outer side connection terminal 33. The outer side connection terminal 33 is positioned on the outer peripheral edge side of the electronic component apparatus 10 relatively to the inner side connection terminal 32. In the wiring 31, the inner side connection terminal 32 and the outer side connection terminal 33 are formed continuously and integrally. The inner side connection terminal 32 is, for example, formed into a rectangular parallelepiped shape. The outer side connection terminal 33 is, for example, formed into a rectangular parallelepiped shape. A width dimension of the inner side connection terminal 32 is, for example, set to be the same as a width dimension of the outer side connection terminal 33. Incidentally, each of width dimensions of portions in the lead frame 30, 40 in the description of the present invention is a dimension extending along an outer periphery direction of the electronic component apparatus 10, which is a direction of circulation along outer side faces of the electronic component apparatus 10 (the board 20).

As shown in FIG. 1A, the inner side connection terminal 32 is, for example, formed to be thinner in thickness than the outer side connection terminal 33. The thickness of the inner side connection terminal 32 can be, for example, set to be about 0.3 times to 0.7 times as thick as the outer side connection terminal 33. The inner side connection terminal 32 is formed to be recessed upward (toward the lead frame 40) from a lower face side of the outer side connection terminal 33. Thus, a side of the wiring 31 is formed stepwise. In the present embodiment, an upper face of the inner side connection terminal 32 is formed to be substantially flush with an upper face of the outer side connection terminal 33. On the other hand, a lower face of the inner side connection terminal 32 is formed at an upper position than the lower face of the outer side connection terminal 33. The lower face of the inner side connection terminal 32 is, for example, covered with the insulating resin 60.

An outer side face 33A of the outer side connection terminal 33 on the outer peripheral edge side of the electronic component apparatus 10 is exposed from an outer side face 60A of the insulating resin 60. The outer side face 33A of the outer side connection terminal 33 is, for example, formed to be flush with the outer side face 60A of the insulating resin 60.

Each of the wirings 31 is, for example, a wiring for mounting an electronic component 50. For example, the upper face of the inner side connection terminal 32 in the wiring 31 is a face on which the electronic component 50 is mounted. The inner side connection terminal 32 has, for example, a connection portion 34 which is electrically connected to a corresponding one of terminal portions 51 of the electronic component 50 through a corresponding one of solder layers 52. The connection portion 34 is constituted by a portion of the upper face of the inner side connection terminal 32. A metal layer 71 is formed on an upper face of the connection portion 34. The metal layer 71 is, for example, partially formed on the upper face of the inner side connection terminal 32. In other words, the portion of the upper face of the inner side connection terminal 32 which is covered with the metal layer 71 is the connection portion 34. The metal layer 71 is, for example, formed correspondingly to the terminal portion 51 of the electronic component 50. That is, the metal layers 71 are formed at positions facing the terminal portions 51 of the electronic component 50 when the electronic component 50 is mounted on the lead frame 30. As shown in FIG. 3, the metal layers 71 are, for example, formed along the outer peripheral edges of the electronic component 50. Each of the metal layers 71 is, for example, formed into a circular shape in plan view. The metal layer 71 functions as an electronic component mounting pad in order to make electrical connection with the electronic component 50.

A silver (Ag) layer, a gold (Au) layer, an Ni layer/Au layer (a metal layer in which the Ni layer and the Au layer are deposited in the named order), an Ni layer/palladium (Pd) layer/Au layer (a metal layer in which the Ni layer, the Pd layer and the Au layer are deposited in the named order), an Ni layer/Ag layer (a metal layer in which the Ni layer and the Ag layer are deposited in the named order), or the like, can be used as the metal layer 71. Here, the Ag layer is a metal layer made of Ag or an Ag alloy, the Au layer is a metal layer made of Au or an Au alloy, the Ni layer is a metal layer made of Ni or an Ni alloy, and the Pd layer is a metal layer made of Pd or a Pd alloy. For example, a metal layer formed by an electrolytic plating method (an electrolytically plated metal layer) can be used as each of the Ag layer, the Au layer, the Ni layer and the Pd layer. The metal layer 71 preferably includes a noble metal-plated layer such as the Ag layer, the Au layer or the Pd layer in its outermost face.

As shown in FIG. 1A, the outer side connection terminal 33 of each of the wirings 31 has, for example, a connection portion 35 which is connected to the lead frame 40 through a solder ball 80. The connection portion 35 is constituted by a portion of the upper face of the outer side connection terminal 33. A metal layer 72 is formed on an upper face of the connection portion 35. The metal layer 72 is, for example, partially formed on the upper face of the outer side connection terminal 33. In other words, the portion of the upper face of the outer side connection terminal 33 which is covered with the metal layer 72 is the connection portion 35. As shown in FIG. 3, the metal layers 72 are, for example, formed along the outer peripheral edges of the electronic component apparatus 10. Each of the metal layers 72 is, for example, formed into a circular shape in plan view. An Ag layer, an Au layer, an Ni layer/Au layer, an Ni layer/Pd layer/Au layer, an Ni layer/Ag layer, or the like, can be used as the metal layer 72. The metal layer 72 functions as a board connecting pad in order to make electrical connection with the lead frame 40 shown in FIG. 1A.

As shown in FIG. 1A, the lower faces 33B of the outer side connection terminals 33 are exposed from a lower face 60B of the insulating resin 60. The lower faces 33B of the outer side connection terminals 33 are, for example, formed at positions recessed upward (toward the lead frame 40) relatively to the lower face 60B of the insulating resin 60. The lower faces 33B of the outer side connection terminals 33 function, for example, as external electrodes which can be connected to a mount board such as a motherboard.

Metal layers 73 are formed on the lower faces 33B of the outer side connection terminals 33 respectively. The metal layers 73 are, for example, formed so as to cover the entire lower faces 33B of the outer side connection terminals 33 respectively. Lower faces of the metal layers 73 are, for example, formed to protrude downward relatively to the lower face 60B of the insulating resin 60. Each of the metal layers 73 functions, for example, as an external plated layer. A tin (Sn) layer and a solder layer can be cited as examples of the metal layer 73. For example, an alloy containing lead (Pd), a tin (Sn)-gold (Au) alloy, an Sn—Cu alloy, an Sn-silver (Ag) alloy, an Sn—Ag—Cu alloy, or the like, can be used as the material of the solder layer. The Sn layer or the solder layer can be, for example, formed by an electrolytic plating method. In addition, an Ag layer, an Au layer, an Ni layer/Au layer, an Ni layer/Pd layer/Au layer and an Ni layer/Ag layer can be cited as other examples of the metal layer 73. Incidentally, an OSP (Organic Solderability Preservative) film which is, for example, formed on the lower face 33B of the outer side connection terminal 33 by antioxidation treatment such as OSP treatment may be formed in place of the metal layer 73. An organic coating of an azole compound, an imidazole compound, or the like can be used as the OSP film.

Each of the wirings 31 has an oxide film 36 formed so as to surround the circumference of the connection portion 34 (the metal layer 71). The oxide film 36 is formed to surround the circumference of the connection portion 35 (the metal layer 72). The oxide film 36 is, for example, formed in the entire surface of the wiring 31 except the upper faces of the connection portions 34 and 35 and the outer sider face 33A and the lower face 33B of the outer side connection terminal 33. To make detailed description, the oxide film 36 is formed in an entire upper face of the wiring 31 except the upper faces of the connection portions 34 and 35. The oxide film 36 is formed in entire side faces of the wiring 31 except the outer side face 33A of the outer side connection terminal 33. The oxide film 36 is formed in an entire lower face of the wiring 31 (the entire lower face of the inner side connection terminal 32) except the lower face 33B of the outer side connection terminal 33.

The oxide film 36 is, for example, a film of copper oxide containing a hydroxide. The oxide film 36 is, for example, made of fine needle crystals. For example, each of the needle crystals has a particle size of about 0.5 µm or less. The oxide film 36 is not a native oxide film but an oxide film intentionally formed by performing oxidation treatment on the lead frame 30. For example, the oxide film 36 is an oxide film formed by performing anodic oxidation treatment on the lead frame 30. Such an oxide film 36 is formed by oxidizing a base material (e.g. a Cu material) itself of the lead frame 30.

As shown in FIG. 1B, an upper face of the oxide film 36 is, for example, formed on one and the same plane as the upper face of the connection portion 34, or formed at a position recessed downward relatively to the upper face of the connection portion 34. Therefore, the metal layer 71 formed on the upper face of the connection portion 34 is formed to protrude upward relatively to the upper face of the oxide film 36. In addition, the surface of the oxide film 36 is, for example, a roughened face. The surface of the oxide film 36 is, for example, formed into a roughened face larger in surface roughness than the upper face of the connection portion 34. In a similar manner or the same manner, the metal layer 72 formed on the upper face of the connection portion 35 shown in FIG. 1A is formed to protrude upward relatively to the upper face of the oxide film 36. The surface of the oxide film 36 is, for example, formed into the roughened face larger in surface roughness than the upper face of the connection portion 35. Thickness of the oxide film 36 can be, for example, set in a range of about 0.1 µm to 0.2 µm.

Here, when solder connection using the solder layer 52 or the like is performed, flux is used. The flux has a function of reducing and removing a native oxide film from the surface of a metal layer so as to secure wettability of the solder. Therefore, when, for example, the flux flows out to the circumferences of the metal layers 71 and 72, the flux reduces the oxide film 36 formed in the circumferences of the metal layers 71 and 72. Thus, active force of the flux in the oxide film 36 can be lowered. As a result, the wettability of the solder cannot be obtained due to the oxide film 36 so that wetting and spreading of the solder is suppressed. That is, the oxide film 36 has a function of suppressing the wetting and spreading of the solder. In a case where the thickness of the oxide film 36 is too thin, for example, a case where the thickness of the oxide film 36 is less than 0.1 µm, the active force of the flux can be hardly lowered. Accordingly, the wetting and spreading of the solder cannot be suppressed suitably. In addition, in a case where the thickness of the oxide film 36 is too thick, for example, a case where the thickness of the oxide film 36 is thicker than 0.2 µm, there is a risk that stripping may easily occur inside the oxide film 36. When stripping occurs inside the oxide film 36, there is a problem that adhesiveness between the lead frame 30 and the insulating resin 60 may be lowered.

Therefore, the thickness of the oxide film 36 is set in the range of from 0.1 µm to 0.2 µm in the present embodiment.

Incidentally, the oxide film 36 is not formed in the upper faces of the connection portions 34 and 35. In other words, the upper faces of the connection portions 34 and 35 are exposed from the oxide film 36. The oxide film 36 is not formed in the lower face 33B of the outer side connection terminal 33. The oxide film 36 is not formed in the outer side face 33A of the outer side connection terminal 33. However, another oxide film (e.g. a native oxide film) than the oxide film 36 may be formed in the outer side face 33A of the outer side connection terminal 33. The native oxide film is, for example, a hydroxide-free oxide film.

(Structure of Electronic Component 50)

Next, the structure of the electronic component 50 will be described.

The electronic component 50 is mounted on the upper face of the lead frame 30. The electronic component 50 is, for example, mounted on the upper faces of the inner side connection terminals 32 of the wirings 31. For example, an active component such as a semiconductor chip, a transistor or a diode, or a passive component such as a chip capacitor, a chip inductor or a chip resistor can be used as the electronic component 50. For example, a component made of silicon or a component made of ceramic can be used as the electronic component 50. The electronic component 50 in the present embodiment is a semiconductor chip. For example, a logic chip such as a CPU (Central Processing Unit) chip or a GPU (Graphics Processing Unit) chip can be used as the semiconductor chip. In addition, for example, a memory chip such as a DRAM (Dynamic Random Access Memory) chip, an SRAM (Static Random Access Memory) chip or a flash memory chip can be used as the semiconductor chip.

The electronic component 50 (the semiconductor chip) in the present example has a plurality of terminal portions 51 and a plurality of solder layers 52. The terminal portions 51 are provided and disposed on a circuit formation face (a lower face in this case) of the electronic component 50. The solder layers 52 are formed on lower faces of the terminal portions 51. The terminal portions 51 are, for example, formed on only the circuit formation face of the electronic component 50 having the circuit formation face and a back face (an upper face in this case) opposite to the circuit formation face. That is, no terminal portions connected to the lead frame 30, 40 are formed on the back face of the electronic component 50.

For example, a pad made of aluminum (Al), an Al alloy, Cu, a Cu alloy, or the like can be used as each of the terminal portions 51. The terminal portion 51 is, for example, a connection terminal provided on the circuit formation face of the electronic component 50. The terminal portion 51 is provided so as to face a corresponding one of the metal layers 71 formed on the upper face of the lead frame 30.

For example, solder bumps can be used as the solder layers 52 respectively. For example, an alloy containing Pb, an Sn—Au alloy, an Sn—Cu alloy, an Sn—Ag alloy, an Sn—Ag—Cu alloy, or the like, can be used as the material of the solder layers 52.

The electronic component 50 in the present example is flip-chip mounted on the inner side connection terminals 32 of the wirings 31. For example, the terminal portions 51 provided and disposed on the circuit formation face (the lower face in this case) of the electronic component 50 are bonded to the metal layers 71 through the solder layers 52. The metal layers 71 are formed on the upper faces of the connection portions 34 of the inner side connection terminals 32. Thus, the electronic component 50 is electrically connected to the inner side connection terminals 32 (the wirings 31) through the terminal portions 51, the solder layers 52 and the metal layers 71.

(Structure of Lead Frame 40)

Next, the structure of the lead frame 40 will be described in accordance with FIGS. 1A and 1B and FIG. 4.

Figure 4:
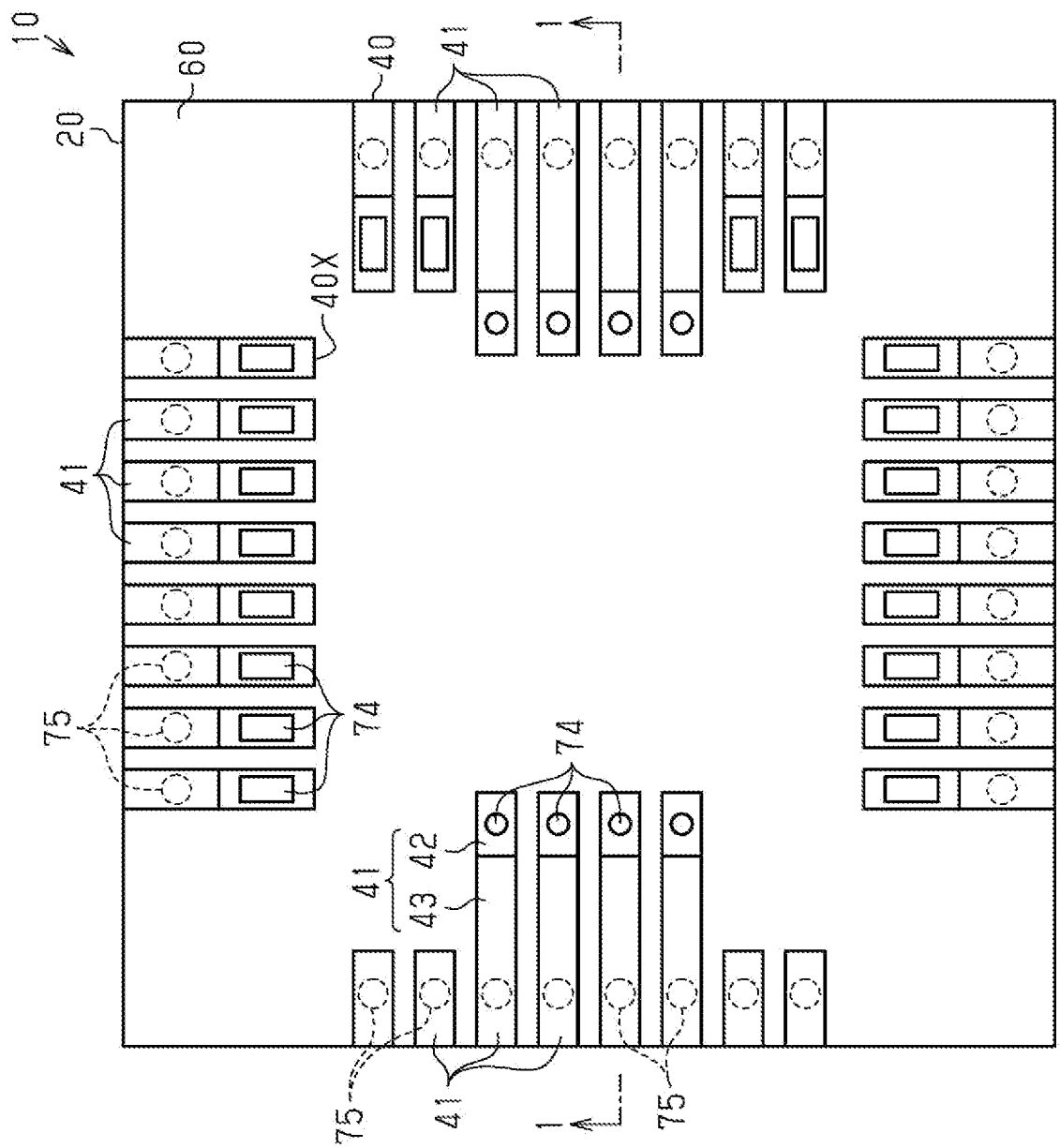
FIG. 4 is a schematic plan view showing the electronic component apparatus according to the embodiment.

As shown in FIG. 4, the lead frame 40 has a plurality of wirings 41. The plurality of wirings 41 are, for example, formed on one and the same plane. An opening portion 40X is formed in the lead frame 40. The opening portion 40X penetrates the lead frame 40 in the thickness direction to define the plurality of wirings 41. Incidentally, FIG. 4 is a plan view in which the lead frame 40 and the insulating resin 60 are seen from above. In FIG. 4, the insulating resin 60 formed on the lead frame 40 is drawn in perspective.

The plurality of wirings 41 are formed separately from one another. The plurality of wirings 41 are, for example, formed in the outer peripheral area of the electronic component apparatus 10 (the board 20). The plurality of wirings 41 are, for example, provided at the predetermined intervals along the outer peripheral edges of the electronic component apparatus 10. In the present example, eight wirings 41 are provided at the predetermined intervals along each of the sides forming the outer shape of the board 20. As shown in FIG. 1A, each of the wirings 41 is formed to partially overlap with a corresponding one of the wirings 31 in plan view.

As shown in FIG. 4, for example, each of some of the wirings 41 has an inner side connection terminal 42 and an outer side connection terminal 43. The outer side connection terminal 43 is positioned on the outer peripheral edge side of the electronic component apparatus 10 relatively to the inner side connection terminal 42. In the wiring 41, the inner side connection terminal 42 and the outer side connection terminal 43 are formed continuously and integrally. The inner side connection terminal 42 is, for example, formed into a rectangular parallelepiped shape. The outer side connection terminal 43 is, for example, formed into a rectangular parallelepiped shape. A width dimension of the inner side connection terminal 42 is, for example, set to be the same as a width dimension of the outer side connection terminal 43. Incidentally, each of the other wirings 41 has only an outer side connection terminal 43. That is, each of the other wirings 41 does not have an inner side connection terminal 42.

As shown in FIG. 1A, thickness of the outer side connection terminal 43 is, for example, formed to be thinner than thickness of the inner side connection terminal 42. The thickness of the outer side connection terminal 43 can be, for example, set to be about 0.3 times to 0.7 times as thick as the inner side connection terminal 42. The outer side connection terminal 43 is formed to be recessed downward (toward the lead frame 30) from an upper face side of the inner side connection terminal 42. Thus, a side of each of the wirings 41 is formed stepwise. In the present embodiment, a lower face of the outer side connection terminal 43 is formed to be substantially flush with a lower face of the inner side connection terminal 42. On the other hand, an upper face of the outer side connection terminal 43 is formed at a lower position than the upper face of the inner side connection terminal 42. The upper face of the outer side connection terminal 43 is, for example, covered with the insulating resin 60.

An outer side face 43A of the outer side connection terminal 43 on the outer peripheral edge side of the electronic component apparatus 10 is exposed from the outer side face 60A of the insulating resin 60. The outer side face 43A of the outer side connection terminal 43 is, for example, formed so as to be flush with the outer side face 60A of the insulating resin 60 and the outer side face 33A of the outer side connection terminal 33.

Each of the wirings 41 which has the inner side connection terminal 42 is, for example, a wiring for mounting an electronic component 90. For example, the upper face of the inner side connection terminal 42 of the wiring 41 is a face on which the electronic component 90 is mounted. The inner side connection terminal 42 has, for example, a connection portion 44 which is electrically connected to a corresponding one of terminal portions 91 of the electronic component 90 through a corresponding one of solder layers 92. The connection portion 44 is constituted by a portion of the upper face of the inner side connection terminal 42. A metal layer 74 is formed on an upper face of the connection portion 44. The metal layer 74 is, for example, partially formed on the upper face of the inner side connection terminal 42. In other words, the portion of the upper face of the inner side connection terminal 42 which is covered with the metal layer 74 is the connection portion 44. The metal layer 74 is, for example, formed correspondingly to the terminal portion 91 of the electronic component 90. The metal layer 74 is, for example, formed into a circular shape in plan view or a rectangular shape in plan view. An Ag layer, an Au layer, an Ni layer/Au layer, an Ni layer/Pd layer/Au layer, an Ni layer/Ag layer, or the like, can be used as the metal layer 74. The metal layer 74 functions as an electronic component mounting pad in order to make electrical connection with the electronic component 90.

An upper face of the metal layer 74 is exposed from an upper face of the insulating resin layer 60. The upper face of the metal layer 74 is, for example, formed so as to be flush with the upper face of the insulating resin 60. The upper face and side faces of the inner side connection terminal 42 are covered with the insulating resin 60.

The outer side connection terminal 43 of each of the wirings 41 has, for example, a connection portion 45 which is connected to the lead frame 30 through a solder ball 80. The connection portion 45 is constituted by a portion of the lower face of the outer side connection terminal 43. A metal layer 75 is formed on a lower face of the connection portion 45. The metal layer 75 is, for example, partially formed on the lower face of the outer side connection terminal 43. In other words, the portion of the lower face of the outer side connection terminal 43 which is covered with the metal layer 75 is the connection portion 45. The metal layer 75 is, for example, formed correspondingly to one of the metal layers 72 formed on the upper faces of the connection portions 35 of the lead frame 30. The metal layers 75 are provided so as to face the metal layers 72 respectively. As shown in FIG. 4, the metal layers 75 are, for example, formed along the outer peripheral edges of the electronic component apparatus 10 (the board 20). Each of the metal layers 75 is, for example, formed into a circular shape in plan view. An Ag layer, an Au layer, an Ni layer/Au layer, an Ni layer/Pd layer/Au layer, an Ni layer/Ag layer, or the like, can be used as the metal layer 75. The metal layer 75 functions as a board connecting pad in order to make electrical connection with the lead frame 30 shown in FIG. 1A.

As shown in FIG. 1A, each of the wirings 41 has an oxide film 46 whish is formed so as to surround the circumference of a corresponding one of the connection portions 44 (the metal layers 74). The oxide film 46 is formed to surround the circumference of a corresponding one of the connection portions 45 (the metal layers 75). The oxide film 46 is, for example, formed in the entire surface of the wiring 41 except the upper face of the connection portion 44, the lower face of the connection portion 45 and the outer side face 43A of the outer side connection terminal 43. To make detailed description, the oxide film 46 is formed in the entire upper face of the wiring 41 except the connection portion 44. The oxide film 46 is formed in entire side faces of the wiring 41 except the outer side face 43A of the outer side connection terminal 43. The oxide film 46 is formed in the entire lower face of the wiring 41 except the lower face of the connection portion 45.

The oxide film 46 is, for example, an oxide film similar to or the same as the oxide film 36. That is, the oxide film 46 is, for example, a film of copper oxide containing a hydroxide. The oxide film 46 is, for example, made of fine needle crystals each having a particle size of about 0.5 μm or less. The oxide film 46 is not a native oxide film but an oxide film intentionally formed by performing oxidation treatment on the lead frame 40. For example, the oxide film 46 is an oxide film formed by performing anodic oxidation treatment on the lead frame 40.

The surface of the oxide film 46 is, for example, a roughened face. The surface of the oxide film 46 is, for example, formed into a roughened face larger in surface roughness than the surface of each of the connection portions 44 and 45. Thickness of the oxide film 46 can be, for example, set in a range of about 0.1 μm to 0.2 μm. The oxide film 46 has a function of suppressing wetting and spreading of solder in a manner similar to or the same as the oxide film 36.

Incidentally, the oxide film 46 is not formed in the upper face of the connection portion 44 and the lower face of the connection portion 45. In other words, the upper face of the connection portion 44 and the lower face of the connection portion 45 are exposed from the oxide film 46. The oxide film 46 is not formed in the outer side face 43A of the outer side connection terminal 43. However, another oxide film (e.g. a native oxide film) than the oxide film 46 may be formed in the outer side face 43A of the outer side connection terminal 43. The native oxide film is, for example, a hydroxide-free oxide film.

(Bonding Form of Lead Frames 30 and 40) The lead frame 40 is disposed on the upper side of the lead frame 30 so that the lower faces of the wirings 41 face the upper faces of the wirings 31 of the lead frame 30. The lead frame 40 is bonded to the lead frame 30 through the solder balls 80.

Each of the solder balls 80 is bonded on a corresponding one of the metal layers 75 formed on the lower face of the lead frame 40. The solder ball 80 is also bonded to a corresponding one of the metal layers 72 formed on the upper face of the lead frame 30. That is, the solder ball 80 is provided between the lead frame 30 and the lead frame 40 so that one end of the solder ball 80 is bonded to the metal layer 72 and the other end of the solder ball 80 is bonded to the metal layer 75. The solder ball 80 functions as a connection terminal electrically connecting the metal layer 72 (the lead frame 30) and the metal layer 75 (the lead frame 40) with each other, and functions as a spacer keeping a distance (separation distance) between the lead frame 30 and the lead frame 40 at a designated value.

The solder ball 80 has, for example, a spherical copper core ball 81 and a solder 82 which covers the circumference of the copper core ball 81. In the solder ball 80, the solder 82 functions as a bonding material. Therefore, the solder ball 80 is bonded to the metal layer 72 by the solder 82 and bonded to the metal layer 75 by the solder 82. Thus, the outer side connection terminal 33 of each of the wirings 31 and the outer side connection terminal 43 of each of the wirings 41 are electrically connected to each other through the solder ball 80. In addition, in the solder ball 80, the copper core ball 81 functions as the spacer. Therefore, based on thickness (a diameter) of the copper core ball 81, thickness of a space between the lead frame 30 and the lead frame 40 is set and a pitch of the solder ball 80 is set. The thickness of such a copper core ball 81 is, for example, set to be thicker than the thickness of the electronic component 50. For example, the thickness of the copper core ball 81 is set to be higher than the thickness of the electronic component 50 including thickness of the terminal portions 51 and thickness of the solder layers 52. For example, the thickness (the diameter) of the copper core ball 81 can be set in a range of about 100 μm to 800 μm. For example, an alloy containing Pb, an Sn—Au alloy, an Sn—Cu alloy, an Sn—Ag alloy, an Sn—Ag—Cu alloy, or the like, can be used as the material of the solder 82.

(Structure of Insulating Resin 60)

Next, the structure of the insulating resin 60 will be described.

The insulating resin 60 is formed so as to fill the space between the lead frame 30 and the lead frame 40 and spaces between the lead frames 30 and 40 and the electronic component 50. The insulating resin 60 is, for example, formed so as to fill the opening portions 30X and 40X which have been formed in the lead frames 30 and 40 respectively. To make detailed description, the insulating resin 60 is formed so as to fill gaps among the wirings 31 and gaps among the wirings 41. The insulating resin 60 is, for example, formed so as to entirely cover the electronic component 50, the terminal portions 51 and the solder layers 52. The insulating resin 60 is, for example, formed so as to entirely cover the solder balls 80. The insulating resin 60 is, for example, formed so as to entirely cover the inner side connection terminals 32 of the lead frame 30. The insulating resin 60 is formed so as to cover the upper faces of the outer side connection terminals 33. The insulating resin 60 is, for example, formed so as to expose the outer side faces 33A and the lower faces 33B of the outer side connection terminals 33. The insulating resin 60 is, for example, formed so as to entirely cover the inner side connection terminals 42 of the lead frame 40. The insulating resin 60 is formed so as to entirely cover the outer side connection terminals 43 except the outer side faces 43A of the outer side connection terminals 43. The insulating resin 60 is formed so as to expose the outer side faces 43A of the outer side connection terminals 43 and the upper faces of the metal layers 74.

For example, an insulating resin such as a polyimide-based resin or an epoxy-based resin or a resin material in which a filler of silica, alumina, or the like, is mixed with these resins can be used as the material of the insulating resin 60. Thickness between the lower face and the upper face of the insulating resin 60 can be, for example, set in a range of about 0.3 mm to 1.5 mm.

(Structures of Electronic Components 90)

Next, the structures of electronic components 90 will be described.

As shown in FIG. 2, one or a plurality of electronic components 90 (eleven electronic components 90 in this case) are mounted on the upper face of the lead frame 40 of the board 20. The electronic components 90 are, for example, mounted on the upper faces of some of the wirings 41. The electronic components 90 have an electronic component 90A provided in a central portion of the electronic component apparatus 10 (the board 20) in plan view, and electronic components 90B provided on the outer peripheral sides of the electronic component apparatus 10 relatively to the electronic component 90A. For example, a passive component such as a chip capacitor, a chip inductor or a chip resistor or an active component such as a semiconductor chip, a transistor or a diode can be used as each of the electronic components 90A and 90B. For example, a component made of silicon or a component made of ceramic can be used as the electronic component 90A, 90B. In the present embodiment, the electronic component 90A is a semiconductor chip, and the electronic components 90B are chip capacitors.

The electronic component 90A is, for example, mounted on the upper faces of ones (eight in this case) of the wirings 41. The electronic component 90A in the present example is mounted on the upper faces of four wirings 41 provided at the predetermined intervals along the outer periphery direction of the electronic component apparatus 10, and the upper faces of four wirings 41 opposite to the four wirings 41. The electronic component 90A is mounted on the upper faces of the eight wirings 41 so as to lie across the opening portion 40X formed among the eight wirings 41.

As shown in FIG. 1A, the electronic component 90A (the semiconductor chip) in the present example has a plurality of terminal portions 91 and solder layers 92. The terminal portions 91 are provided and disposed on a circuit formation face (a lower face in this case) of the electronic component 90A. The solder layers 92 are formed on lower faces of the terminal portions 91.

For example, a pad made of Al, an Al alloy, Cu, a Cu alloy, or the like, can be used as each of the terminal portions 91. The terminal portions 91 are, for example, connection terminals provided on the circuit formation face of the electronic component 90A. Each of the terminal portions 91 is provided so as to face a corresponding one of the metal layers 74 formed on the upper face of the lead frame 40.

For example, solder bumps can be used as the solder layers 92. For example, an alloy containing Pb, an Sn—Au alloy, an Sn—Cu alloy, an Sn—Ag alloy, an Sn—Ag—Cu alloy, or the like, can be used as the material of the solder layers 92.

The electronic component 90A in the present example is flip-chip mounted on the inner side connection terminals 42 of the wirings 41. For example, the terminal portions 91 provided and disposed on the circuit formation face (the lower face in this case) of the electronic component 90A are bonded to the metal layers 74 formed on the upper faces of the connection portions 44 of the inner side connection terminals 42 through the solder layers 92. Thus, the electronic component 90A is electrically connected to the inner side connection terminals 42 (the wirings 41) through the terminal portions 91, the solder layers 92 and the metal layers 74. Here, the electronic component 90A is, for example, formed so as to overlap with a portion of the electronic component 50 in plan view.

As shown in FIG. 2, each of the electronic components 90B is, for example, mounted on the upper faces of two of the wirings 41 formed on the opposite sides of the opening portion 40X, so as to lie across the opening portion 40X formed between the two wirings 41 provided at the predetermined interval along the outer periphery direction of the electronic component apparatus 10. The electronic component 90B is mounted on the metal layers 74 (see FIG. 4) formed on the upper faces of the wirings 41. Although not shown, the electronic component 90B is, for example, solder-mounted on the metal layers 74. The electronic component 90B is, for example, formed so that a portion of the electronic component 90B overlaps with the electronic component 50 in plan view.

(Structure of Sealing Resin 100)

Next, the structure of the encapsulating resin 100 will be described.

As shown in FIG. 1A, the encapsulating resin 100 is formed on the upper face of the insulating resin 60 of the board 20 so as to encapsulate the electronic components 90. The encapsulating resin 100 is, for example, formed to entirely cover the electronic components 90. The encapsulating resin 100 is, for example, formed so as to entirely cover the electronic components 90 including the terminal portions 91 and the solder layers 92. The encapsulating resin 100 is, for example, formed so as to cover the circuit formation faces, the back faces and the side faces of the electronic components 90.

For example, a non-photosensitive insulating resin containing a thermosetting resin as a main component can be used as the material of the encapsulating resin 100. An insulating resin such as a polyimide-based resin or an epoxy-based resin or a resin material in which a filler of silica, alumina, or the like, is mixed with these resins can be used as the material of the encapsulating resin 100. For example, a mold resin can be used as the encapsulating resin 100.

In the present embodiment, the lead frame 30 is an example of a first lead frame, the lead frame 40 is an example of a second lead frame, the electronic component 50 is an example of a first electronic component, the oxide film 36 is an example of a first oxide film, the oxide film 46 is an example of a second oxide film, and the insulating resin 60 is an example of an insulating resin. The connection portion 35 is an example of a first connection portion, the connection portion 45 is an example of a second connection portion, the connection portion 34 is an example of a third connection portion, and the connection portion 44 is an example of a fifth connection portion. The solder ball 80 is an example of a connection member, the copper core ball 81 is an example of a spacer, the solder 82 is an example of a solder, and the electronic component 90 is an example of a second electronic component. The lower face 33B of the outer side connection terminal 33 is an example of an external electrode.

(Application Example)

Figure 5:
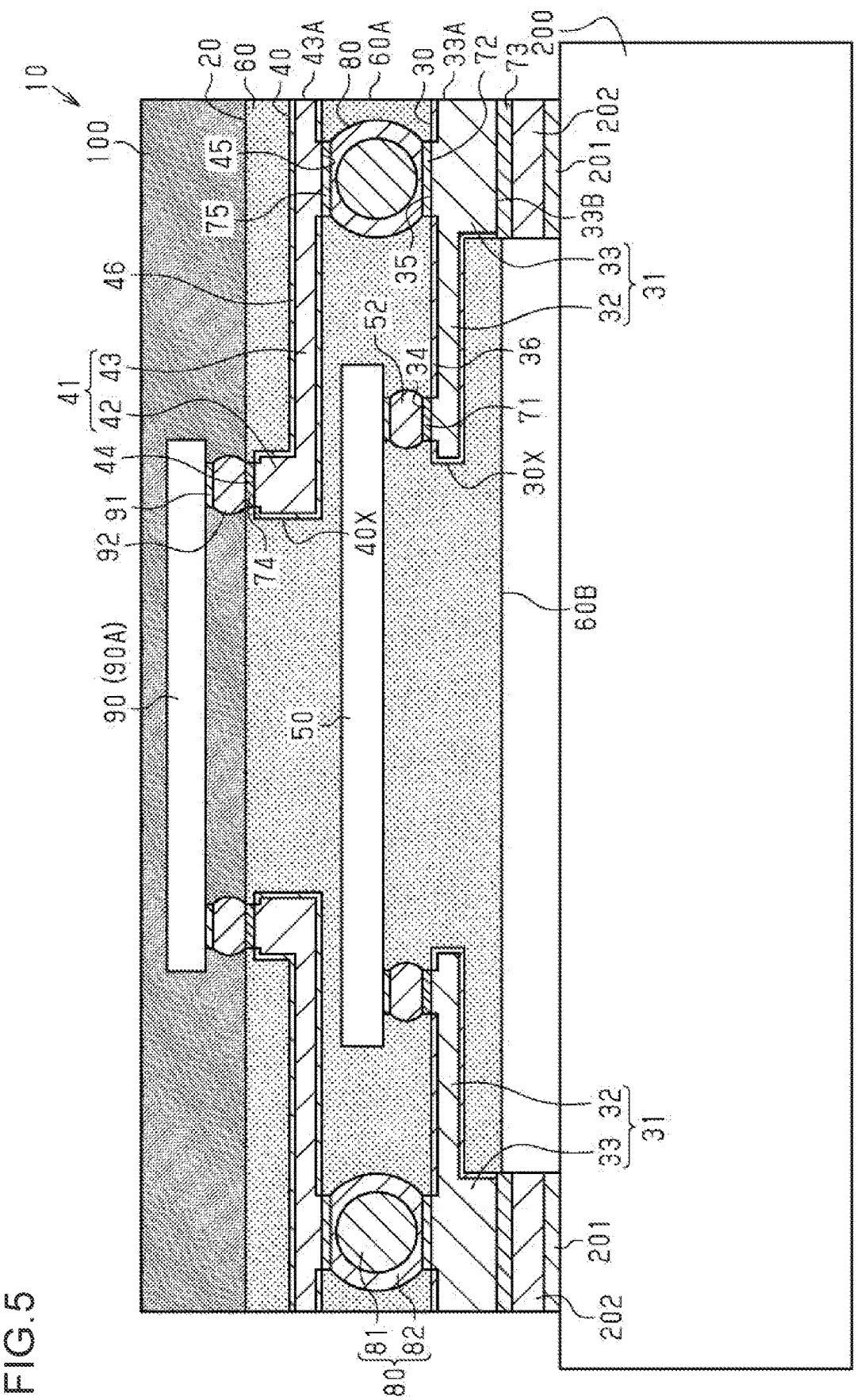
FIG. 5 is a schematic sectional view showing an application example of the electronic component apparatus according to the embodiment.

Next, an example of a mounting form of the electronic component apparatus 10 will be described in accordance with FIG. 5.

The electronic component apparatus 10 is, for example, mounted on a mount board 200 such as a motherboard. Here, a plurality of wiring layers 201 are formed on an upper face of the board 200. The outer side connection terminals 33 of the electronic component apparatus 10 are bonded to the wiring layers 201 by solder layers 202. For example, the metal layers 73 formed on the lower faces 33B of the outer side connection terminals 33 are bonded to the wiring layers 201 by the solder layers 202.

For example, copper or a copper alloy can be used as the material of the wiring layers 201. For example, lead-free solder can be used as the material of the solder layers 202. For example, Sn—Ag-based solder, Sn—Cu-based solder, Sn—Ag—Cu-based solder or Sn—Zn—Bi-based solder can be used as the lead-free solder.

(Method for Manufacturing Electronic Component Apparatus 10)

Next, a method for manufacturing the electronic component apparatus 10 will be described. Incidentally, portions which will be final constituent elements of the electronic component apparatus 10 will be referred to by signs of the final constituent elements for convenience of description.

Figure 6A:
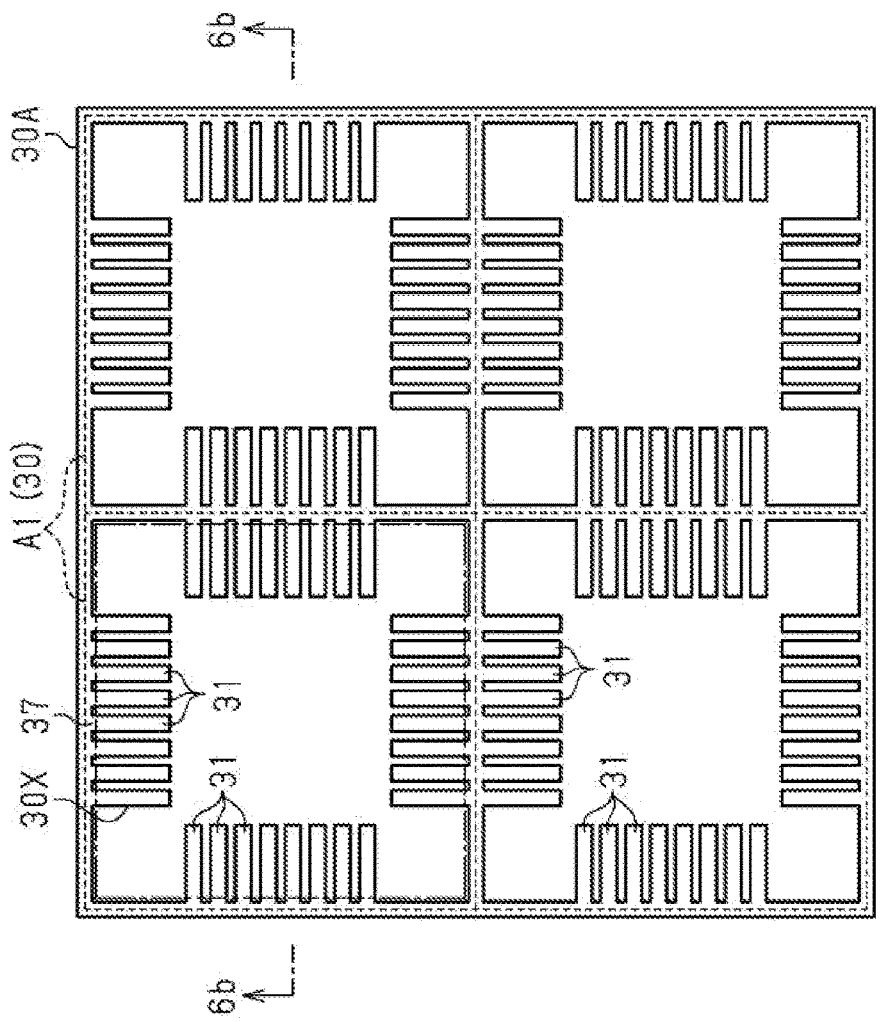
FIG. 6A is a schematic plan view showing a method for manufacturing the electronic component apparatus according to the embodiment.

First, a large-sized lead frame 30A is prepared in a step shown in FIG. 6A. In the lead frame 30A, for example, individual areas A1 in each of which a lead frame 30 is formed are provided continuously in a matrix form (2×2 in this case). Incidentally, in the example shown in FIG. 6A, the lead frame 30A has four individual areas A1. However, the number of the individual areas A1 is not limited particularly. In order to simplify description, the description will be made below with the focus on one individual area A1.

As shown in FIG. 6A, an opening portion 30X is formed in each of the individual areas A1 of the lead frame 30A. The opening portion 30X defines section bars 37 and comb tooth-like wirings 31. The section bars 37 are formed into a lattice shape in plan view. The comb tooth-like wirings 31 are extended from the section bars 37 toward a central portion of the individual area A1 in plan view. On this occasion, the wirings 31 formed in each of the individual areas A1 are coupled to the wirings 31 formed in adjacent ones of the individual areas A1 through the section bars 37. Incidentally, after structure bodies corresponding to electronic component apparatuses 10 shown in FIG. 1A and FIG. 1B are formed, each of the individual areas A1 is finally cut along a cutting line and divided into an individual piece to be an individual electronic component apparatus 10. The cutting line is designated by a one-dot chain line. That is, outer side portions (i.e. the section bars 37) with respect to an area surrounded by the one-dot chain line in the individual area A1 are portions which will be finally discarded. Incidentally, in order to simplify the drawings, the cutting line is designated by the one-dot chain line in only an upper left one of the individual areas A1 in FIG. 6A, FIG. 8A and FIG. 9A. In addition, FIG. 6A is a plan view in which the structure bodies shown in FIG. 6B are seen from above.

Figure 6B:
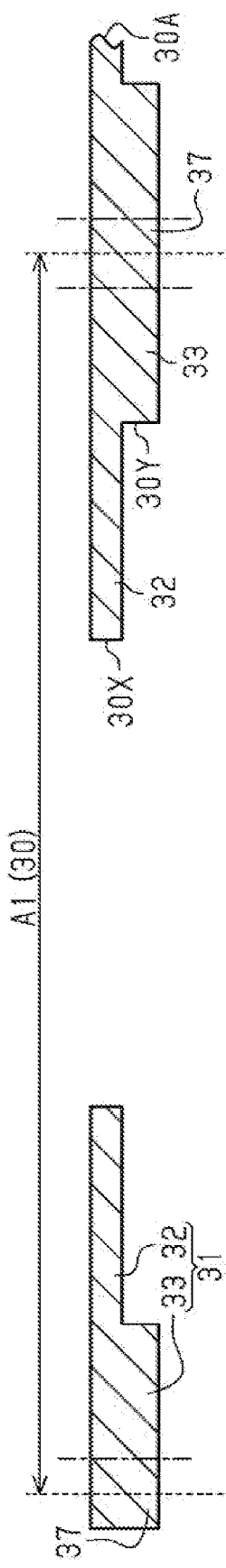
FIG. 6B is a schematic sectional view (sectional view taken along a line 6b-6b in FIG. 6A) showing the method for manufacturing the electronic component apparatus according to the embodiment.

In the present example, recess portions 30Y are formed in lower faces of inner side connection terminals 32 of the wirings 31, as shown in FIG. 6B. That is, the inner side connection terminals 32 in the present example are thinned from the lower face side. The aforementioned opening portion 30X and the recess portions 30Y can be, for example, formed by etching treatment which will be described below. Incidentally, FIG. 6B is a sectional view mainly showing a sectional structure of the upper left individual area A1 in a section taken along a line 6b-6b shown in FIG. 6A. In addition, sectional views shown in FIGS. 7A to 7C, FIG. 8B, FIG. 8C, FIG. 9B and FIGS. 12A to 16 following FIG. 6B also mainly show the sectional structure of the same portion.

First, a flat plate-like metal plate 30B is prepared in a step shown in FIG. 7A.

Next, in a step shown in FIG. 7B, a resist layer 120 having opening patterns 120X is formed on an upper face of the metal plate 30B, and a resist layer 121 having opening patterns 121X is formed on a lower face of the metal plate 30B. The opening patterns 120X are formed to respectively expose portions of the upper face of the metal plate 30B corresponding to areas where the opening portions 30X (see FIG. 1A) will be formed. The opening patterns 121X are formed to respectively expose portions of the lower face of the metal plate 30B corresponding to areas where the opening portions 30X (see FIG. 1A) and the recess portions 30Y (see FIG. 6B) will be formed.

For example, a photosensitive dry film or a liquid photoresist (e.g. a dry film resist or a liquid resist made of a novolac-based resin, an acrylic-based resin, or the like), or the like, can be used as the material of each of the resist layers 120 and 121. In a case where, for example, the photosensitive dry film is used, the dry film is laminated on the upper face or the lower face of the metal plate 30B by thermocompression bonding, and the dry film is patterned by photolithography to form the resist layer 120, 121. Incidentally, also in a case where the liquid photoresist is used, the liquid photoresist is first applied and can then go through similar steps or the same steps to form the resist layer 120, 121.

Successively, in a step shown in FIG. 7C, the metal plate 30B is wet-etched from its opposite faces with the resist layers 120 and 121 as etching masks so that the opening portions 30X and the recess portions 30Y are formed in the metal plate 30B. To make detailed description, in portions where the opening patterns 120X of the resist layer 120 and the opening patterns 121X of the resist layer 121 overlap in plan view, the metal plate 30B exposed from the opening patterns 120X and 121X is removed by etching from the opposite faces so that the opening portions 30X are formed in the metal plate 30B. By each of the opening portions 30X formed thus, the section bars 37 and the wirings 31 having the inner side connection terminals 32 and outer side connection terminals 33 are defined in a corresponding one of the individual areas A1. In addition, by the present step, in the portions where the opening patterns 121X overlap with the resist layer 120 in plan view, the metal plate 30B exposed from the opening patterns 121X is etched (half-etched) from the lower face, and the metal plate 30B is removed from the lower side up to a predetermined depth to be thinned. Thus, the recess portions 30Y are formed in the metal plate 30B, and the inner side connection terminals 32 of the wirings 31 are thinned from the lower face side. Incidentally, an etching solution used in the present step can be selected suitably according to the material of the metal plate 30B. In a case where, for example, a copper plate is used as the metal plate 30B, a ferric chloride aqueous solution or a cupric chloride aqueous solution can be used as the etching solution, and the present step can be carried out by performing spray etching on opposite faces of the metal plate 30B. By the aforementioned manufacturing steps, the lead frame 30A in which the section bars 37 and the wirings 31 are formed in each of the individual areas A1 can be obtained from the metal plate 30B.

Next, the resist layers 120 and 121 are removed, for example, by an alkaline stripping solution (e.g. an organic amine-based stripping solution, caustic soda, acetone, ethanol, etc.). Thus, as shown in FIG. 6B, the lead frame 30 where the opening portion 30X and the recess portions 30Y are formed is formed in each of the individual areas A1. By the aforementioned manufacturing steps, the structure bodies shown in FIG. 6A and FIG. 6B can be manufactured.

Incidentally, the opening portion 30X and the recess portions 30Y are formed by etching treatment in the present example. However, for example, the opening portion 30X and the recess portions 30Y may be formed by press treatment.

Figure 8A:
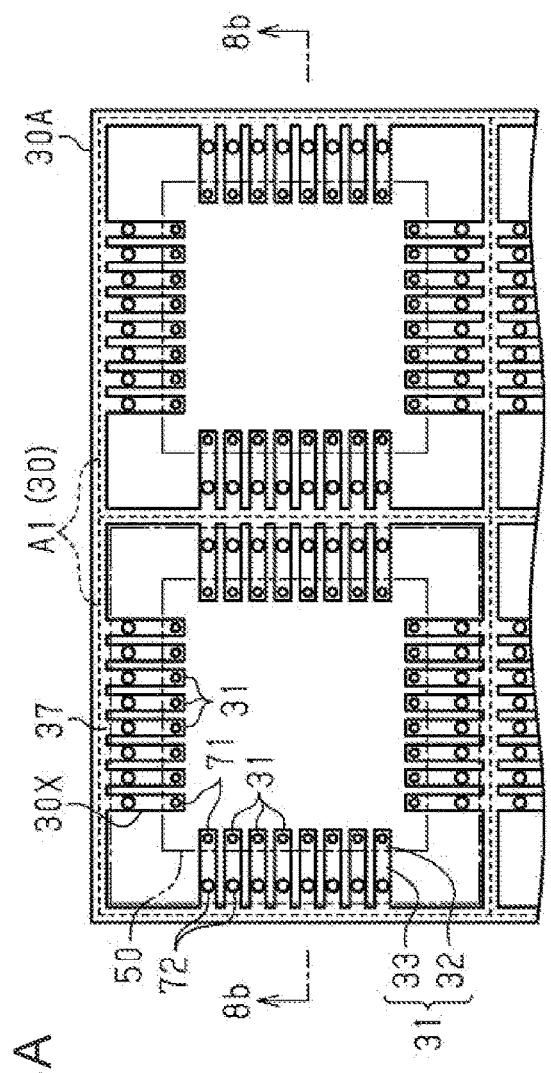
FIG. 8A is a schematic plan view showing the method for manufacturing the electronic component apparatus according to the embodiment.
Figure 8B:
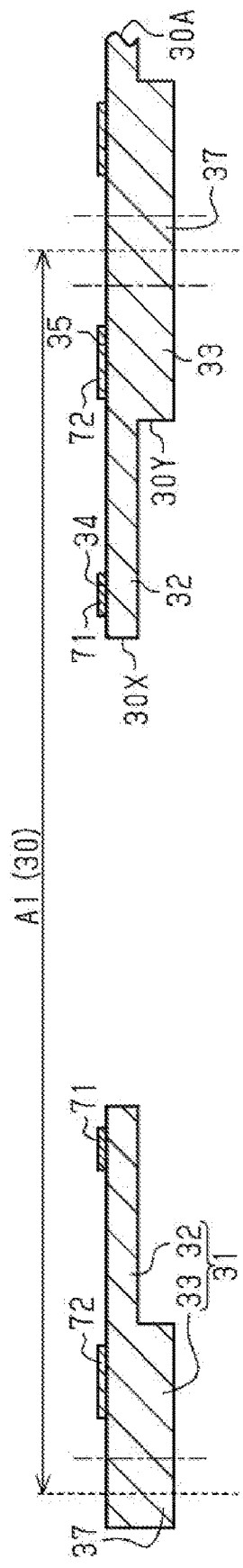
FIGS. 8B and 8C are schematic sectional views (sectional views taken along a line 8b-8b in FIG. 8A) showing the method for manufacturing the electronic component apparatus according to the embodiment.

Next, in a step shown in FIG. 8A and FIG. 8B, metal layers 71 are formed on upper faces of the inner side connection terminals 32 of the wirings 31, and metal layers 72 are formed on upper faces of the outer side connection terminals 33 of the wirings 31. In the present example, the metal layers 71 are partially formed on portions (i.e. connection portions 34) of the upper faces of the inner side connection terminals 32, and the metal layers 72 are partially formed on portions (connection portions 35) of the upper faces of the outer side connection terminals 33. The metal layers 71 and 72 can be, for example, formed by an electrolytic plating method using the lead frame 30A as a power feed layer. For example, a resist layer covering the entire surface of the lead frame 30A except areas where the metal layers 71 and 72 will be formed is formed, and the metal layers 71 and 72 are formed on the lead frame 30A exposed from the resist layer by an electrolytic plating method using the resist layer as a plating mask. In addition, each of the metal layers 71 and 72 may be formed by a sparger system. An outermost layer of the metal layer 71, 72 in the present embodiment is constituted by a noble metal-plated layer such as an Au layer, an Ag layer or a Pd layer. Incidentally, FIG. 8A is a plan view in which the structure bodies shown in FIG. 8B are seen from above.

Figure 8C:
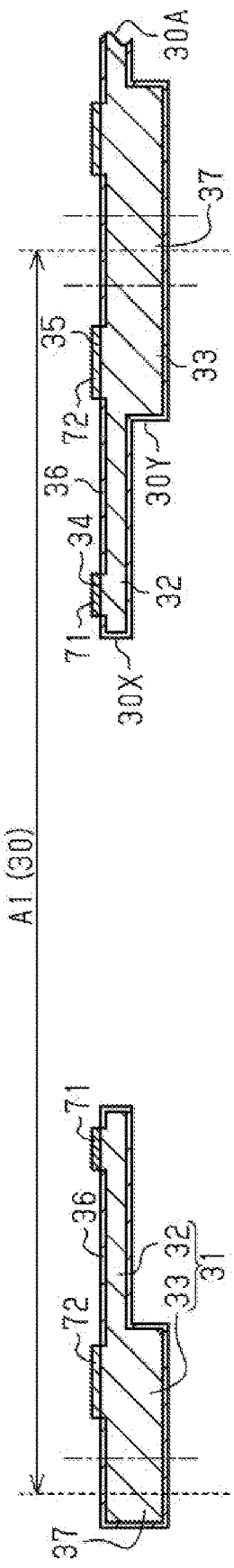

Successively, in a step shown in FIG. 8C, oxide films 36 are formed in the surface of the lead frame 30A to surround the circumferences of the metal layers 71 and 72. The oxide films 36 can be, for example, formed by an anodic oxidation method. The anodic oxidation method is, for example, a method for immersing the lead frame 30A shown in FIG. 8B in an anodic oxidation treatment solution which is an electrolytic solution, and passing electricity through (applying pulsed voltage to) the anodic oxidation treatment solution with the lead frame 30A as an anode and an electrode of platinum (Pt) or the like as a cathode. The electrode of platinum (Pt) or the like is disposed to be opposed to the lead frame 30A.

In the case where, for example, the lead frame 30A is a copper plate, the anodic oxidation method can be performed with composition and treatment conditions of the anodic oxidation treatment solution set as follows.

Anodic Oxidation Treatment Solution:

| | |
|---|---|
| Sodium Chlorite (NaClO$_2$) | 0 to 100 g/L |
| Sodium Hydroxide (NaOH) | 5 to 60 g/L |
| Trisodium Phosphate (Na$_3$PO$_4$) | 0 to 200 g/L |

Treatment Conditions:

| | |
|---|---|
| Bath Temperature | about 50 to 80° C. |
| Treatment Time | about 1 to 20 seconds |
| Current Density | about 0.2 to 10 A/dm$^2$ |

By such an anodic oxidation method, the oxide films 36 are formed in the entire surface of the lead frame 30A. Incidentally, since each of the metal layers 71 and 72 includes the noble metal-plated layer, the metal layer 71, 72 is not anodically oxidized. In addition, upper faces of the connection portions 34 and 35 covered with the metal layers 71 and 72 respectively are also not anodically oxidized. Therefore, the oxide films 36 are formed in the entire surface of the lead frame 30A except the connection portions 34 and 35 so as to surround the circumferences of the metal layers 71 and 72 (the connection portions 34 and 35). The oxide films 36 each of which is a film of copper oxide containing a hydroxide are anodically oxidized films having needle crystals. On this occasion, a base material (a copper plate in this case) per se of the lead frame 30A is anodically oxidized by the anodic oxidation method so that the oxide films 36 are formed in the lead frame 30A. Therefore, for example, upper faces of the oxide films 36 are formed on one and the same plane as the upper faces of the connection portions 34 and 35 or formed at positions recessed downward relatively to the upper faces of the connection portions 34 and 35. Accordingly, the metal layers 71 and 72 formed on the upper faces of the connection portions 34 and 35 are formed to protrude upward relatively to the upper faces of the oxide films 36. In addition, thickness of each of the oxide films 36 can be adjusted by adjusting the composition of the anodic oxidation treatment solution or the treatment conditions such as voltage or the treatment time in the anodic oxidation method. That is, in the anodic oxidation method, the thickness of the oxide film 36 can be easily adjusted to be desired thickness, i.e. to fall into a range of from 0.1 μm to 0.2 μm. In other words, by the anodic oxidation method, the oxide film 36 having the desired thickness in the range of from 0.1 μm to 0.2 μm can be formed stably.

Next, in a step shown in FIG. 9A and FIG. 9B, electronic components 50 are prepared. As shown in FIG. 9B, each of the electronic components 50 has terminal portions 51 and solder layers 52. The terminal portions 51 are formed on a circuit formation face (a lower face in this case) of the electronic component 50. The solder layers 52 are formed on lower faces of the terminal portions 51. Successively, the electronic component 50 is mounted on the upper faces of the wirings 31 of each of the individual areas A1. For example, the terminal portions 51 of the electronic component 50 are flip-chip bonded on the metal layers 71 formed on the upper faces of the wirings 31 of the individual area A1. Specifically, after flux (not shown) is suitably applied on the metal layers 71, and the metal layers 71 and the terminal portions 51 are aligned with each other respectively, reflow treatment is performed at a temperature of about 230° C. to 260° C. to melt the solder layers 52 to electrically connect the terminal portions 51 to the metal layers 71 respectively. Thus, the terminal portions 51 of the electronic component 50 are connected to the metal layers 71 by the solder layers 52 respectively. On this occasion, the oxide films 36 are formed in the circumferences of the metal layers 71 so as to surround the metal layers 71. Therefore, activeness of the flux in the oxide films 36 is lowered so that the solder layers 52 can be suppressed from getting wet and spreading on the oxide films 36. Thus, the wetting and spreading of the solder layers 52 onto other portions that the metal layers 71 can be suppressed so that the solder layers 52 connected to the metal layers 71 of adjacent ones of the wirings 31 can be suppressed from contacting each other.

Next, in a step shown in FIG. 10A and FIG. 10B, a large-sized lead frame 40A is prepared. In the lead frame 40A, for example, individual areas A2 in each of which a lead frame 40 is formed are provided continuously in a matrix form (2×2 in this case). Incidentally, in the example shown in FIG. 10A, the lead frame 40A has four individual areas A2. However, the number of the individual areas A2 is not limited particularly. In order to simplify description, the description will be made below with the focus on one individual area A2.

As shown in FIG. 10A, an opening portion 40X is formed in each of the individual areas A2 of the lead frame 40A. The opening portion 40X defines section bars 47 and comb tooth-like wirings 41. The section bars 47 are formed into a lattice shape in plan view. The comb tooth-like wirings 41 are extended from the section bars 47 toward a central portion of the individual area A2 in plan view. On this occasion, the wirings 41 formed in each of the individual areas A2 are coupled to the wirings 41 formed in adjacent ones of the individual areas A2 through the section bars 47. Each of the individual areas A2 is formed correspondingly to one of the individual areas A1 of the lead frame 30A shown in FIG. 6A. The individual area A2 is formed into a planar shape the same in size as the planar shape of the individual area A1 (see FIG. 6A). After the structure bodies corresponding to the electronic component apparatuses 10 shown in FIG. 1A and FIG. 1B are formed, each of the individual areas A2 is finally cut along a cutting line and divided into an individual piece to be an individual electronic component apparatus 10. The cutting line is designated by a one-dot chain line. Therefore, outer side portions (i.e. the section bars 47) with respect to an area surrounded by the one-dot chain line in the individual area A2 are portions which will be finally discarded. In order to simplify the drawing, the cutting line is designated by the one-dot chain line in only an illustrated upper left one of the individual areas A2 in FIG. 10A. Incidentally, FIG. 10A is a plan view in which the structure bodies shown in FIG. 10B are seen from above.

In the present example, recess portions 40Y are formed in upper faces of outer side connection terminals 43 of the wirings 41, as shown in FIG. 10B. That is, the outer side connection terminals 43 in the present example are thinned from the upper face side. The opening portion 40X and the recess portions 40Y can be, for example, formed by steps similar to or the same as the steps shown in FIG. 7A to FIG. 7C. Incidentally, FIG. 10B is a sectional view mainly showing the sectional structure of the upper left individual area A2 in a section taken along a line 10b-10b shown in FIG. 10A. In addition, sectional views shown in FIGS. 11B and 11C and FIGS. 12A to 16 following FIG. 10B also mainly show the sectional structure of the same portion.

Figure 11A:
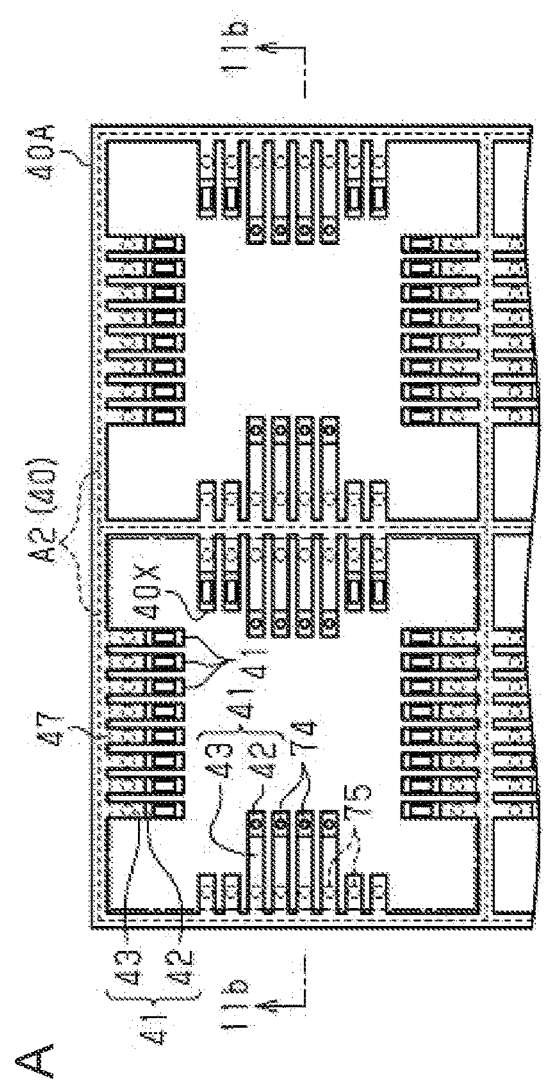
FIG. 11A is a schematic plan view showing the method for manufacturing the electronic component apparatus according to the embodiment.
Figure 11B:
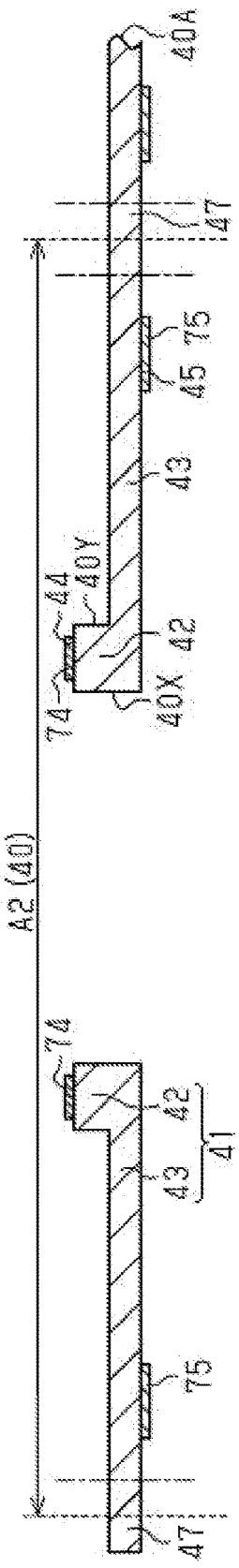
FIGS. 11B and 11C are schematic sectional views (sectional views taken along a line 11b-11b in FIG. 11A) showing the method for manufacturing the electronic component apparatus according to the embodiment.

Next, in a step shown in FIG. 11A and FIG. 11B, metal layers 74 are formed on upper faces of the inner side connection terminals 42 of the wirings 41, and metal layers 75 are formed on lower faces of the outer side connection terminals 43 of the wirings 41. In the present example, the metal layers 74 are partially formed on portions (i.e. connection portions 44) of the upper faces of the inner side connection terminals 42, and the metal layers 75 are partially formed on portions (i.e. connection portions 45) of the lower faces of the outer side connection terminals 43. Each of the metal layers 74 and 75 can be, for example, formed by an electrolytic plating method using the lead frame 40A as a power feed layer. For example, a resist layer which covers the entire surface of the lead frame 40A except areas where the metal layers 74 an 75 will be formed is formed, and the metal layers 74 and 75 are formed on the lead frame 40A exposed from the resist layer by an electrolytic plating method using the resist layer as a plating mask. In addition, the metal layers 74 and 75 may be formed by a sparger system. An outermost layer of each of the metal layers 74 and 75 in the present embodiment is constituted by a noble metal-plated layer such as an Au layer, an Ag layer or a Pd layer. Incidentally, FIG. 11A is a plan view in which the structure bodies shown in FIG. 11B are seen from above.

Figure 11C:
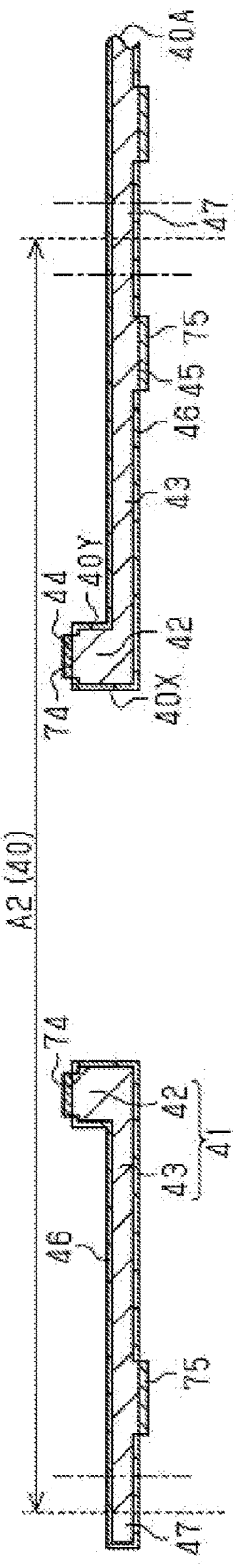

Successively, in a step shown in FIG. 11C, oxide films 46 are formed in the surface of the lead frame 40A to surround the circumferences of the metal layers 74 and 75. The oxide films 46 can be, for example, formed by an anodic oxidation method in a manner similar to or the same as the oxide films 36. By the anodic oxidation method, the oxide films 46 are formed in the entire surface of the lead frame 40A. However, since each of the metal layers 74 and 75 includes the noble metal-plated layer, the metal layer 74, 75 is not anodically oxidized. In addition, upper faces of the connection portions 44 covered with the metal layers 74 and lower faces of the connection portions 45 covered with the metal layers 75 are also not anodically oxidized. Therefore, the oxide films 46 are formed in the entire surface of the lead frame 40A except the connection portions 44 and 45 so as to surround the circumferences of the metal layers 74 and 75 (the connection portions 44 and 45). The oxide films 46 each of which is a film of copper oxide containing a hydroxide are anodically oxidized films having needle crystals. On this occasion, a base material (a copper plate in this case) per se of the lead frame 40A is anodically oxidized by the anodic oxidation method so that the oxide films 46 are formed in the lead frame 40A. Therefore, upper faces of the oxide films 46 are formed on one and the same plane as the upper faces of the connection portions 44 or formed at positions recessed downward relatively to the upper faces of the connection portions 44. In addition, lower faces of the oxide films 46 are formed on one and the same plane as the lower faces of the connection portions 45 or formed at positions recessed upward relatively to the lower faces of the connection portions 45. Accordingly, the metal layers 74 formed on the upper faces of the connection portions 44 are formed to protrude upward relatively to the upper faces of the oxide films 46. In addition, the metal layers 75 formed on the lower faces of the connection portions 45 are formed to protrude downward relatively to the lower faces of the oxide films 46. Incidentally, the oxide films 46 each having desired thickness in a range of from 0.1 µm to 0.2 µm can be stably formed by the anodic oxidation method.

Next, in a step shown in FIG. 12A, solder balls 80 are mounted (bonded) on the metal layers 75. For example, after flux is properly applied on the metal layers 75, the solder balls 80 are mounted on the metal layers 75. Then, reflow treatment is performed at a temperature of about 230° C. to 260° C. to fix the solder balls 80 on the metal layers 75. On this occasion, the oxide films 46 are formed in the circumferences of the metal layers 75 so as to surround the metal layers 75. Therefore, activeness of the flux in the oxide films 46 is lowered so that solders 82 of the solder balls 80 are suppressed from getting wet and spreading onto the oxide films 46. Thus, the wetting and spreading of the solders 82 onto other portions than the metal layers 75 can be suppressed so that, for example, adjacent ones of the solder balls 80 can be suppressed from contacting each other.

Successively, in a step shown in FIG. 12B, the lead frame 40A is disposed on the upper side of the lead frame 30A. On this occasion, the lead frames 30A and 40A are disposed so that the individual areas A1 and A2 overlap with each other in plan view. That is, the lead frames 30A and 40A are disposed so that the individual areas A1 and A2 are aligned with each other vertically. Specifically, the lead frames 30A and 40A are disposed so that the metal layers 72 formed on the upper face of the lead frame 30A and the metal layers 75 formed on the lower face of the lead frame 40A face each other.

Next, in a step shown in FIG. 13A, the solder balls 80 are bonded to upper faces of the metal layers 72. For example, after the flux is properly applied to the upper faces of the metal layers 72, the lead frame 40A is disposed on the lead frame 30A with the solder balls 80 interposed therebetween, as shown in FIG. 13A. The lead frames 30A and 40A superimposed on each other thus are pressurized while heated at a temperature of about 230° C. to 260° C. so that the lead frames 30A and 40A are bonded to each other. Thus, the solders 82 of the solder balls 80 are melted so that the solder balls 80 are bonded to the metal layers 72. On this occasion, the oxide films 36 are formed in the circumferences of the metal layers 72 so as to surround the metal layers 72. Therefore, the activeness of the flux in the oxide films 36 is lowered so that the solders 82 of the solder balls 80 are suppressed from getting wet and spreading onto the oxide films 36. Thus, the wetting and spreading of the solders 82 onto the other portions than the metal layers 72 can be suppressed so that, for example, adjacent ones of the solder balls 80 can be suppressed from contacting each other. By the present step, the lead frame 40A is fixed to the lead frame 30A through the solder balls 80, and the metal layers 72 and the metal layers 75 are electrically connected to each other through the solder balls 80. Incidentally, in the present step, reflow is performed while the lead frame 40A is pressed against the lead frame 30A. Since copper core balls 81 of the solder balls 80 function as spacers, an interval between the lead frame 30A and the lead frame 40A is kept at a predetermined distance.

Next, in a step shown in FIG. 13B, an insulating resin 60 filling gaps among the lead frame 30A, the lead frame 40A and the electronic component 50 is formed. The insulating resin 60 is formed so as to fill the opening portions 30X and 40X and the recess portions 30Y and 40Y and entirely cover the electronic component 50. In addition, the insulating resin 60 is, for example, formed so as to expose the lower faces 33B of the outer side connection terminals 33 of the lead frame 30A and upper faces of the metal layers 74. The insulating resin 60 can be, for example, formed by a resin molding method. In a case where, for example, a mold resin having a thermosetting property is used as the material of the insulating resin 60, the structure bodies shown in FIG. 13A are received in a mold, and the mold resin fluidized by pressure (e.g. 5 to 10 MPa) applied thereto is introduced into the mold. Then, the mold resin is heated at a temperature of about 180° C. to be cured. Thus, the insulating resin 60 is formed. When required encapsulating treatment is completed, the structure bodies covered with the insulating resin 60 are extracted from the mold. Incidentally, for example, a method such as a transfer mold method, a compression mold method or an injection mold method can be used as the method for filling the mold resin.

Next, in a step shown in FIG. 14A, the oxide films 36 formed in the lower faces 33B of the outer side connection terminals 33 exposed from the insulating resin 60 are removed. Thus, the lower faces 33B of the outer side connection terminals 33 are exposed to the outside. The oxide films 36 can be removed by acid treatment or alkaline treatment.

Successively, in a step shown in FIG. 14B, metal layers 73 are formed on the lower faces of the outer side connection terminals 33 exposed from the insulating resin 60. The metal layers 73 can be, for example, formed by an electrolytic plating method using the lead frames 30A and 40A as power feed layers.

By the aforementioned manufacturing steps, a structure body corresponding to a board 20 can be manufactured in each individual area A1 and A2.

Next, in a step shown in FIG. 15A, electronic components 90 are mounted on the upper faces of the wirings 41 in each individual area A2. For example, the electronic components 90 are mounted on the metal layers 74 formed on the upper faces of the inner side connection terminals 42 of the wirings 41. For example, terminal portions 91 of an electronic component 90A are flip-chip bonded on corresponding ones of the metal layers 74 formed on the upper faces of the inner side connection terminals 42 of the wirings 41. Specifically, after flux (not shown) is properly applied on the metal layers 74 and the metal layers 74 and the terminal portions 91 are aligned with each other, reflow treatment is performed at a temperature of about 230° C. to 260° C. to melt solder layers 92 so as to electrically connect the terminal portions 91 to the metal layers 74.

Next, in a step shown in FIG. 15B, an encapsulating resin 100 for encapsulating the electronic components 90 is formed on an upper face of the insulating resin 60. The encapsulating resin 100 is, for example, formed so as to entirely cover the electronic components 90 including the terminal portions 91 and the solder layers 92. The encapsulating resin 100 can be, for example, formed by a resin molding method in a manner similar to or the same as the insulating resin 60.

By the aforementioned manufacturing steps, a structure body corresponding to an electronic component apparatus 10 can be manufactured in each individual area A1 and A2.

Figure 16:
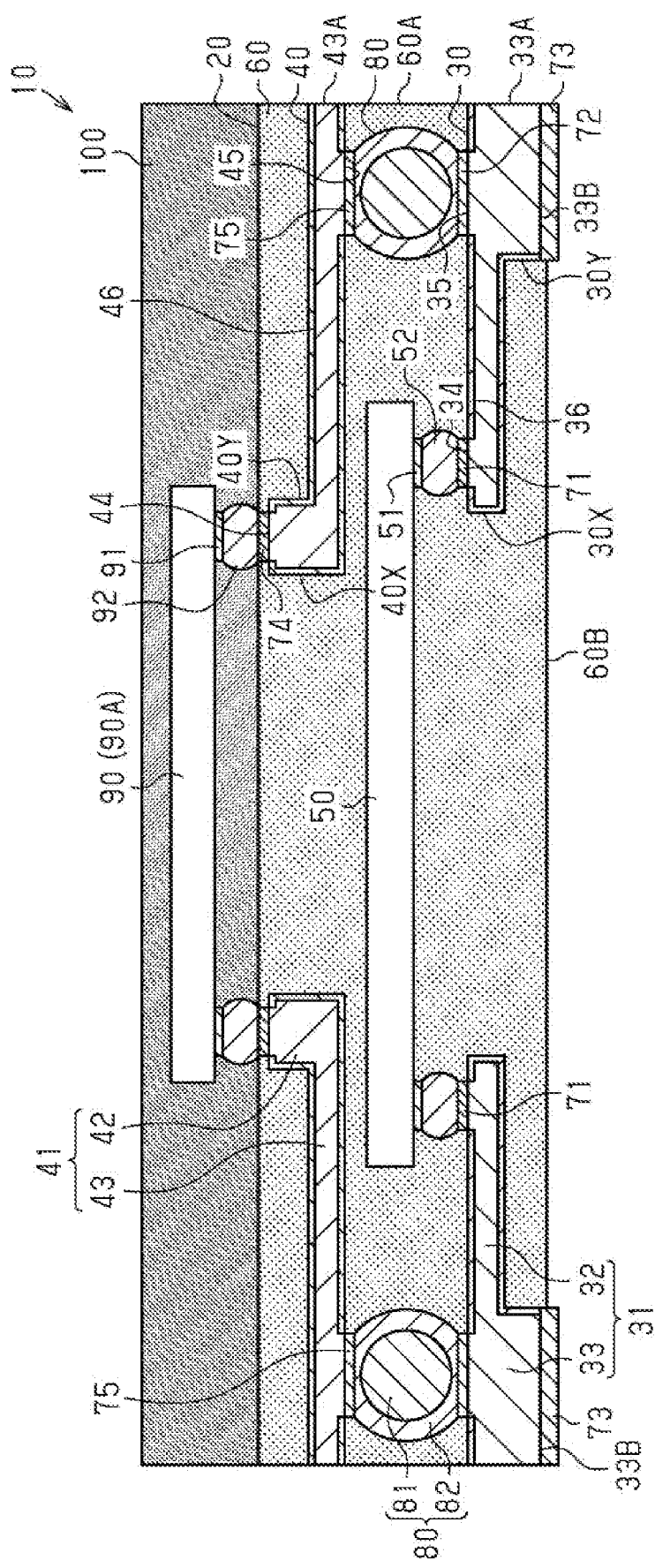
FIG. 16 is a schematic sectional view showing the method for manufacturing the electronic component apparatus according to the embodiment.

Next, the metal layers 73, the section bars 37 and 47, the insulating resin 60 and the encapsulating resin 100 are cut by a dicing saw etc. at a cutting position indicated by the illustrated one-dot chain line so that the structure body is divided into an individual electronic component apparatus 10. By the present step, outer side faces of the metal layers 73, outer side faces 33A of the outer side connection terminals 33, outer side faces 60A of the insulating resin 60, outer side faces 43A of the outer side connection terminals 43 and outer side faces of the encapsulating resin 100, which are cut faces, are formed to be substantially flush with one another, as shown in FIG. 16.

By the aforementioned manufacturing steps, a plurality of electronic component apparatuses 10 can be manufactured in a batch. Incidentally, each of the individually divided electronic component apparatuses 10 can be used in a vertically inverted state, or can be disposed at any angle.

Next, functions and effects of the present embodiment will be described.

(1) The electronic component apparatus 10 has the lead frame 30, the lead frame 40 which is provided on the lead frame 30, and the electronic component 50 which is provided between the lead frame 30 and the lead frame 40. The electronic component apparatus 10 has the solder balls 80 which are provided between the lead frame 30 and the lead frame 40, and the insulating resin 60 which is filled between the lead frame 30 and the lead frame 40 to cover the electronic component 50 and the solder balls 80. The oxide films 36 are provided in the surface of the lead frame 30, and the oxide films 46 are provided in the surface of the lead frame 40. The solder balls 80 are formed to be thicker in thickness than the electronic component 50. The lead frame 30 and the lead frame 40 are electrically connected to each other by the solder balls 80.

According to the configuration, in the case where, for example, the lead frame 30 and the lead frame 40 are connected to each other by the solder balls 80 having the solders 82, activeness of the flux can be lowered by the oxide films 36 and 46 provided in the surfaces of the lead frames 30 and 40 respectively. Thus, the solders 82 can be suppressed from getting wet and spreading onto the oxide films 36 and 46. Accordingly, for example, the wetting and spreading of the solders 82 onto the other portions than the connection portions 35 and 45 can be suppressed. As a result, adjacent ones of the solder balls 80 can be suppressed from contacting each other.

(2) In addition, the solder balls 80 are set to be thicker in thickness than the electronic component 50 disposed between the lead frames 30 and 40. By the solder balls 80, a separation distance between the lead frame 30 and the lead frame 40 can be kept to be longer than the thickness of the electronic component 50. Thus, the electronic component 50 can be suitably embedded between the lead frame 30 and the lead frame 40.

(3) The oxide films 36 are formed in the circumferences of the connection portions 35 of the outer side connection terminals 33 electrically connected to the solder balls 80. The oxide films 46 are formed in the circumferences of the connection portions 45 of the outer side connection terminals 43 electrically connected to the solder balls 80. The solder balls 80 have the copper core balls 81 functioning as spacers, and the solders 82. The coper core balls 81 are bonded to the connection portions 35 and the connection portions 45 by the solders 82.

According to the configuration, in the case where the solder balls 80 are connected to the connection portions 35 and 45, activeness of the flux can be lowered by the oxide films 36 and 46 formed in the circumferences of the connection portions 35 and 45 respectively. Thus, the solders 82 of the solder balls 80 can be suppressed from getting wet and spreading onto the oxide films 36 and 46 so that the wetting and spreading of the solders 82 onto the other portions than the connection portions 35 and 45 can be suppressed. As a result, adjacent ones of the solder balls 80 can be suppressed from contacting each other.

(4) In addition, when the solder balls 80 are mounted on the lead frames 30A and 40A whose surfaces are flat (like flat plates), the solder balls 80 may be likely to be flowed due to the wetting and spreading of the solders 82 melted during the reflow, so as to result in displacement of the mounted positions of the solder balls 80.

On the other hand, the oxide films 36 and 46 are provided in the circumferences of the connection portions 34 and 45 in the present embodiment. The wetting and spreading of the solders 82 can be suppressed by the oxide films 36 and 46. Accordingly, the solder balls 80 can be suppressed from being flowed. Thus, accuracy of the mounted positions of the solder balls 80 can be improved. As a result, assembling accuracy of the electronic component apparatus 10 can be improved.

(5) Each of the inner side connection terminals 32 of the lead frame 30 has the connection portion 34 which is electrically connected to the electronic component 50, and the oxide film 36 which is formed so as to surround the circumference of the connection portion 34. According to the configuration, in the case where, for example, the electronic component 50 is connected to the connection portions 34 by the solder layers 52, activeness of the flux can be lowered by the oxide films 36 formed in the circumferences of the connection portions 34. Thus, the solder layers 52 can be suppressed from getting wet and spreading onto the oxide films 36 so that the wetting and spreading of the solder layers 52 onto the other portions than the connection portions 34 can be suppressed. As a result, the solder layers 52 connected to adjacent ones of the connection portions 34 can be suppressed from contacting each other.

(6) The oxide films 36 and 46 are formed by the anodic oxidation method. Thus, the oxide films 36 and 46 each having the desired thickness (in a range of from 0.1 μm to 0.2 μm in this case) can be stably formed on the surfaces of the lead frames 30 and 40.

(7) The electronic components 90 mounted on the connection portions 44 of the inner side connection terminals 42 of the lead frame 40 are provided so as to partially overlap with the electronic component 50 in plan view. The electronic component 50 is embedded between the lead frames 30 and 40. Thus, the electronic components 50 and 90 can be mounted on the lead frames 30 and 40 in a state in which the electronic components 50 and 90 are partially overlapped in plan view. Therefore, the planar shape of the electronic component apparatus 10 can be reduced in comparison with that in a case where a plurality of electronic components are mounted and arranged side by side on a lead frame.

(8) The lead frame 30 and the lead frame 40 can be manufactured individually. Therefore, the materials of the lead frames 30 and 40 can be selected separately to support wide applications.

Other Embodiments

The aforementioned embodiment can be changed and carried out in the following manner. The aforementioned embodiment and any of the following changed examples can be combined with each other and carried out in a scope in which they are not technically contradictory to each other.

The width dimension of each of the inner side connection terminals 32 in the aforementioned embodiment may be formed to be smaller than the width dimension of each of the outer side connection terminals 33. Thus, in adjacent ones of the wirings 31, the pitch of the inner side connection terminals 32 can be made narrower than the pitch of the outer side connection terminals 33. As a result, the electronic component 50 having the terminal portions 51 arranged at the narrower pitch can be mounted on the inner side connection terminals 32.

The width dimension of each of the inner side connection terminals 42 in the aforementioned embodiment may be formed to be smaller than the width dimension of each of the outer side connection terminals 43. Thus, in adjacent ones of the wirings 41, the pitch of the inner side connection terminals 42 can be made narrower than the pitch of the outer side connection terminals 43. As a result, the electronic component 90 having the terminal portions 91 arranged at the narrower pitch can be mounted on the inner side connection terminals 42.

The present invention is not particularly limited to the manufacturing method in the aforementioned embodiment. For examples, timing for performing division into individual pieces may be changed suitably.

For example, first, the steps shown in FIG. 6A to FIG. 14B are carried out to manufacture the structure body in which the board 20 is formed in each individual area A1 and A2, as shown in FIG. 17A.

Next, the metal layers 73, the section bars 37 and 47 and the insulating resin 60 at the cutting position designated by the illustrated one-dot chain line is cut by the dicing saw etc. Thus, the structure body is divided into an individual board 20, as shown in FIG. 17B. That is, in the present changed example, the board 20 is individually divided before the electronic components 90 (see FIG. 1A) are mounted on the board 20. Then, the electronic components 90 may be mounted on the individually divided board 20.

Incidentally, the individually divided board 20 shown in FIG. 17B may be regarded as an electronic component apparatus according to the present invention.

Figure 18:
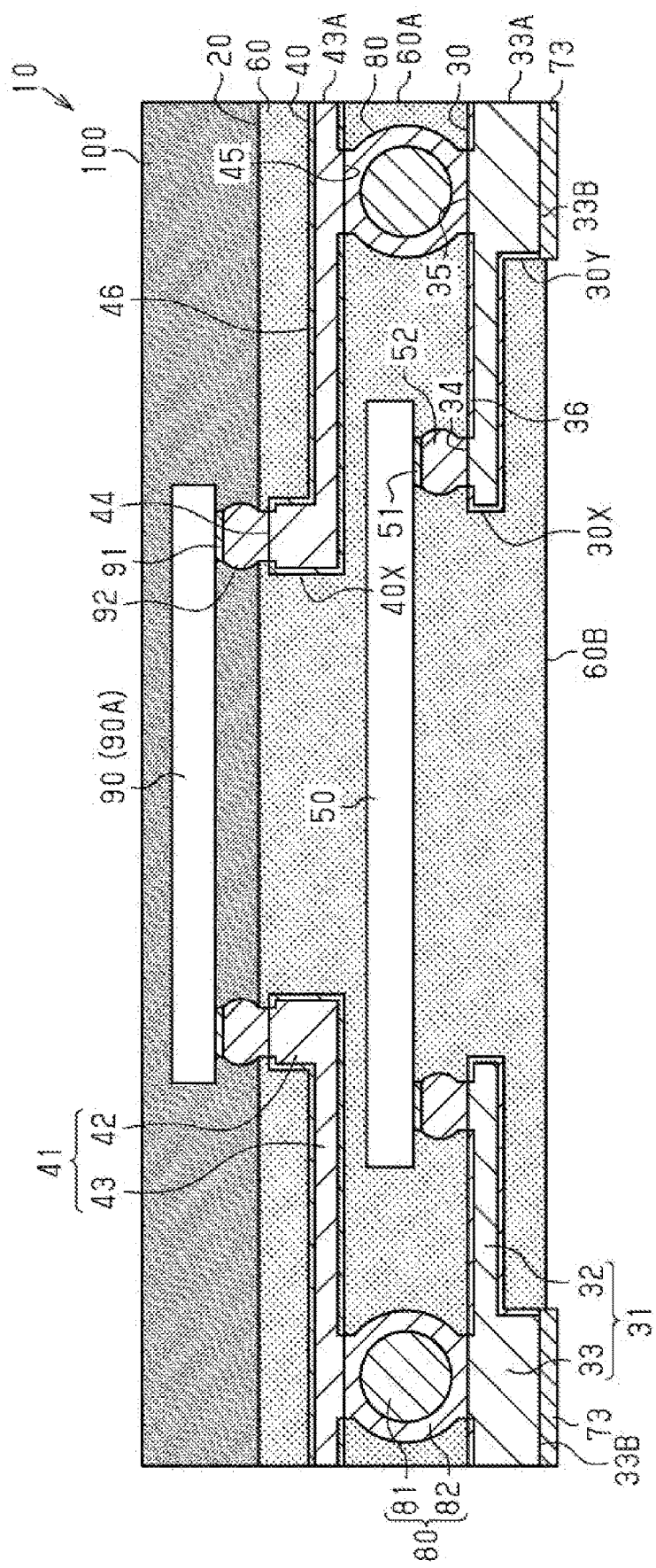
FIG. 18 is a schematic sectional view showing an electronic component apparatus according to a changed example.

As to the metal layers 71 and 72 shown in FIG. 1A, metal forming the metal layers 71 and 72, e.g. Au in the case where, for example, the metal layers 71 and 72 are Au layers, may disappear due to diffusion into the solder layers 52 and the solders 82 respectively, as shown in FIG. 18. As to the metal layers 74 and 75 shown in FIG. 1A, metal (e.g. Au) forming the metal layers 74 and 75 may disappear due to diffusion into the solder layers 92 and the solders 82 respectively in a similar manner or the same manner. In this case, the solder layers 52 are directly bonded on the connection portions 34 of the lead frame 30, and the solders 82 are directly bonded on the connection portions 35 of the lead frame 30. In addition, the solder layers 92 are directly bonded on the connection portions 44 of the lead frame 40, and the solders 82 are directly bonded on the connection portions 45 of the lead frame 40.

Figure 19:
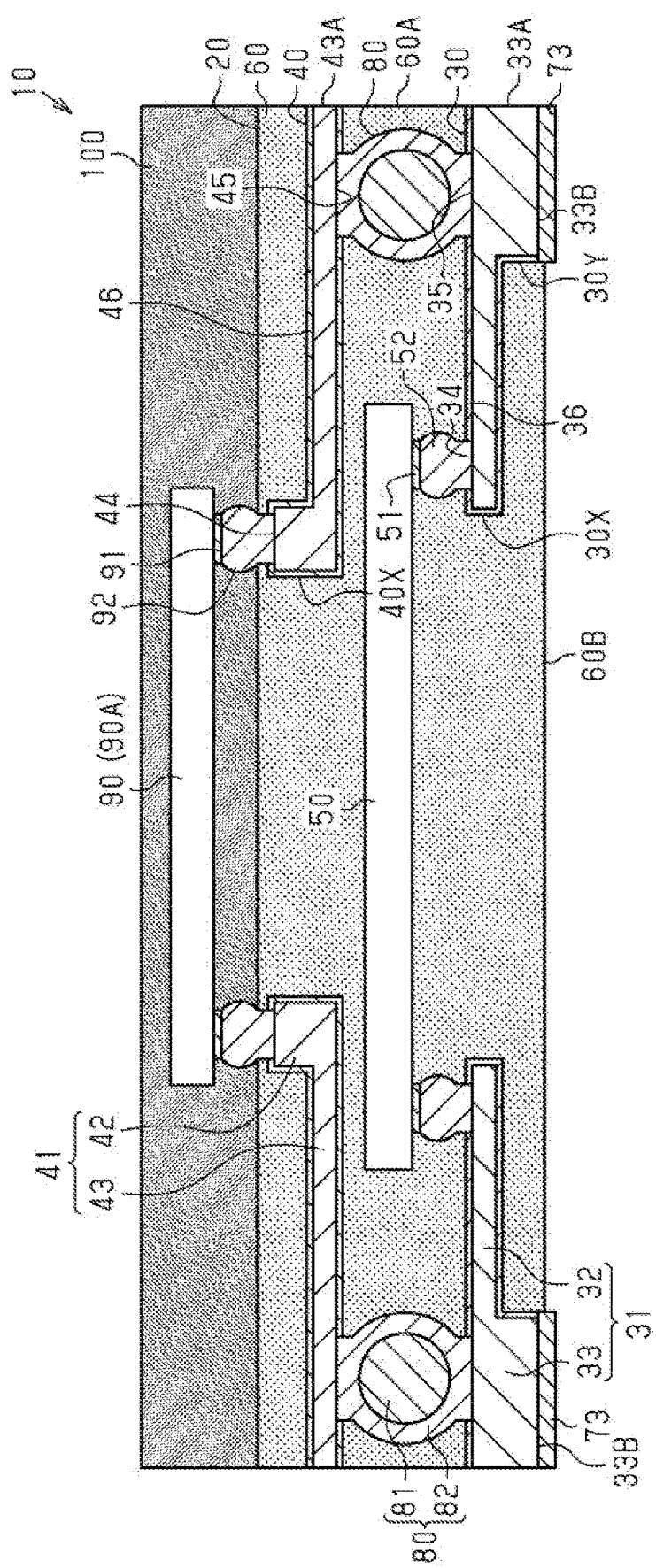
FIG. 19 is a schematic sectional view showing an electronic component apparatus according to a changed example.

The structure of each of the connection portions 34, 35, 44 and 45 may be changed, as shown in FIG. 19. The upper face of the connection portion 34, 35 in the present changed example is formed at a position recessed downward relatively to the upper face of the oxide film 36. The upper face of the connection portion 44 in the present changed example is formed at a position recessed downward relatively to the upper face of the oxide film 46. The lower face of the connection portion 45 in the present changed example is formed at a position recessed upward relatively to the lower face of the oxide film 46. An example of a method for forming such a connection portion 34, 35, 44, 45 will be described below.

First, in a state in which the metal layers 71, 72, 74 and 75 which are noble metal-plated layers are not provided on the surfaces of the lead frames 30A and 40A, the oxide films 36 and 46 generated by anodic oxidation treatment are formed in the entire surfaces of the lead frames 30A and 40A. Successively, portions of the oxide films 36 and 46 corresponding to the connection portions 34, 35, 44 and 45 are removed by laser machining, so that the connection portions 34, 35, 44 and 45 are exposed from the oxide films 36 and 46. Thus, a step is formed between the surface of the oxide film 36 and the surface of each of the connection portions 34 and 35, and a step is formed between the surface of the oxide film 46 and the surface of each of the connection portions 44 and 45. On this occasion, the surface per se of the base material (e.g. the Cu material) of the lead frame 30 becomes the connection portions 34 and 35, and the surface of the base material (e.g. the Cu material) of the lead frame 40 becomes the connection portions 44 and 45. Then, steps similar to or the same as the steps shown in FIGS. 12A to 16 are carried out so that an electronic component apparatus 10 shown in FIG. 19 can be obtained.

In the present changed example, the metal layers 71, 72, 74 and 75 which are noble metal-plated layers are dispensed with. Accordingly, the electrolytic plating step can be omitted, and use of the noble metal can be omitted. Thus, manufacturing cost of the electronic component apparatus 10 can be reduced.

In the method for manufacturing the electronic component apparatus 10 according to the aforementioned embodiment, the steps following FIGS. 13A and 13B may be changed to steps which will be described below.

In a step shown in FIG. 20A, groove portions 30Z each having a predetermined depth are formed by a dicing saw etc. in the lead frame 30A for the structure bodies which have been obtained by the steps shown in FIGS. 6A to 13B. The groove portions 30Z are formed in the lead frame 30A from the lower face side. Each of the groove portions 30Z is, for example, formed in a portion located on and inside the cutting line (the illustrated one-dot chain line) of each of the individual areas A1, so as to surround an outer periphery of an area which will be an electronic component apparatus 10. That is, the groove portion 30Z is formed in the cutting area (the area surrounded by the illustrated one-dot chain line) of the lead frames 30A and 40A, and formed in the inner side portion of the individual area A1 relatively to the cutting area so as to surround the outer periphery of the cutting area. The groove portion 30Z is formed to be wider in width than the cutting area. The groove portion 30Z is, for example, set to have a depth enough small not to separate the section bars 37 and the wirings 31 from each other in the lead frame 30A.

Thus, the lead frame 30A (the section bars 37 and the wirings 31) can be used as a power feed layer during an electrolytic plating step which is a post step. Since such groove portions 30Z are formed, outer side faces 33C of the outer side connection terminals 33 are exposed to the outside.

Successively, the oxide films 36 formed in the lower faces 33B of the outer side connection terminals 33 exposed from the insulating resin 60 are removed. Thus, the lower faces 33B of the outer side connection terminals 33 are exposed to the outside, as shown in FIG. 20A. By the present step, a face to be plated prior to plating treatment can be also cleaned. Incidentally, in the case where, for example, there is no obstacle to the electrolytic plating step which is the next step, the oxide films 36 may be removed prior to formation of the groove portions 30Z.

Next, in a step shown in FIG. 20B, metal layers 73 are formed on the surface of the lead frame 30A exposed from the insulating resin 60. The metal layers 73 are formed on the lower faces 33B of the outer side connection terminals 33, and formed on the surface of the lead frame 30A constituting inner faces of the groove portions 30Z. Therefore, the metal layers 73 are also formed on the outer side faces 33C of the outer side connection terminals 33. Incidentally, the metal layers 73 can be, for example, formed by the electrolytic plating method using the lead frame 30A as the power feed layer.

Next, in a step shown in FIG. 21A, electronic components 90 are mounted on the upper faces of the wirings 41 of each individual area A2 in a manner similar to or the same as the step shown in FIG. 15A.

Successively, in a step shown in FIG. 21B, an encapsulating resin 100 for encapsulating the electronic components 90 is formed on the upper face of the insulating resin 60 in a manner similar to or the same as the step shown in FIG. 15B.

Figure 22:
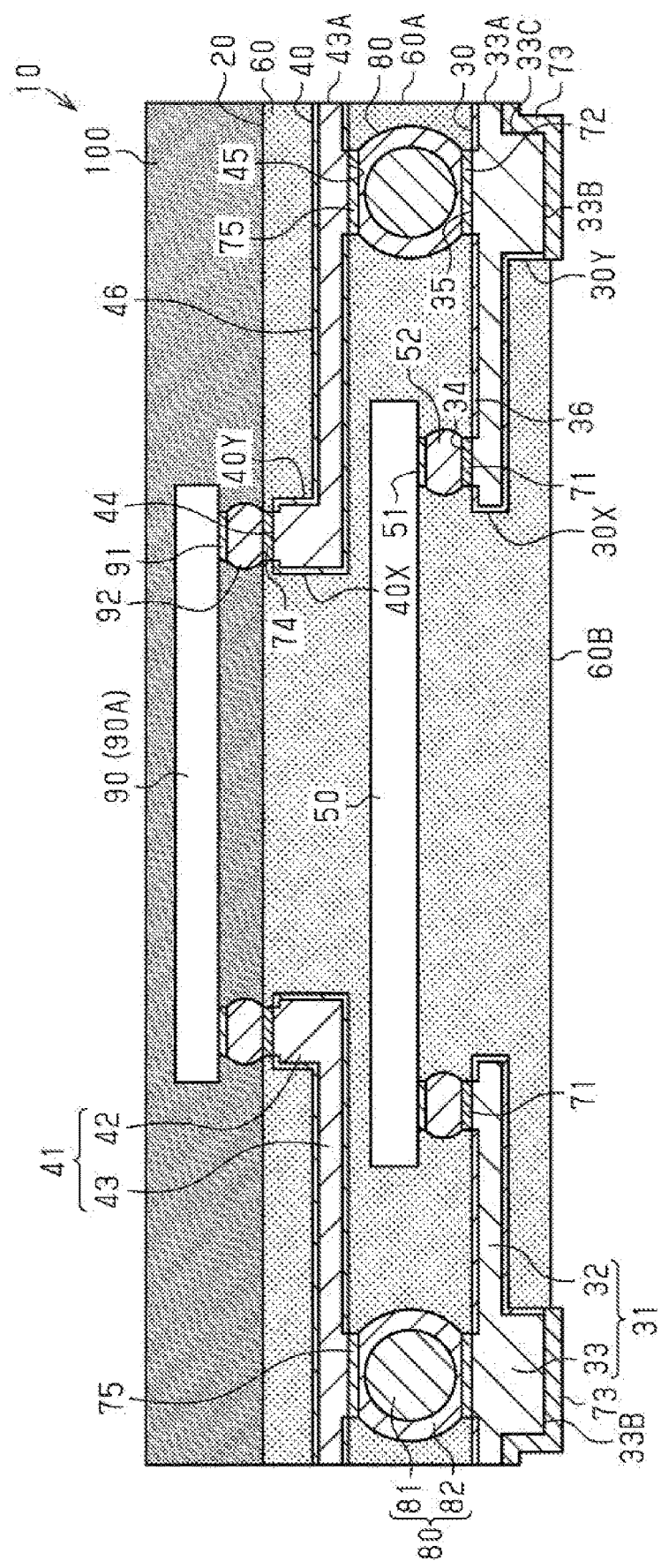
FIG. 22 is a schematic sectional view showing the method for manufacturing the electronic component apparatus according to the changed example.

Next, the metal layers 73, the section bars 37 and 47, the insulating resin 60 and the encapsulating resin 100 at the cutting position designated by the illustrated one-dot chain line are cut by the dicing saw etc. so that the structure body is divided into an individual electronic component apparatus 10. By the present step, the electronic component apparatus 10 in which the metal layers 73 are formed on the outer side faces 33C of the outer side connection terminals 33 can be obtained, as shown in FIG. 22.

Figure 23:
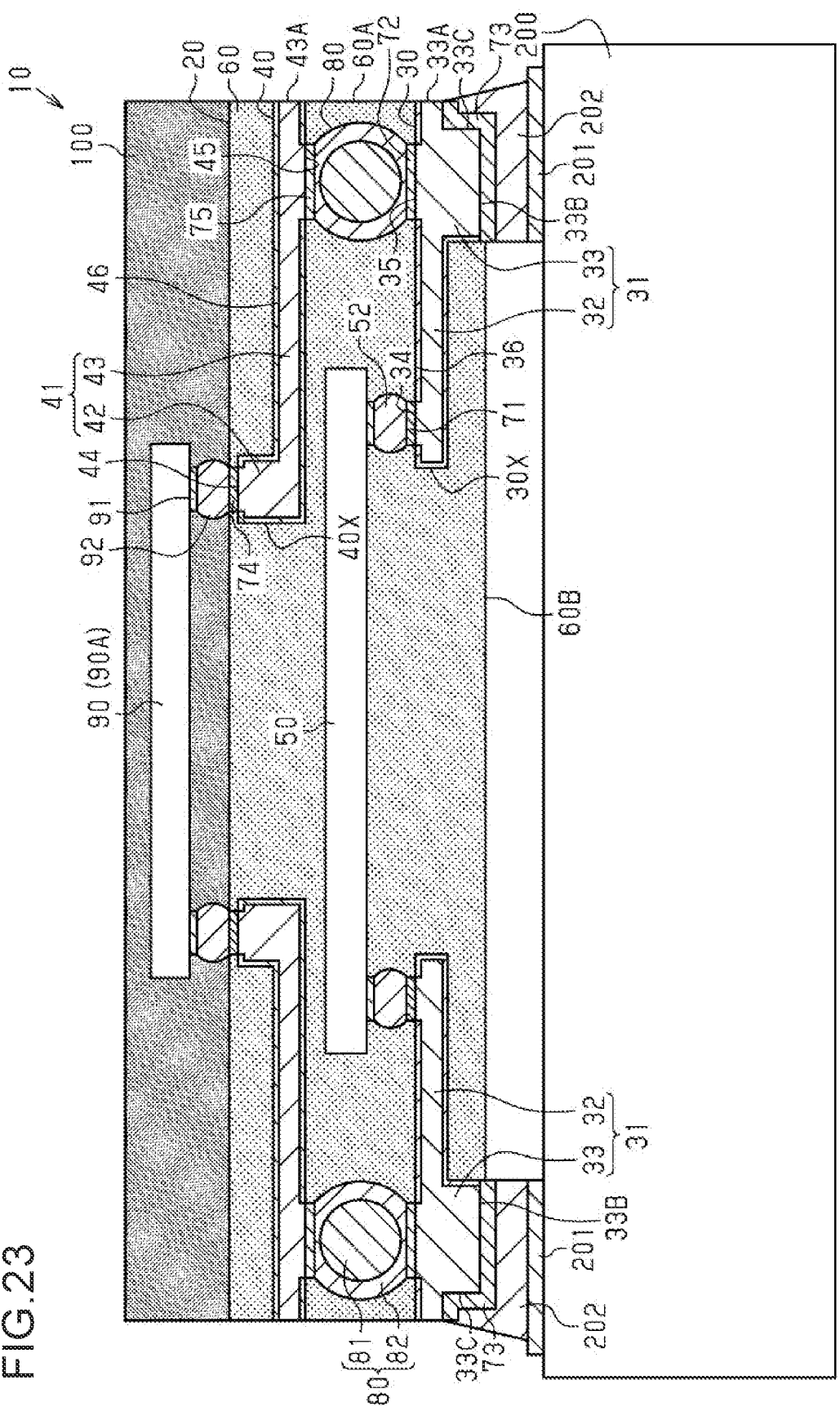
FIG. 23 is a schematic sectional view showing an application example of the electronic component apparatus according to the changed example.

Next, an example of a mounting form of the electronic component apparatus 10 shown in FIG. 22 will be described in accordance with FIG. 23.

The electronic component apparatus 10 is, for example, mounted on a board 200 having a plurality of wiring layers 201. The outer side connection terminals 33 of the electronic component apparatus 10 are bonded to the wiring layers 201 by solder layers 202. For example, the metal layers 73 formed on the lower faces 33B and the outer side faces 33C of the outer side connection terminals 33 are bonded to the wiring layers 201 by the solder layers 202. On this occasion, a metal material whose wettability to solder is higher than the lead frame 30 is used as the material of the metal layers 73. Therefore, when the electronic component apparatus 10 in which the metal layers 73 are formed on the outer side faces 33C of the outer side connection terminals 33 is mounted on the board 200, solders of the solder layers 202 also crawl up to the metal layers 73 covering the outer side faces 33C of the outer side connection terminals 33 so that menisci of the solders are formed. Thus, the metal layers 73 and the solder layers 202 are bonded to each other three-dimensionally so that the solder layers 202 having suitable fillets are formed. Therefore, a bonding area between each of the outer side connection terminals 33 and each of the solder layers 202 can be increased so that mutual bond strength between the outer side connection terminal 33 and the solder layer 202 can be improved. As a result, mounting reliability of the electronic component apparatus 10 can be improved.

Figure 24:
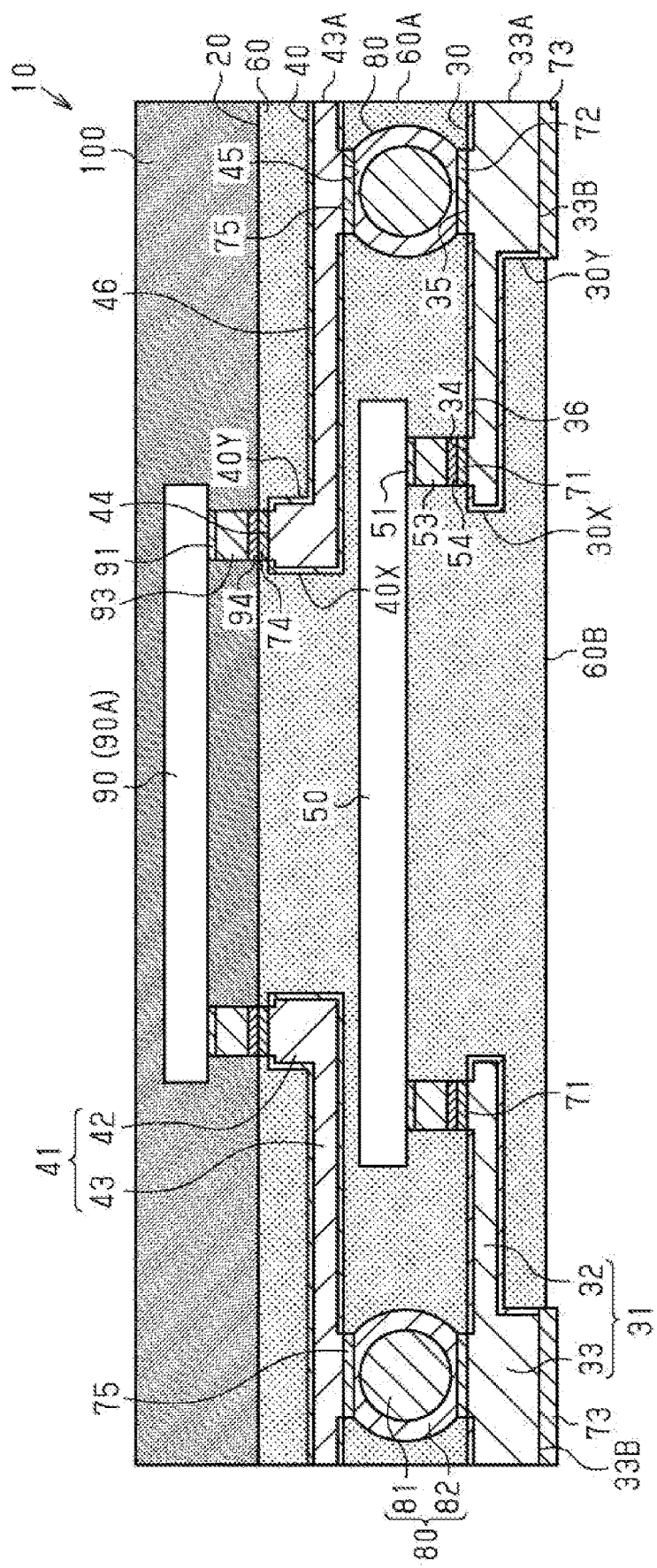
FIG. 24 is a schematic sectional view showing an electronic component apparatus according to a changed example.

As shown in FIG. 24, the connection structure between the electronic component 50 and the lead frame 30 may be changed. Specifically, a structure having metal columns 53 formed on the lower faces of the terminal portions 51 of the electronic component 50, and solder layers 54 formed on lower faces of the metal columns 53 may be used in place of the solder layers 52 made of solder bumps. Each of the metal columns 53 is, for example, formed into a columnar shape so as to extend downward from a corresponding one of the lower faces of the terminal portions 51. The metal column 53 is, for example, formed into a circular columnar shape or a rectangular columnar shape. For example, Cu or a Cu alloy can be used as the material of the metal columns 53. For example, solder plating can be used as each of the solder layers 54. For example, an alloy containing Pb, an Sn—Au alloy, an Sn—Cu alloy, an Sn—Ag alloy, an Sn—Ag—Cu alloy, or the like, can be used as the material of the solder layers 54.

According to the configuration, an interval between the electronic component 50 and the lead frame 30 can be secured by the metal columns 53. Accordingly, a volume (i.e. a solder amount) of each of the solder layers 54 can be made smaller than that of each of the solder layers 52 shown in FIGS. 1A and 1B. Thus, when the electronic component 50 is mounted on the lead frame 30, flowing out of the solders can be suppressed more greatly.

As shown in FIG. 24, the connection structure between the electronic component 90 and the lead frame 40 may be changed. Specifically, a structure having metal columns 93 formed on the lower faces of the terminal portions 91 of the electronic component 90, and solder layers 94 formed on lower faces of the metal columns 93 may be used in place of the solder layers 92 made of solder bumps. Each of the metal columns 93 is, for example, formed into a columnar shape so as to extend downward from a corresponding one of the lower faces of the terminal portions 91. The metal column 93 is, for example, formed into a circular columnar shape or a rectangular columnar shape. For example, Cu or a Cu alloy can be used as the material of the metal columns 93. For example, solder plating can be used as each of the solder layers 94. For example, an alloy containing Pb, an Sn—Au alloy, an Sn—Cu alloy, an Sn—Ag alloy, an Sn—Ag—Cu alloy, or the like, can be used as the material of the solder layers 94.

According to the configuration, an interval between the electronic component 90 and the lead frame 40 can be secured by the metal columns 93. Accordingly, a volume (i.e. a solder amount) of each of the solder layers 94 can be made smaller than that of each of the solder layers 92 shown in FIGS. 1A and 1B. Thus, when the electronic component 90 is mounted on the lead frame 40, flowing out of the solders can be suppressed more greatly.

Figure 25:
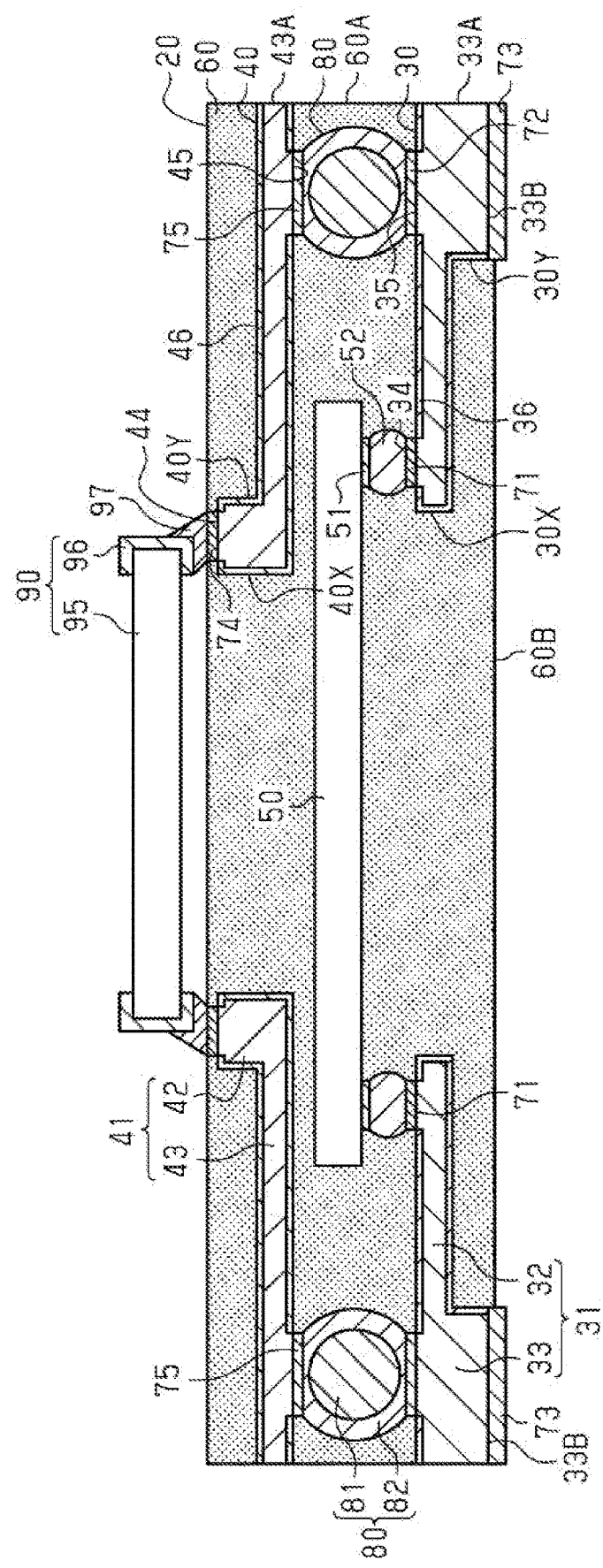
FIG. 25 is a schematic sectional view showing an electronic component apparatus according to a changed example.

As shown in FIG. 25, the encapsulating resin 100 shown in FIG. 1A may be omitted. In a case where, for example, all the electronic components 90 mounted on the board 20 are electronic components which do not require encapsulating, such as chip capacitors or chip inductors, the encapsulating resin 100 can be omitted. An electronic component 90 shown in FIG. 25 is a chip capacitor having a rectangular parallelepiped capacitor body 95, and two terminal portions 96 formed on longitudinally opposite ends of the capacitor body 95. The electronic component 90 is mounted on the metal layers 74 formed on the upper faces of the inner side connection terminals 42 of the wirings 41. The electronic component 90 is, for example, bonded to the metal layers 74 through bonding materials 97 having electrical conductivity. For example, the terminal portions 96 of the electronic component 90 are electrically connected to the metal layers 74 through the bonding materials 97.

For example, solder, an electrically conductive paste such as a silver paste, or a brazing metal material can be used as each of the bonding materials 97. For example, an alloy containing Pb, an Sn—Au alloy, an Sn—Cu alloy, an Sn—Ag alloy, an Sn—Ag—Cu alloy, or the like, can be used as the material of the solder.

Incidentally, even in the case where a semiconductor chip is used as the electronic component 90, the encapsulating resin 100 may be omitted as long as connection reliability etc. between the electronic component 90 and the lead frame 40 can be secured.

Figure 26:
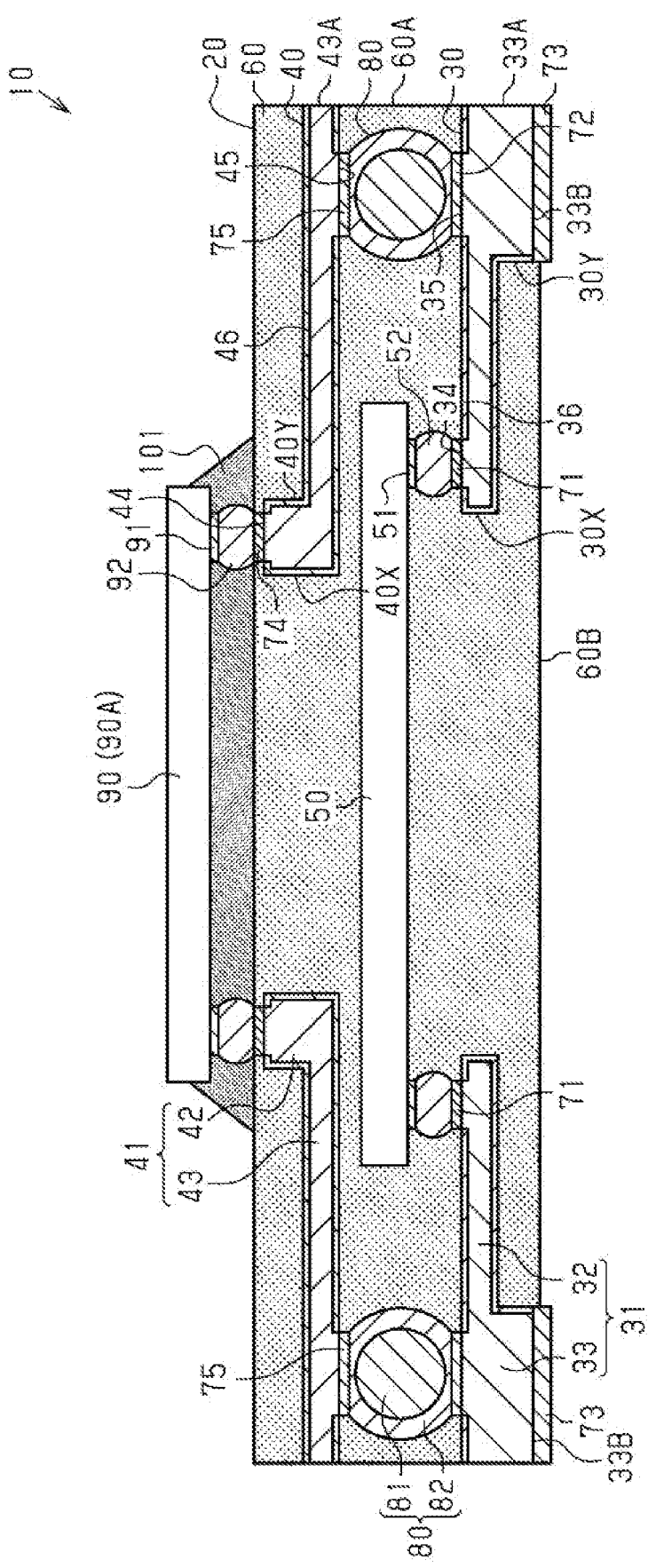
FIG. 26 is a schematic sectional view showing an electronic component apparatus according to a changed example.

As shown in FIG. 26, an underfill resin 101 for filling a gap between the board 20 and the electronic component 90 may be formed in place of the encapsulating resin 100 shown in FIG. 1A. For example, an insulating resin such as an epoxy-based resin can be used as the material of the underfill resin 101.

The encapsulating resin 100 may be further provided on the electronic component apparatus 10 shown in FIG. 26.

The copper core balls 81 are used as electrically conductive core balls of the core-including solder balls 80 in the aforementioned embodiment. The present invention is not limited thereto. In place of the copper core balls 81, for example, electrically conductive core balls formed out of any of other metals than copper such as gold and nickel may be used, or resin core balls formed out of a resin may be used. Alternatively, solder balls from which core balls such as electrically conductive core balls or resin core balls have been omitted may be used in place of the core-including solder balls 80.

Connection members for connecting the lead frame 30 and the lead frame 40 to each other are embodied in the solder balls 80 in the aforementioned embodiment. However, the present invention is not limited thereto. For example, the connection members may be embodied in metal columns.

Figure 27:
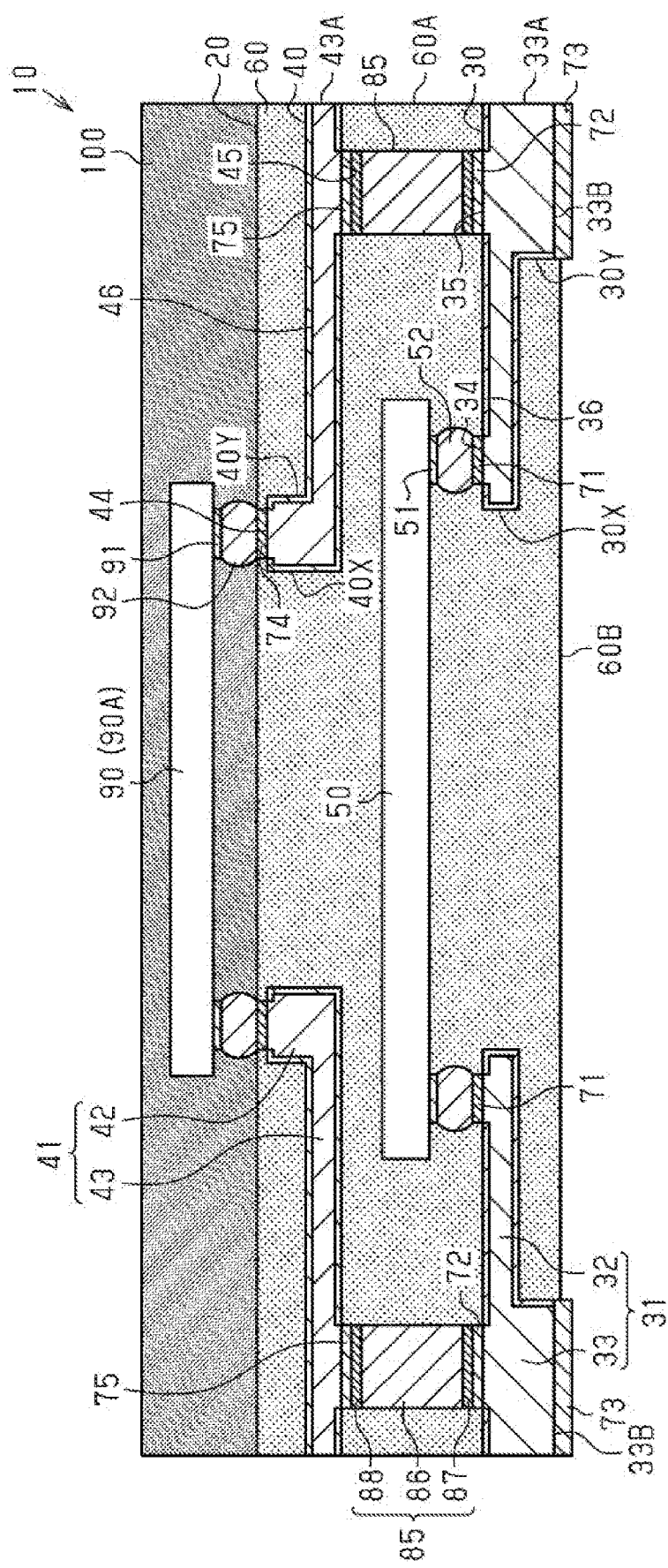
FIG. 27 is a schematic sectional view showing an electronic component apparatus according to a changed example.

For example, as shown in FIG. 27, the metal layers 72 formed on the upper face of the lead frame 30 and the metal layers 75 formed on the lower face of the lead frame 40 may be connected to each other by connection members 85. For example, each of the connection members 85 has a metal column 86, a solder layer 87 formed on a lower face of the metal column 86, and a solder layer 88 formed on an upper face of the metal column 86. The solder layer 87 is bonded to the metal layer 72, and bonded to the metal column 86. The solder layer 88 is bonded to the metal layer 75, and bonded to the metal column 86. The metal column 86 is, for example, formed into a circular columnar shape or a rectangular columnar shape. The metal column 86 is, for example, formed so that a thickness dimension of the metal column 86 extending in a deposition direction of the lead frames 30 and 40 on each other is larger than a width dimension of the metal column 86 extending in a plane direction perpendicularly intersecting with the deposition direction in sectional view. That is, the metal column 86 is formed so as to extend in the deposition direction rather than in the plane direction. Thus, the separation distance between the lead frame 30 and the lead frame 40 can be secured widely easily. In the present changed example, the metal column 86 functions as a spacer which keeps the separation distance between the lead frame 30 and the lead frame 40 at a designated value.

For example, Cu or a Cu alloy can be used as the material of the metal columns 86. For example, an alloy containing Pb, an Sn—Au alloy, an Sn—Cu alloy, an Sn—Ag alloy, an Sn—Ag—Cu alloy, or the like, can be used as the material of the solder layers 87 and 88.

In the changed example shown in FIG. 27, each of the connection members 85 may be changed to a structure in which the entire surface (i.e. an entire upper face, an entire lower face and an entire side face) of the metal column 86 is covered with a solder layer. In this case, for example, the solder layer can be formed on the entire surface of the metal column 86 by barrel plating. Thickness of the solder layer can be, for example, set at about 5 μm.

In the changed example shown in FIG. 27, a bonding material having electrical conductivity, such as a silver paste or a brazing metal material may be used in place of each of the solder layers 87 and 88.

In the changed example shown in FIG. 27, the solder layers 87 and 88 may be omitted so that the metal layers 72 and the metal columns 86 are bonded to each other by diffusion bonding and the metal layers 75 and the metal columns 86 are bonded to each other by diffusion bonding. Here, the diffusion bonding is technology in which metal materials to be bonded are brought into close contact with each other, and then pressurized and heated in an atmosphere of a vacuum, inert gas, or the like, so that the metal materials are bonded to each other at an atomic level by use of diffusion of atoms generated in bonding faces of the metal materials.

Figure 28:
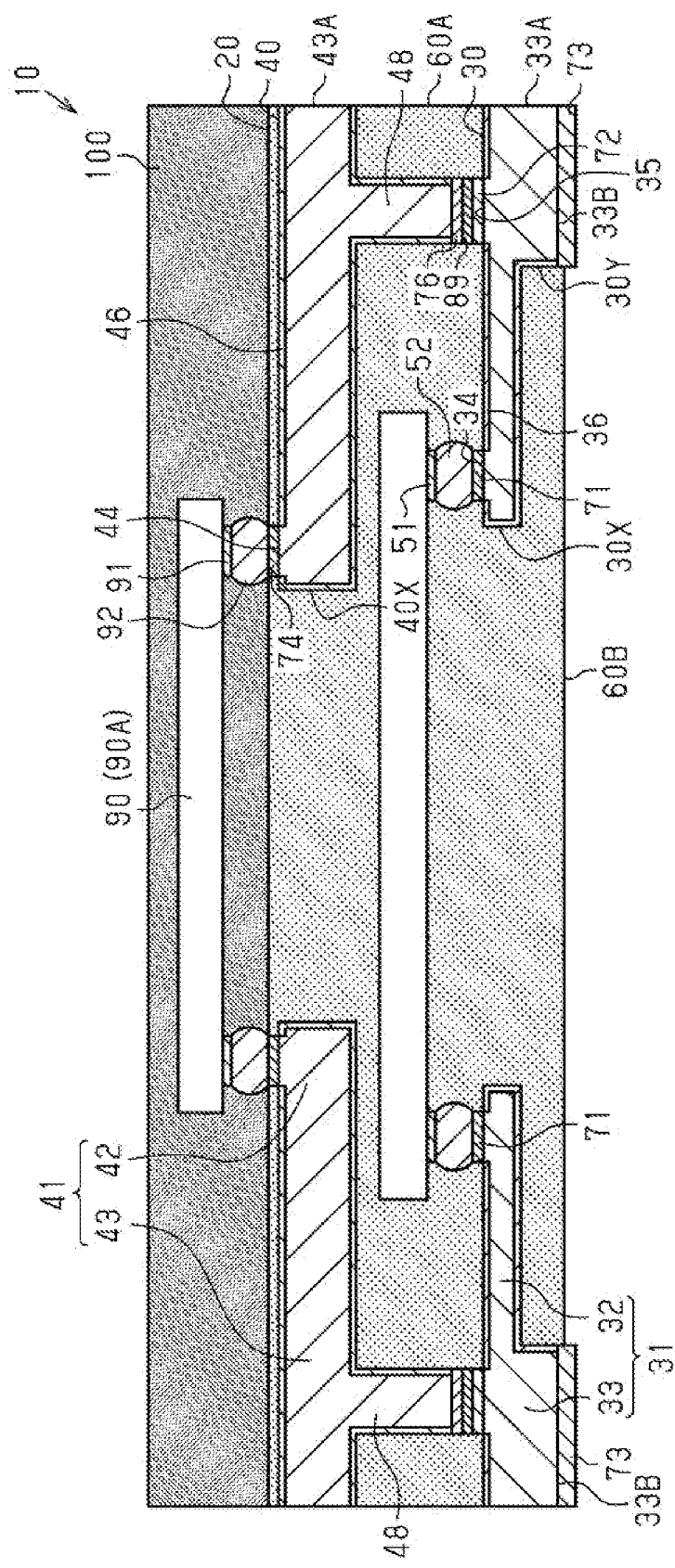
FIG. 28 is a schematic sectional view showing an electronic component apparatus according to a changed example.

As shown in FIG. 28, connection terminals 48 may be formed on the lead frame 40 in place of the solder balls 80 shown in FIG. 1A. Each of the connection terminals 48 is, for example, formed into a columnar shape extending to protrude downward (toward the lead frame 30 side) from a corresponding one of the lower faces of the outer side connection terminals 43. The connection terminal 48 is, for example, formed into a circular columnar shape or a rectangular columnar shape. The connection terminal 48 is, for example, formed so that a thickness dimension of the connection terminal 48 extending in a deposition direction of the lead frames 30 and 40 on each other is larger than a width dimension of the connection terminal 48 extending in a plane direction perpendicularly intersecting with the deposition direction in sectional view. That is, the connection terminal 48 is formed so as to extend in the deposition direction rather than in the plane direction. The connection terminal 48 can be, for example, formed by half-etching a metal plate. A metal layer 76 is formed on a lower face of the connection terminal 48. The metal layer 76 is, for example, formed so as to cover the entire lower face of the connection terminal 48 including the lower face of the oxide film 46. The metal layer 76 is, for example, electrically connected to the metal layer 72 through a solder layer 89. In the present changed example, the connection terminal 48 functions as a spacer which keeps the separation distance between the lead frame 30 and the lead frame 40 at a designated value.

An Ag layer, an Au layer, an Ni layer/Au layer, an Ni layer/Pd layer/Au layer, an Ni layer/Ag layer, etc. can be cited as examples of the metal layer 76. For example, a solder bump, a solder paste or solder plating can be used as the solder layer 89. For example, an alloy containing Pb, an Sn—Au alloy, an Sn—Cu alloy, an Sn—Ag alloy, an Sn—Ag—Cu alloy, or the like, can be used as the material of the solder layer 89.

According to the configuration, the separation distance between the lead frame 30 and the lead frame 40 can be secured widely by the connection terminals 48 formed on the lead frame 40 per se. Thus, the solder balls 80 (see FIG. 1A) can be omitted.

In the example shown in FIG. 28, the connection terminals 48 are formed integrally with the lead frame 40. However, the connection terminals 48 may be formed integrally with the lead frame 30.

In the aforementioned embodiment, the electronic component 50 is mounted on the upper face of the lead frame 30. However, the present invention is not limited thereto.

Figure 29:
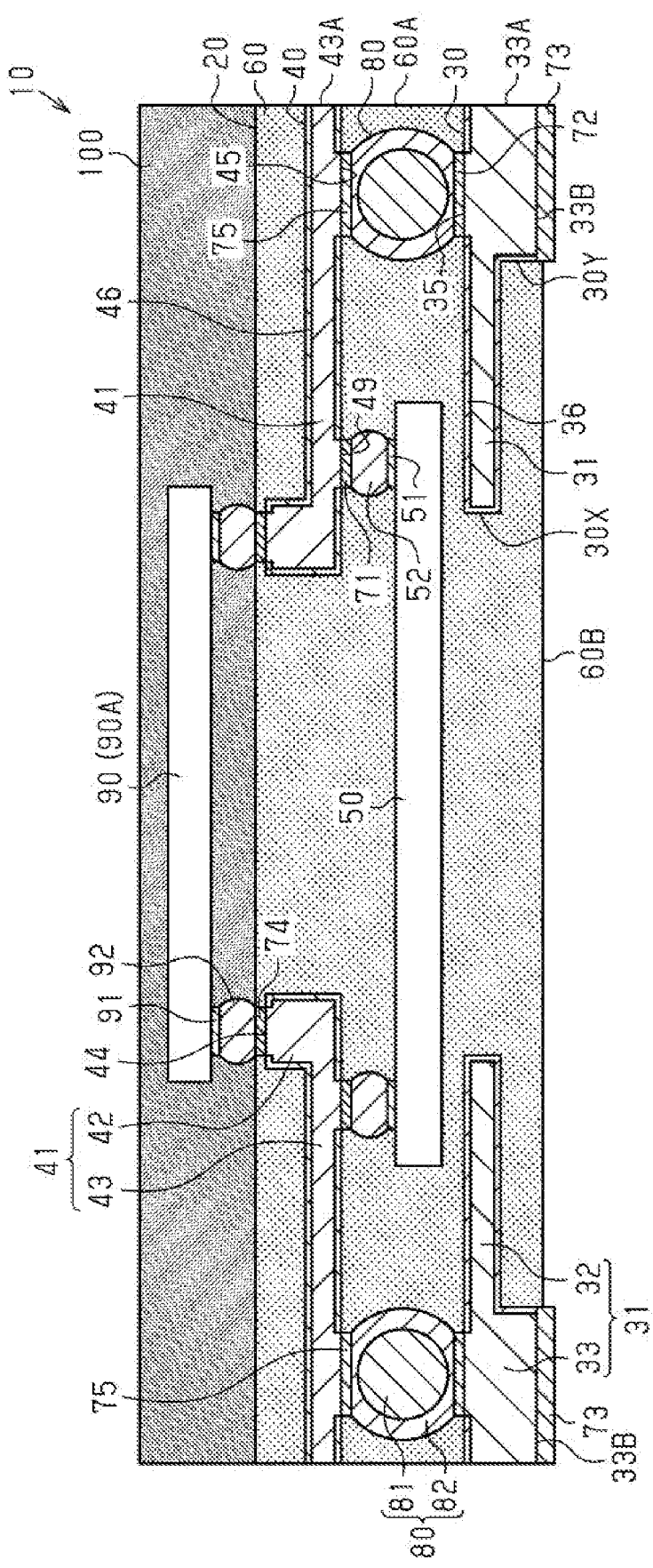
FIG. 29 is a schematic sectional view showing an electronic component apparatus according to a changed example.

For example, as shown in FIG. 29, the electronic component 50 may be mounted on a lower face of a lead frame 40. In this case, a plurality of electronic components 50 and 90 are mounted on opposite faces, i.e. an upper face and the lower face, of the lead frame 40. The lead frame 40 in this case has connection portions 49 electrically connected to terminal portions 51 of the electronic component 50 through solder layers 52, in addition to the connection portions 44 and 45. Each of the connection portions 49 is constituted by a portion of the lower face of a corresponding one of the wirings 41. The metal layers 71 are formed on lower faces of the connection portions 49. Each of the metal layers 71 is, for example, partially formed on the lower face of the wiring 41. In other words, the portion of the lower face of the wiring 41 which is covered with the metal layer 71 is the connection portion 49. The metal layer 71 is, for example, formed correspondingly to the terminal portion 51 of the electronic component 50. The oxide films 46 are formed so as to surround the circumferences of the connection portions 49 (the metal layers 71). Formation of the connection portions 34 is omitted from the lead frame 30 in the present changed example.

The electronic component 50 is mounted on the lower face of the lead frame 40. The electronic component 50 is, for example, mounted on the lower faces of the connection portions 49 provided on the outer side connection terminals 43 of the wirings 41. The electronic component 50 in the present changed example is flip-chip mounted on the connection portions 49 of the wirings 41. For example, the terminal portions 51 provided and disposed on a circuit formation face (an upper face in this case) of the electronic component 50 are bonded to the metal layers 71 formed on the lower faces of the connection portions 49 through the solder layers 52. Thus, the electronic component 50 is electrically connected to the wirings 41 through the terminal portions 51, the solder layers 52 and the metal layers 71.

Incidentally, the terminal portions 51 are, for example, formed on only the circuit formation face of the electronic component 50 which has the circuit formation face and a back face (a lower face in this case) opposite to the circuit formation face. That is, no terminal portions connected to the lead frame 30, 40 are formed on the back face of the electronic component 50.

In the present changed example, the connection portion 49 is an example of a fourth connection portion.

Figure 30:
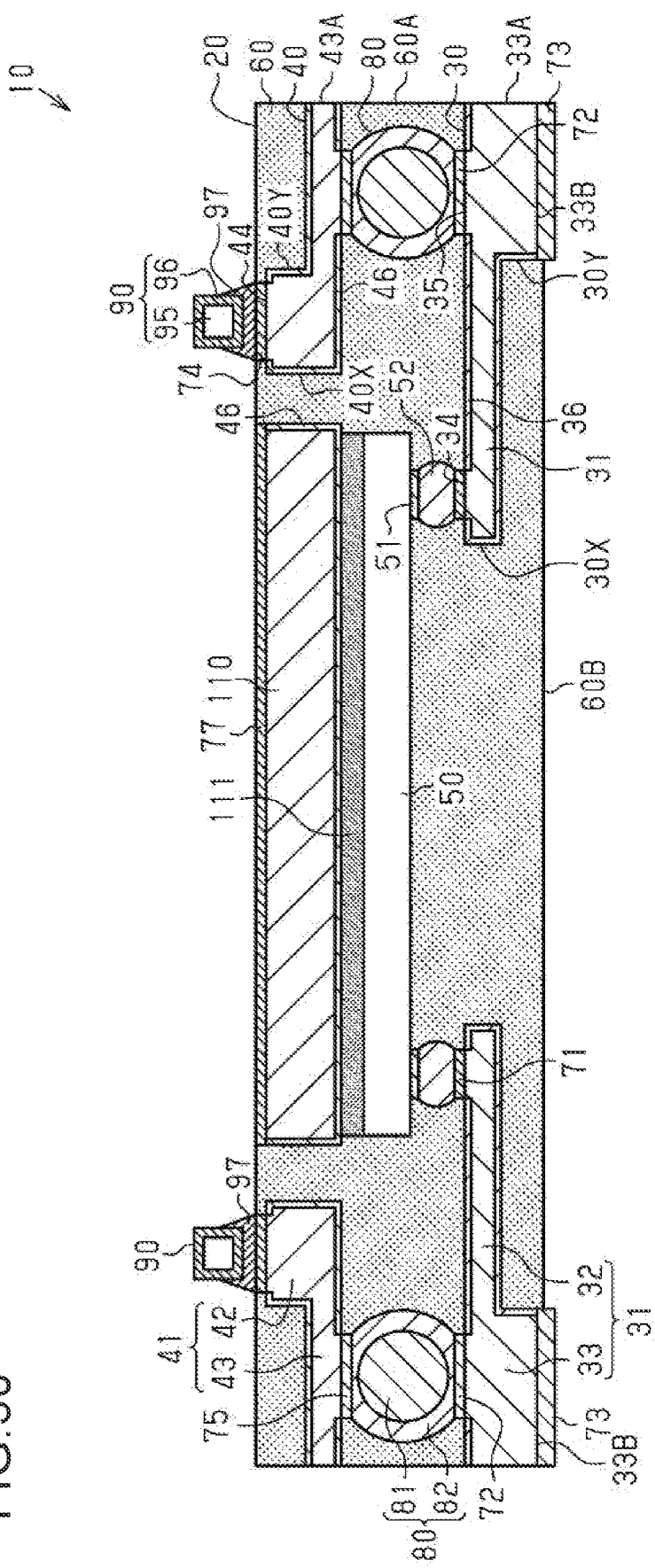
FIG. 30 is a schematic sectional view showing an electronic component apparatus according to a changed example.

As shown in FIG. 30, a heat sink 110 may be provided in the lead frame 40. That is, the lead frame 40 in the present changed example has a plurality of wirings 41, and the heat sink 110 which is provided separately from the plurality of wirings 41.

The heat sink 110 is, for example, formed on one and the same plane as the plurality of wirings 41. The heat sink 110 is, for example, provided on an inner periphery side of a board 20 relatively to the plurality of wirings 41. The heat sink 110 is, for example, formed at a position overlapping with the electronic component 50 in plan view. The heat sink 110 is, for example, formed into a rectangular shape in plan view. The planar shape of the heat sink 110 is, for example, formed to have a size substantially equal to the planar shape of the electronic component 50. The heat sink 110 has an oxide film 46 formed on the entire surface except an upper face of the heat sink 110.

The heat sink 110 is, for example, thermally connected to the electronic component 50. A lower face of the heat sink 110 (specifically, a lower face of the oxide film 46) is, for example, bonded to the back face (the upper face in this case) of the electronic component 50 through an adhesive layer 111. For example, an epoxy-based, polyimide-based or silicon-based thermosetting adhesive agent or a thermal interface material (TIM) can be used as the adhesive layer 111. Soft metal such as indium (In) or silver, silicone gel, or an organic resin binder etc. containing a metal filler, graphite, etc. can be used as the material of the TIM. For example, the adhesive layer 111 has a function of adhesively bonding the electronic component 50 and the heat sink 110 to each other, and a function of thermally connecting the electronic component 50 and the heat sink 110 to each other. Incidentally, thickness of the adhesive layer 111 can be, for example, set in a range of about 20 μm to 50 μm.

The upper face of the heat sink 110 is, for example, exposed from the upper face of the insulating resin 60. A metal layer 77 is formed on the upper face of the heat sink 110. The metal layer 77 is, for example, formed to cover the entire upper face of the heat sink 110 including an upper face of the oxide film 46. An upper face of the metal layer 77 is exposed from the upper face of the insulating resin 60. The upper face of the metal layer 77 is, for example, formed so as to be flush with the upper face of the insulating resin 60. Incidentally, an Ag layer, an Au layer, an Ni layer/Au layer, an Ni layer/Pd layer/Au layer, and an Ni layer/Ag layer can be cited as examples of the metal layer 77.

In the present changed example, electronic components 90 each of which includes a chip capacitor having a capacitor body 95 and a terminal portion 96 are mounted on the metal layers 74 formed on the upper faces of the inner side connection terminals 42 of the wirings 41.

According to the configuration, with the provision of the heat sink 110, heat generated by the electronic component 50 can be released efficiently. In addition, with the provision of the heat sink 110, the lead frames 30 and 40 can be disposed on the opposite upper and lower faces of the electronic component 50. Therefore, the electronic component apparatus 10 can be formed into a structure robust against warping. Accordingly, occurrence of warping at the electronic component apparatus 10 can be suppressed suitably.

In the changed example shown in FIG. 30, the oxide film 46 may be left on the upper face of the heat sink 110. In this case, the metal layer 77 is not formed on the upper face of the heat sink 110.

In the aforementioned embodiment, the metal layers 73 may be formed so as to continuously cover the outer side faces 33A and the lower faces 33B of the outer side connection terminals 33.

The structure of the board 20 in the aforementioned embodiment is not limited particularly. For example, in the aforementioned embodiment, two layers of the lead frames 30 and 40 are configured to be deposited on each other. However, three or more layers of metal plates may be deposited on one another. In addition, disposition, the planar shapes, etc. of the wirings 31 and 41 can be modified or changed.

In the aforementioned embodiment and the respective changed examples, the metal layers 71 to 77 are formed by the electrolytic plating method. The present invention is not limited thereto. For example, the metal layers 71 to 77 may be formed by an electroless plating method.

The number of electronic components 50 embedded in the board 20 in the aforementioned embodiment is not limited particularly. For example, two or more electronic components 50 may be mounted on the upper face of the lead frame 30. In addition, one or a plurality of electronic components 50 may be mounted on the lead frame 30 and the lead frame 40. In addition, the electronic components embedded in the board 20 do not have to be limited to one type, but a plurality of types of electronic components may be embedded in the board 20.

The number of the electronic components 90 mounted on the upper face of the lead frame 40 in the aforementioned embodiment is not limited particularly. For example, one electronic component 90 may be mounted on the upper face of the lead frame 40.

The mounting form of the electronic component 50, 90 in the aforementioned embodiment can be modified or changed variously. For example, flip-chip mounting, wire bonding mounting, solder mounting or a combination form of these mountings are cited as examples of the mounting form of the electronic component 50, 90.

The aforementioned embodiment is embodied in the manufacturing method for gaining multiple pieces. However, the aforementioned embodiment may be alternatively embodied in a manufacturing method for gaining a single piece (for gaining one piece).

Various aspects of the subject matter described herein are set out non-exhaustively in the following numbered clauses:

1) A method of manufacturing an electronic component apparatus, the method comprising:

forming a first oxide film and a first connection portion on a surface of a first lead frame, wherein the first connection portion is exposed from the first oxide film;

forming a second oxide film and a second connection portion on a surface of a second lead frame, wherein the second connection portion is exposed from the second oxide film;

mounting a first electronic component on the first lead frame;

disposing the second lead frame on the first lead frame through a connection member; and filling an insulating resin between the first lead frame and the second lead frame to cover the first electronic component and the connection member, wherein the first connection portion and the second connection portion are electrically connected to each other by the connection member.

2) The method according to Clause (1), wherein the connection member is formed to be thicker in thickness than the first electronic component.

3) The method according to Clause (1), wherein:
the connection member has a spacer and a solder; and
the spacer is bonded to the first connection portion and the second connection portion by the solder.

What is claimed is:

1. An electronic component apparatus comprising:
a first lead frame;
a second lead frame that is provided on the first lead frame;
a first electronic component that is provided between the first lead frame and the second lead frame;
a connection member that is provided between the first lead frame and the second lead frame; and
an insulating resin that is filled between the first lead frame and the second lead frame so as to cover the first electronic component and the connection member;
wherein:
a first oxide film is provided to cover a surface of the first lead frame;
a second oxide film is provided to cover a surface of the second lead frame;
a first connection portion exposed from the first oxide film is provided on the surface of the first lead frame;
a second connection portion exposed from the second oxide film is provided on the surface of the second lead frame;
a surface roughness of the first connection portion is smaller than a surface roughness of the first oxide film;
a surface roughness of the second connection portion is smaller than a surface roughness of the second oxide film;
the connection member has a solder;
the first connection portion and the second connection portion are bonded to the connection member;
the first connection portion and the second connection portion are electrically connected to each other by the connection member;
the first lead frame is made of a first material, and the first oxide film is made of an oxide of the first material, and
the second lead frame is made of a second material, and the second oxide film is made of an oxide of the second material.

2. The electronic component apparatus according to claim 1, wherein:
the connection member is formed to be thicker in thickness than the first electronic component.

3. The electronic component apparatus according to claim 1, wherein:
the connection member has a spacer and the solder; and
the spacer is bonded to the first connection portion and the second connection portion by the solder.

4. The electronic component apparatus according to claim 1, wherein:
the first oxide film is formed on the surface of the first lead frame so as to surround the first connection portion; and
the second oxide film is formed on the surface of the second lead frame so as to surround the second connection portion.

5. The electronic component apparatus according to claim 3, wherein:
the spacer is a core ball; and
the solder covers the spacer.

6. The electronic component apparatus according to claim 3, wherein the spacer is a metal column.

7. The electronic component apparatus according to claim 6, wherein
the solder is provided on each of an upper face and a lower face of the metal column.

8. The electronic component apparatus according to claim 1, wherein:
a third connection portion exposed from the first oxide film is provided on the surface of the first lead frame; and
the first electronic component is electrically connected to the third connection portion.

9. The electronic component apparatus according to claim 8, wherein:
the first oxide film is formed on the surface of the first lead frame so as to surround the third connection portion.

10. The electronic component apparatus according to claim 1, wherein:
a fourth connection portion exposed from the second oxide film is provided on the surface of the second lead frame; and
the first electronic component is electrically connected to the fourth connection portion.

11. The electronic component apparatus according to claim 10, wherein the second oxide film is formed on the surface of the second lead frame so as to surround the fourth connection portion.

12. The electronic component apparatus according to claim 1, wherein:
a fifth connection portion exposed from the insulating resin and the second oxide film is provided on an upper face of the second lead frame; and
the electronic component apparatus further comprises a second electronic component that is mounted on an upper face of the fifth connection portion to be electrically connected to the fifth connection portion.

13. The electronic component apparatus according to claim 12, wherein:
the second oxide film is formed on the surface of the second lead frame so as to surround the fifth connection portion.

14. The electronic component apparatus according to claim 1, wherein
an external electrode exposed from the insulating resin and the first oxide film is provided on a lower face of the first lead frame.

15. The electronic component apparatus according to claim 1, wherein:
the first lead frame and the second lead frame are made of copper or a copper alloy; and
each of the first oxide film and the second oxide film is a film of copper oxide containing a hydroxide.

16. The electronic component apparatus according to claim 1, wherein:
the first lead frame has an inner side connection terminal and an outer side connection terminal;
the first connection portion is provided on an upper surface of the outer side connection terminal;
an external electrode is provided on a lower surface of the outer side connection terminal;
a lower surface of the inner side connection terminal is covered by the insulating resin;
an outer side face of the outer side connection terminal is exposed from an outer side face of the insulating resin;
the outer side face of the outer side connection terminal is flush with the outer side face of the insulating resin; and
the lower surface of the outer side connection terminal is exposed from a lower surface of the insulating resin.

17. The electronic component apparatus according to claim 16, wherein:
- a first outer side face and a second outer side face of the outer side connection terminal are exposed from the outer side face of the insulating resin;
- the first outer side face of the outer side connection terminal is flush with the outer side face of the insulating resin; and
- the second outer side face of the outer side connection terminal retracts from the outer side face of the insulating resin toward an inner side of the electronic component apparatus.

18. The electronic component apparatus according to claim 16, wherein the outer side face and the lower surface of the outer side connection terminal are exposed from the first oxide film.

19. The electronic component apparatus according to claim 1, wherein:
- the second lead frame has an inner side connection terminal and an outer side connection terminal;
- the second connection portion is provided on a lower surface of the outer side connection terminal; and
- an outer side face of the outer side connection terminal is exposed from an outer side face of the insulating resin, and the outer side face of the outer side connection terminal is flush with the outer side face of the insulating resin.

20. The electronic component apparatus according to claim 19, wherein the outer side face of the outer side connection terminal is exposed from the second oxide film.

21. The electronic component apparatus according to claim 1, wherein:
- the first oxide film is formed by oxidizing the surface of the first lead frame; and
- the second oxide film is formed by oxidizing the surface of the second lead frame.

22. The electronic component apparatus according to claim 1, further comprising:
- a first metal layer provided on the first connection portion; and
- a second metal layer provided on the second connection portion, wherein
- a surface roughness of a portion of the first connection portion which is covered by the first metal layer is smaller than the surface roughness of the first oxide film, and
- a surface roughness of a portion of the second connection portion which is covered by the second metal layer is smaller than the surface roughness of the second oxide film.

23. The electronic component apparatus according to claim 22, wherein
- the connection member is bonded to the first metal layer and the second metal layer.

* * * * *